US006727834B2

(12) United States Patent
Roberts et al.

(10) Patent No.: US 6,727,834 B2
(45) Date of Patent: Apr. 27, 2004

(54) METHOD AND DEVICE FOR USE IN DC PARAMETRIC TESTS

(75) Inventors: Gordon W. Roberts, Montreal-West (CA); Clarence K. L. Tam, Montreal (CA)

(73) Assignee: McGill University, Montreal (CA)

( * ) Notice: Subject to any disclaimer, the term of this patent is extended or adjusted under 35 U.S.C. 154(b) by 0 days.

(21) Appl. No.: 10/427,819

(22) Filed: May 1, 2003

(65) Prior Publication Data

US 2003/0206127 A1 Nov. 6, 2003

Related U.S. Application Data

(60) Provisional application No. 60/377,272, filed on May 3, 2002.

(30) Foreign Application Priority Data

May 3, 2002 (CA) .............................................. 2384627

(51) Int. Cl.[7] .................................................. H03M 3/00
(52) U.S. Cl. ...................................... 341/143; 341/120
(58) Field of Search ................................ 341/155, 144, 341/143, 120, 118

(56) References Cited

U.S. PATENT DOCUMENTS

| | | | |
|---|---|---|---|
| 2,605,361 A | 7/1952 | Cutler | 179/15.6 |
| 4,593,270 A | 6/1986 | White | 323/312 |
| 4,641,246 A | 2/1987 | Halbert et al. | 364/487 |
| 4,646,299 A | * 2/1987 | Schinabeck et al. | 714/736 |
| 4,792,748 A | 12/1988 | Thomas et al. | 340/347 |
| 4,792,932 A | 12/1988 | Bowhers et al. | 368/113 |
| 4,816,750 A | 3/1989 | Van der Kloot et al. | 324/73.12 |
| 4,875,210 A | 10/1989 | Russo et al. | 371/27 |
| 5,025,205 A | 6/1991 | Mydill et al. | 327/73.1 |
| 5,103,230 A | 4/1992 | Kalthoff et al. | 341/166 |
| 5,270,582 A | 12/1993 | Brown et al. | 307/269 |

(List continued on next page.)

OTHER PUBLICATIONS

C.K.L. Tam, G.W. Roberts, A Robust DC Current Generation and Measurement Technique for Deep Submicron Circuits, Proc. IEEE International Symposium on Circuits and Systems, vol. 1, pp. 719–722, May 6, 2001.

F.B. Johnson, Calculating Delta Modulator Performance, IEEE Transaction On Audio and Electroacoustics, vol. AU–16, pp. 121–129, Mar. 1968.

Y. Deval, J. Tomas, J.B. Begueret, S. Dugalleix, J.P. Dom, 1–Volt Ratiometric Temperature Stable Current Reference, IEEE International Symposium on Circuits and Systems, Jun. 1997, p 1984–1987.

(List continued on next page.)

*Primary Examiner*—Peguy JeanPierre
(74) *Attorney, Agent, or Firm*—Ladas & Parry

(57) ABSTRACT

A system and device suitable for use in performing a DC parametric test on an external load is provided. The device may be configured to apply a desired voltage or current to the external load. The circuit device receives a forcing parameter signal at an input and releases at an output a signal approximating the forcing parameter signal to the external load. The circuit device includes a first circuit segment between the input and the output having a search unit, an intermediate voltage point and an internal load between the intermediate voltage point and the output. A second circuit segment connected in a feedback arrangement with the first circuit segment provides the search unit with the voltage at the output. The search unit is adapted for generating a second voltage signal on the basis of the forcing parameter signal and the first voltage signal received and to apply the second voltage signal to the intermediate voltage point. The application of second voltage signal to the intermediate voltage point causes a change in either one of the voltage signal or the current signal at the output such that a signal approximating the forcing parameter signal is caused at the output. A current measuring circuit adapted for providing a measure of the current at the external load suitable for use with a voltage generating circuit device is also provided

51 Claims, 60 Drawing Sheets

U.S. PATENT DOCUMENTS

| | | | |
|---|---|---|---|
| 5,274,375 A | 12/1993 | Thompson | 341/143 |
| 5,321,700 A | 6/1994 | Brown et al. | 371/27 |
| 5,321,702 A | 6/1994 | Brown et al. | 371/27 |
| 5,369,604 A | 11/1994 | Ravindranath et al. | 364/580 |
| 5,512,895 A | 4/1996 | Madden et al. | 341/61 |
| 5,568,493 A | 10/1996 | Morris | 371/22.3 |
| 5,610,826 A | 3/1997 | Whetsel | 364/487 |
| 5,744,949 A | 4/1998 | Whetsel | 324/158.1 |
| 5,867,054 A | 2/1999 | Kotowski | 327/513 |
| 5,905,967 A | 5/1999 | Botham | 702/118 |
| 5,923,676 A | 7/1999 | Sunter et al. | 371/22.5 |
| 5,938,780 A | 8/1999 | Panis | 714/724 |
| 6,000,051 A | 12/1999 | Nadeau-Dostie et al. | 714/727 |
| 6,107,818 A | 8/2000 | Czamara | 324/765 |
| 6,128,759 A | 10/2000 | Hansen | 714/738 |
| 6,184,810 B1 | 2/2001 | Burns | 341/143 |
| 6,191,715 B1 * | 2/2001 | Fowers | 341/120 |
| 6,288,588 B1 | 9/2001 | Frisch | 327/280 |
| 6,356,129 B1 | 3/2002 | O'Brien et al. | 327/175 |
| 6,363,507 B1 | 3/2002 | Truebenbach et al. | 714/734 |
| 6,449,744 B1 | 9/2002 | Hansen | 714/738 |

OTHER PUBLICATIONS

R.M. Stitt, Implementation and Applications of Current Sources and Current Receivers, Burr–Brown Application Bulletin AB165, Burr–Brown Corporation, 1989, p1–30.

Tam, K.L. et al., ADC Current Measurement Circuit For On–Chip Applications, May 25, 2003 (protected publication date). p.p 3.

An Integrable DC Parametric Measurement System by Clarence K.L. Tam, B. Eng. 1999; Department of Electrical Engineering McGill University, Montréal, Jul. 2002, p.p. 1–116.

Teradyne, Inc, Low Current Ammeter Channel Card, Advanced Mixed–Signal Instrumentation Manual, 1996. version 6.2, pp. 1–36.

W. Sansen, F. Eynde, M. Steyaert, A CMOS Temperature–Compensated Current Reference, IEEE Journal of Solid–State Circuits, vol. 23, pp. 821–824, Jun. 1988.

H. J. Oguey, D. Aebischer, CMOS Current Reference Without Resistance, IEEE Journal of Solid–State Circuits, vol. 32, pp. 1132–1135, Jul. 1997.

Burr–Brown Corporation, Dual Current Source/Current Sink, REF200 (Datasheet), Oct. 1993, p 1–16.

C.K.L. Tam, G. W. Roberts, A Robust DC Current Generation and Measurement Technique for Deep Submicron Circuits, Proc. IEEE International Symposium on Circuits and Systems, vol. 1, pp. 719–722, May 2001.

M.M. Hafed, S. Laberge, G. W. Roberts, A Robust Deep Submicron Programmable DC Voltage Generator, Proc. IEEE International Symposium on Circuits and Systems, vol. 4, pp. 5–8, May 2000.

C.D. Thompson, S.R. Bernadas, A Digitally–Corrected 20b Delta–Sigma Modulator, Proc. IEEE International Solid–State Circuits Conference, pp. 194–195, 1994.

D.J. G. Janssen, Delta Modulation in DVM Design, IEEE Journal of Solid–State Circuits, vol. SC–7, pp. 503–507, Dec. 1972.

M. Breten, T. Lehmann, E. Bruun, Integrating Data Converters for Picoampere Currents from Electrochemical Transducers, Proc. IEEE International Symposium on Circuits and Systems, vol. 5, pp. 709–712, May 2000.

C.B. Wang, J. Todsen, T. Kalthoff, A Dual Channel 20 Bit Current–Input A/D Converter for Photo–Sensor Applications, Proc. Southwest Symposium on Mixed–Signal Design, pp. 57–60, 2000.

J. Kotowski, B. McIntyre, J. Parry, Current Sensor IC Provides 9 bit + Sign Result without External Sense Resistor, Proc. IEEE Custom Integrated Circuits Conference, pp 35–38, 1998.

Burr–Brown Product # DDC112, pp 1–24, 1997.

National Semiconductor Product # LM3814, p 1–13, 1999.

* cited by examiner

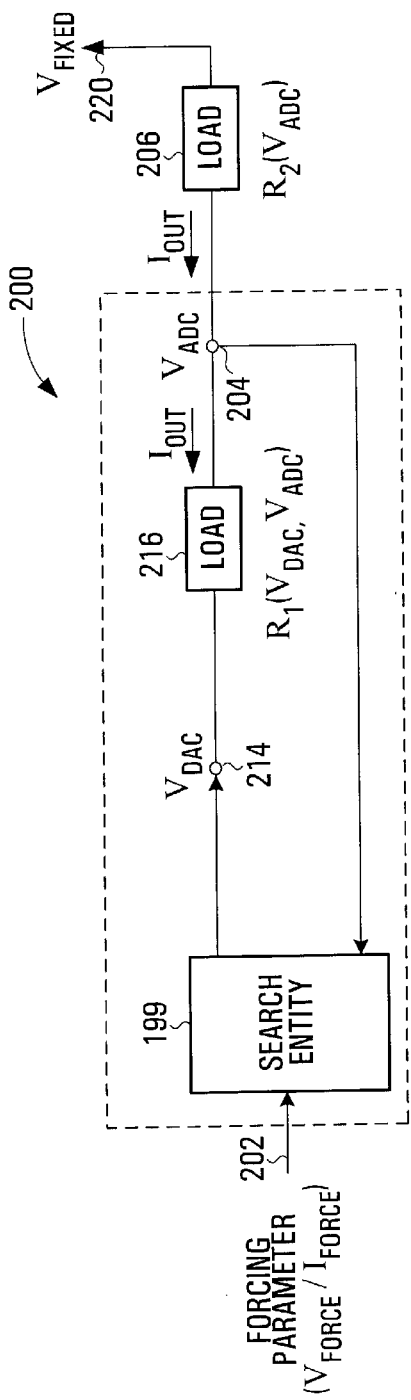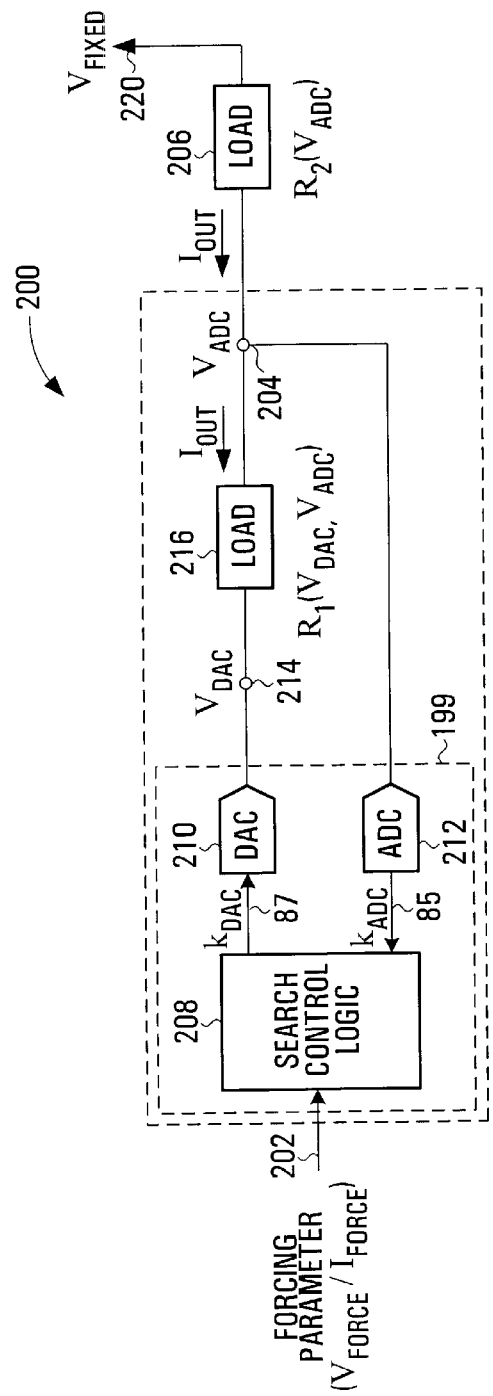

METHOD AND DEVICE FOR USE IN DC PARAMETRIC TESTS

This claims the benefit of Provisional application 60/377,272 filed on May 3, 2002.

FIELD OF THE INVENTION

The present invention relates generally to electronic chips and devices, and more particularly, to a method and device suitable for use in performing DC parametric tests.

BACKGROUND OF THE INVENTION

Recent years have seen a rapidly increasing demand for highly integrated mixed-signal integrated circuits (IC's). This demand is mostly driven by the ever-expanding communications industry. However, as the level of integration increases, more and more mixed-signal components are becoming buried deep inside large amounts of digital circuitry without any external I/O access. This creates a difficult problem for initial device and circuit characterisation and diagnosis, as well as during a production test. For example, to measure the bias current for a high precision ADC circuit requires some form of external access. However, the access mechanism, such as a test bus, can introduce additional noise from off-chip sources.

Typically circuit characterisation includes the determination of the electrical characteristics of a circuit such as for example measuring the input/output impedance of an amplifier circuit, or finding the voltage transfer characteristics of an amplifier circuit or transistor device amongst others.

One particular area of IC testing that is being affected is the DC parametric tests. These tests are typically conducted to characterise a wide variety of mixed-signal circuits such as Analog-to-Digital Converters (ADCs), PLLs and bias networks. Also, these tests are used in digital test applications such as pad current leakage and $I_{DDQ}$ tests. For example, the pad current leakage test and the IDDQ test are common test techniques for detecting faults in digital ICs.

DC parametric tests are generally classified as one of two types. The first type of DC parametric test involves forcing a voltage at a circuit node while measuring the current that flows into the node. Commonly used method for on-chip current measurements include using device having either a transimpedance amplifier, as shown in FIG. 1a), an integrating network as shows in FIG. 1b) or a shunt resistance, as shown in FIG. 1c). For additional information regarding the above mentioned methods, the reader is invited to refer to the following documents:

1. Teradyne, Inc., "Low Current Ammeter Channel Card", Advanced Mixed-Signal Instrumentation Manual, 1996.
2. C. D. Thompson, S. R. Bernadas, "A Digitally-Corrected 20b Delta-Sigma Modulator", Proc. IEEE International Solid-State Circuits Conference, pp. 194–195, 1994.
3. U.S. Pat. No. 5,274,375 issued to Charles D. Thompson Dec. 28, 1993;
4. M. Breten, T. Lehmann, E. Bruun, "Integrating Data Converters for Picoampere Currents from Electrochemical Transducers", Proc. IEEE International Symposium on Circuits and Systems, Vol. 5, pp. 709–712, May 2000.
5. C. B. Wang, J. Todsen, T. Kalthoff, "A Dual Channel 20 Bit Current-Input A/D Converter for Photo-Sensor Applications", Proc. Southwest Symposium on Mixed-Signal Design, pp. 57–60, 2000.
6. Burr-Brown Product #DDC 112
7. J. Kotowski, B. McIntyre, J. Parry, "Current Sensor IC Provides 9 bit+ Sign Result without External Sense Resistor", Proc. IEEE Custom Integrated Circuits Conference, pp. 35–38, 1998;
8. U.S. Pat. No. 5,867,054 issued to Jeffrey P. Kotowski Feb. 2, 1999;
9. National Semiconductor Product #LM3814

The contents of the above documents are hereby incorporated by reference.

A deficiency of devices of the type described above is that they involve the use of elaborate Analog-to-Digital Converters (ADCs) with trimmed components, which makes these devices expensive and relatively non-scalable for on-chip implementation. Another deficiency of devices of the type described above is that they make use of op-amps (operational amplifiers) which also makes them relatively non-scalable for on-chip implementation. Generally, the size of the op-amp circuit does not shrink to the same extent as the size of logic circuits do as IC technology advances.

The second type of DC parametric test involves forcing a known current into a circuit node while measuring the voltage at the node.

A deficiency of commonly used on-chip current sources is that they generally suffer from low output resistance and shifts in current levels due to process variation. Such current sources are described in W. Sansen et al., "*A CMOS Temperature-Compensated Current Reference*", IEEE Journal of Solid-State Circuits, Vol. 23, pp. 821–824, June 1988 and in H. J. Oguey et al., "*CMOS Current Reference Without Resistance*", IEEE Journal of Solid-State Circuits, Vol. 32, pp. 1132–1135, July 1997 whose contents are herein incorporated by reference. Other on-chip current source implementations, of the type described in Burr-Brown Corporation, "Dual Current Source/Current Sink", REF200 (Datasheet), October 1993 and in U.S. Pat. No. 4,792,748 issued to David M. Thomas et al. in Dec. 20, 1998, can generally achieve good current accuracy but require laser-trimmed on-chip resistors, which is costly when multiple measurement units are required on a single chip. The contents of the above documents are hereby incorporated by reference.

In the context of the above, there is a need in the industry to provide a method and device for use in performing DC parametric tests that alleviates at least in part problems associated with the existing devices and methods.

SUMMARY OF THE INVENTION

In accordance with a first broad aspect, the invention provides a circuit device suitable for use in performing a DC parametric test on an external load. The circuit device includes an input suitable for receiving a forcing parameter signal, an output suitable for releasing to the external load a signal approximating the forcing parameter signal, a first circuit segment and a second circuit segment. The first circuit segment is located between the input and the output and includes a search entity, an intermediate voltage point and an internal load between the intermediate voltage point and the output of the circuit device. The second circuit segment is connected in a feedback arrangement with the first circuit segment. The second circuit segment provides the search entity in the first circuit segment with a first voltage signal indicative of the voltage at the output of the circuit device. The search entity is adapted for generating a second voltage signal on the basis of the forcing parameter signal and the first voltage signal received from the second segment and for applying the second voltage signal to the intermediate voltage point. The application of the second voltage signal to the intermediate voltage point causes a change in either one of the voltage signal or the current signal at the output of the circuit device such that, at equilibrium, a signal approximating the forcing parameter signal is caused at the output.

In accordance with another broad aspect, the invention provides a circuit for performing a DC parameter test on an external load. The circuit comprises a circuit input, a circuit output, a search unit, a circuit module having digital-to-analog conversion functionality and load functionality and an analog-to-digital converter (ADC). The circuit input is for receiving a forcing parameter signal. The circuit output is for connection to the external load. The search unit has a first input connected to the circuit input and has a second input and an output. The circuit module has digital-to-analog conversion functionality and load functionality and is connected between the output of the search unit and the circuit output. The analog-to-digital converter (ADC) is connected between the circuit output and the second input of the search unit. The search unit is adapted to generate a digital target voltage at its output on the basis of a voltage at the circuit output and the forcing parameter signal whereby a signal approximating the forcing parameter signal is derived at the circuit output.

Advantageously, the above-described circuit can be implemented using some digital logic as permitted by the use of ADCs and DACs. The digital logic allows taking advantage of the down-scaling of digital integrated circuit technology and facilitates the on-chip implementation of such devices.

In accordance with a specific example implementation, the forcing parameter signal is a forced voltage signal.

In accordance with an alternative specific example implementation, the forcing parameter signal is a forced current signal.

Specific examples of implementation may make use of a forcing parameter signal that is in either one of an analog format or digital format.

In a specific example of implementation, the circuit module having digital-to-analog conversion functionality and load functionality includes a low-pass filter module one side of which is connected to the circuit output and a pulse generator module connected between the output of the search unit and another side of the low-pass filter module.

In an alternate specific example of implementation, the circuit module having digital-to-analog conversion functionality and load functionality includes an internal load one side of which is connected to the circuit output and a digital-to-analog converter (DAC) connected between the output of the search unit and another side of the internal load.

In accordance with a first non-limiting implementation, the internal load in the circuit device is a linear non-inverting load. Such a linear non-inverting load may include one or more linear resistor elements, RC (resistor/capacitor) circuit elements and any other suitable linear analog circuit having linear non-inverting properties. Such linear analog circuits having linear non-inverting properties may include non-linear components arranged in such a manner to produce a linear non-inverting load. Such non-linear components may include for example PMOS circuits, NMOS circuits, CMOS circuits, BJT circuits, BiCMOS circuits, JFET circuits and MESFET circuits.

In accordance with a second non-limiting implementation, the internal load in the circuit device is a non-linear and inverting load. Such a non-linear and inverting load may include one or more MOS elements, BJT circuits, JFET circuits, diode circuits, MESFET or BiCMOS circuits. MOS configurations including a CMOS circuit, a PMOS circuit and NMOS circuit may also be used.

In accordance with a third non-limiting implementation, the internal load in the circuit device is a non-linear and non-inverting load. Such a non-linear and non-inverting load may include one or more MOS elements, BJT circuits, JFET circuits, diode circuits, MESFET or BiCMOS circuits.

In accordance with a fourth non-limiting implementation, the internal load in the circuit device is a linear and inverting load. Such a linear and inverting load may include one or more MOS elements, BJT circuits, JFET circuits, MESFET or BiCMOS circuits.

Advantageously, by using a non-linear internal load, larger changes in current at the output can be established for a smaller corresponding change in voltage applied at the output. In addition, the downscaling of digital circuit will limit the power supply to lower voltage levels, which in turn will limit the output voltage range of analog circuits. Consequently, circuits of the type described above making use of a non-linear internal load will be affected to a lesser extent by reductions in power supply voltages.

In a specific non-limiting example of implementation where the forcing parameter signal is a forced voltage signal, the search unit includes a digital comparator, a digital integrator module and an output. The digital comparator is for generating a digital difference voltage signal dependent on the difference between the forced voltage signal and the digital approximation of the voltage signal at the output of the circuit device. The digital integrator module is adapted for processing the digital difference voltage signal to derive the digital target voltage. The digital target voltage is released at the output of the search unit for processing by the digital-to-analog converter module. Where the forcing parameter signal is an analog signal, the search unit further includes an analogue-to-digital converter module for processing the forced voltage signal to generate a corresponding digital forced voltage signal. The digital forced voltage signal is then provided to the digital comparator.

In accordance with a specific example of implementation, the analog-to-digital converter module in the circuit device includes an analog comparator, a digital integrator and a feedback circuit. The analog comparator receives a signal indicative of the voltage at the output and a tracking voltage and generates a difference signal on the basis of the signals received. The digital integrator receives the difference signal and generates successive digital approximations of the voltage signal at the output of the circuit device. The feedback circuit processes the successive digital approximations of the voltage signal to generate the tracking voltage and provide the tracking voltage to the analog comparator. In a non-limiting implementation, the feedback circuit includes a digital-to-analog converter module. In accordance with an alternative specific example of implementation, the digital integrator in the analog-to-digital converter module is replaced by a successive-approximation circuit (SAR) module. For additional information regarding successive-approximation circuits (SAR), the reader is invited to consult D. A. Johns, K. Martin, Analog Integrated Circuit Design, John Wiley & Sons, Inc., pp. 492–493, 1997. The content of this document is hereby incorporated by reference.

In accordance with another broad aspect, the invention provides a system for providing a current measurement suitable for use in performing a DC parametric test on an external load. The system includes a voltage generating circuit device and a current measurement circuit. The voltage generating circuit device includes an input for receiving a signal indicative of a forced voltage, an output suitable for releasing to the external load a signal approximating the forced voltage, a first circuit segment and a second circuit segment. The first circuit segment is between the input and the output and includes a search unit, an intermediate voltage point and an internal load between the intermediate voltage point and the output. The second circuit segment is connected in a feedback arrangement with the first circuit segment. The second circuit segment provides the search unit in the first circuit segment with a first voltage signal indicative of the voltage at the output. The search unit is adapted for generating a second voltage signal on the basis of the signal indicative of the forced voltage and the first voltage signal received from the second segment and applying the second voltage signal to the intermediate voltage point. The application of the second voltage to the intermediate voltage point causes a change in either one of the voltage signal or the current signal at the output such that, at equilibrium, a voltage approximating the forced voltage is caused at the output. The current measurement circuit includes a first input for receiving a first signal derived from the second voltage signal, a second input for receiving a second signal derived from the signal indicative of the forced voltage signal, search logic and an output. The search logic derives a certain current measurement on the basis of the first signal and the second signal. The certain current measurement is released at the output of the current measurement circuit. When the system is in equilibrium, the certain current measurement is indicative of an approximation of measurement of the current flowing at the output of the voltage generating circuit when the signal indicative of the forced voltage is applied to the output of the voltage generating circuit.

In accordance with a non-limiting example, the first signal derived from the second voltage signal includes a digital representation of the second voltage signal and the second signal derived from the signal indicative of the forced voltage includes a digital approximation of the signal indicative of the forced voltage.

In accordance with another broad aspect, the invention provides a system for providing a current measurement for use in performing a DC parametric test on an external load. The system includes a voltage generating circuit device and a current measurement circuit. The voltage generating circuit device includes a circuit input, a circuit output, a search unit, a circuit module having digital-to-analog conversion functionality and load functionality and an analog-to-digital converter (ADC). The circuit input is for receiving a signal indicative of a forced voltage. The circuit output is for connection to the external load. The search unit has a first input connected to the circuit input and has a second input and an output. The circuit module having digital-to-analog conversion functionality and load functionality is connected between the output of the search unit and the circuit output. The analog-to-digital converter (ADC) is connected between the circuit output and the second input of the search unit. The search unit is adapted to generate a digital target voltage at its output on the basis of a voltage at the circuit output and the signal indicative of the forced voltage whereby a signal approximating the forced voltage is applied at the circuit output. The current measurement circuit includes a first input for receiving a first signal derived from the digital target voltage, a second input for receiving a second signal derived from the forced voltage signal and a search logic module. The search logic module is coupled to the first and second inputs and derives a certain current measurement on the basis of the first signal derived from the digital target voltage and the second signal derived from the forced voltage signal and a search logic module. When the system is in equilibrium, the certain current measurement is indicative of an approximation of measurement of the current flowing at the output of the voltage generating circuit when the signal approximating the forced voltage is applied to the output of the voltage generating circuit. The certain current measurement is released at an output of the current measurement circuit.

In a specific implementation, the circuit module having digital-to-analog conversion functionality and load functionality includes a low-pass filter module one side of which is connected to the circuit output and a pulse generator module connected between the output of the search unit and another side of the low-pass filter module.

In an alternative specific implementation, the circuit module having digital-to-analog conversion functionality and load functionality includes an internal load one side of which is connected to the circuit output and a digital-to-analog converter (DAC) connected between the output of the search unit and another side of the internal load.

In accordance with a specific implementation, the search logic of the current measurement circuit includes a data structure having a plurality of entries, each entry providing a mapping between a data element conveying a given target voltage and data element conveying a given the forced voltage to a corresponding current measurement. The data structure may be stored on any suitable memory unit such as a RAM, ROM, PROM, EPROM and EEPROM. In a specific non-limiting implementation, the data structure is stored on a RAM device.

Advantageously, the search logic captures the DC transfer characteristic of the internal load at different current levels. Once known, the transfer characteristic of the internal load can be used indirectly to determine the value of an unknown current level at the output of the circuit device when the output is connect to an external load.

In accordance with yet another broad aspect, the invention provides a current generating circuit device suitable for use in performing a DC parametric test on an external load. The circuit device includes a circuit input, a circuit output, a search unit, a circuit module having digital-to-analog conversion functionality and load functionality and an analog-to-digital converter (ADC). The circuit input is for receiving a signal indicative of a forced current. The circuit output is for connection to the external load. The search unit has a first input connected to the circuit input and has a second input and an output. The circuit module having digital-to-analog conversion functionality and load functionality is connected between the output of the search unit and the circuit output. The analog-to-digital converter (ADC) is connected between the circuit output and the second input of the search unit. The search unit is adapted to generate a digital target voltage at its output on the basis of a voltage at the circuit output and the signal indicative of a forced current whereby a signal approximating the signal indicative of a forced current is derived at the circuit output.

In accordance with a specific example, the circuit module having digital-to-analog conversion functionality and load functionality includes a low-pass filter module one side of which is connected to the circuit output and a pulse generator module connected between the output of the search unit and another side of the low-pass filter module.

In accordance with an alternate example, the circuit module having digital-to-analog conversion functionality and load functionality includes an internal load one side of which is connected to the circuit output and a digital-to-analog converter (DAC) connected between the output of the search unit and another side of the internal load.

In accordance with a specific example of implementation, the search unit includes a data structure having a plurality of entries, each entry providing a mapping between:

1. a data element conveying the voltage signal at the output of the circuit device; and
2. a data element conveying a given forced current and a data element conveying a target voltage.

In a non-limiting implementation, the data structure may be stored on any suitable memory unit such as, but not limited to, a RAM, ROM, PROM, EPROM and EEPROM. In a specific embodiment, the memory unit is stored on a RAM.

In accordance with an alternative implementation, the search unit provides a data structure having a plurality of entries, each entry providing a mapping between:

1. data elements conveying voltage signals at the output and a data element conveying a given forced current signal; and
2. data elements conveying target voltage values.

These and other aspects and features of the present invention will now become apparent to those of ordinary skill in the art upon review of the following description of specific embodiments of the invention in conjunction with the accompanying drawings.

BRIEF DESCRIPTION OF THE DRAWINGS

In the accompanying drawings:

FIGS. 2a and 2b show circuit devices suitable for use in performing a DC parametric test on an external load in accordance with non-limiting examples of implementation of the invention;

Figure 1A:
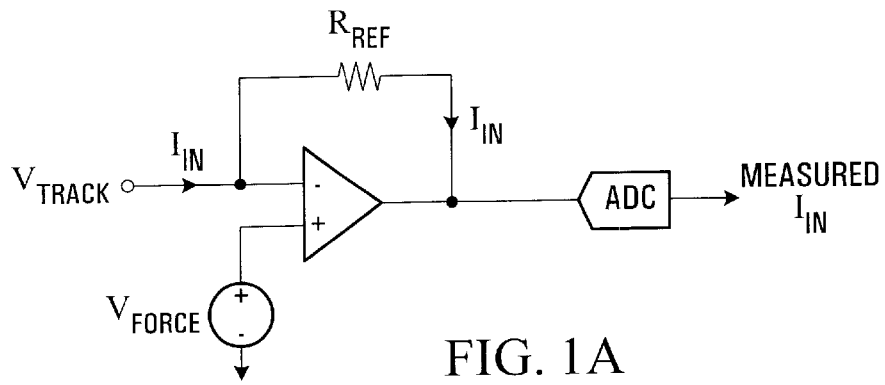
FIGS. 1a, 1b and 1c show examples of prior art circuit devices for on-chip current measurements.
Figure 1B:
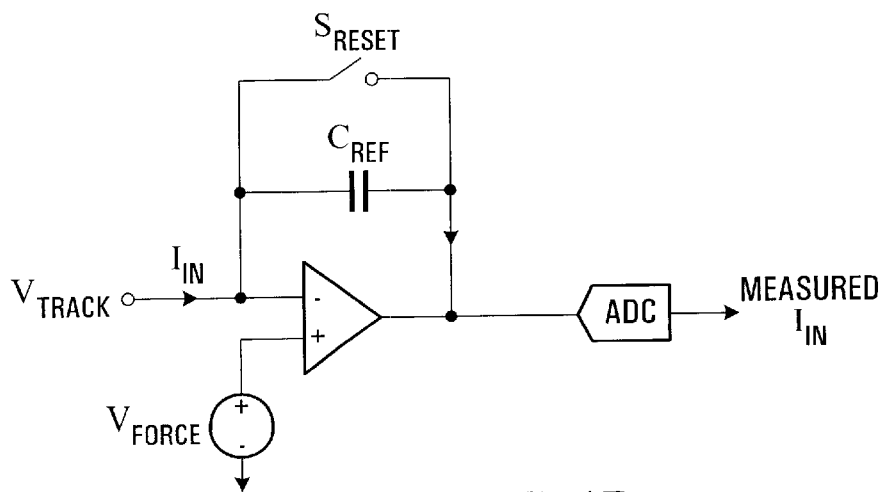
Figure 1C:
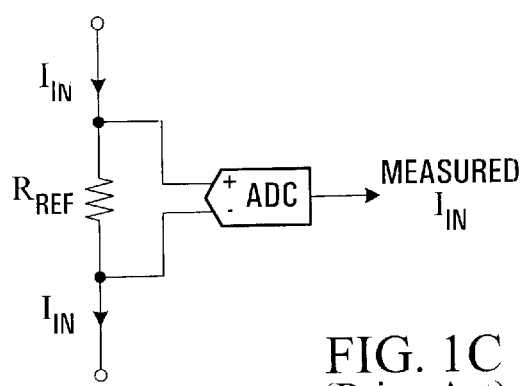

Other aspects and features of the present invention will become apparent to those ordinarily skilled in the art upon review of the following description of specific embodiments of the invention in conjunction with the accompanying figures.

DETAILED DESCRIPTION

With reference to FIGS. 2a and 2b, there is shown a general configuration of a system 200 suitable for use in performing a DC parametric test and an unknown external load 206 representing a circuit under test.

The system 200 includes an input 202 for receiving a forcing parameter signal, an output 204 suitable for releasing to an external load 206 a signal approximating the forcing parameter signal. The system also includes a first circuit segment between the input 202 and the output 204 and a second circuit segment connected in a feedback arrangement with the first circuit segment.

As shown in FIG. 2a, the first circuit segment includes a search entity 199, an intermediate voltage point 214 and an internal load 216 between the intermediate voltage point and the output 204. The second circuit segment provides the search entity 199 in the first circuit segment with a signal indicative of the voltage at the output 204. The search entity 199 is adapted for generating a second voltage signal on the basis of the forcing parameter signal received at input 202 and the first voltage signal received from the second segment and to apply the second voltage signal to the intermediate voltage point 214. The application of the second voltage signal to the intermediate voltage point 214 causes a change in either one of the voltage signal or the current signal at the output 204 such that a signal approximating the forcing parameter signal is caused at the output 204.

It will be appreciated to the person skilled in the art that the search entity 199 may be adapted for processing and generating signals in either digital format or analog format or a combination of both without detracting from the spirit of the invention. For example, the forcing parameter signal applied at input 202 and the second voltage signal released by the search entity 199 may also be in either digital or analog format.

In a specific configuration shown in FIG. 2b, the search entity 199 is shown including a search unit 208, an analog-to-digital converter module (ADC) 212 and a digital-to-analog converter module (DAC) 210. In this configuration, the second circuit segment includes the analog-to-digital converter module (ADC) 212 for processing the voltage at the output 214 to generate a digital approximation 85 of the voltage signal at the output 204. The first circuit segment includes the search unit 208, the intermediate voltage point 214, the internal load 216 between the intermediate voltage point 214 and the output 204 and the digital-to-analog converter module (DAC) 210. The search unit 208 is for generating a digital target voltage 87 on the basis the digital approximation of the voltage signal at the output 204 and the forcing parameter signal at input 202. The digital-to-analog converter module 210 is between the search unit 208 and the intermediate voltage point 214 and is adapted for processing the digital target voltage 87 to generate a second voltage signal and applying the second voltage signal to the intermediate voltage point 214. The application of the second voltage signal to the intermediate voltage point 214 causes a change in either one of the voltage signal and the current signal at the output 204 such that, at equilibrium, a signal approximating the forcing parameter signal is caused at the output 204.

Figure 46A:
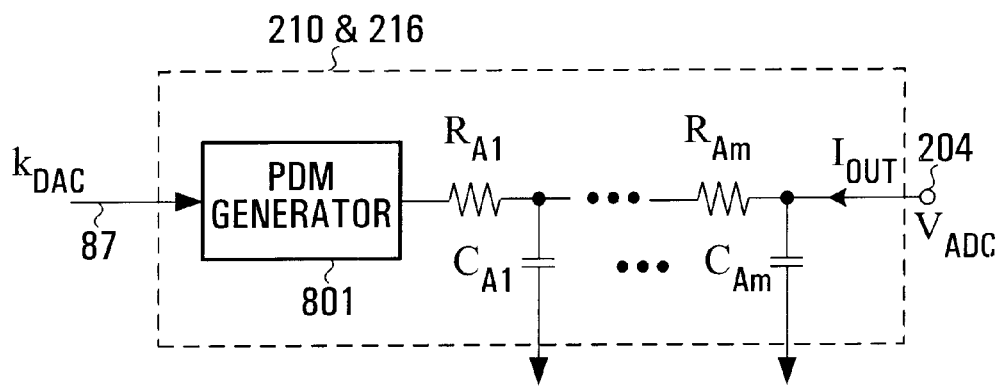
Figure 46B:
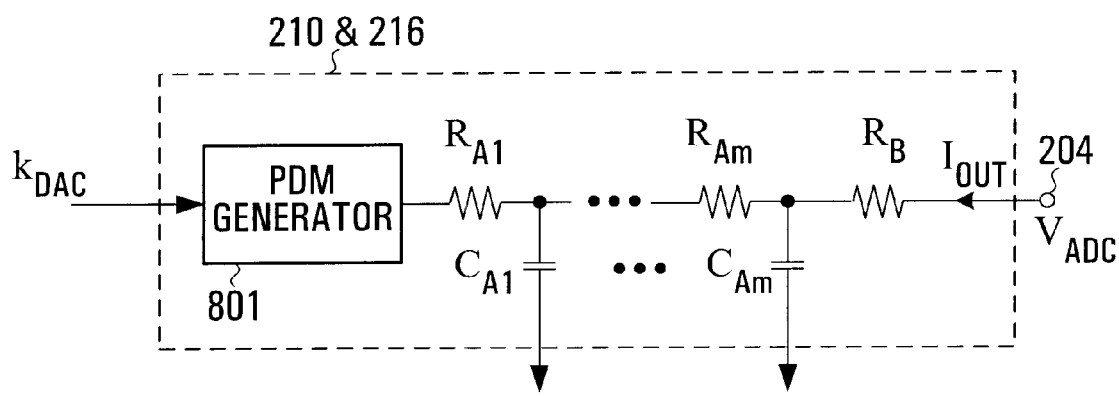

In yet another configuration (not shown in the figures), the first path includes a search unit and a circuit module having digital-to-analog conversion functionality and load functionality. The circuit module is connected between the output of the search unit and the circuit output. A non-limiting example of a circuit module having digital-to-analog conversion functionality and load functionality is shown in FIGS. 46A and 46B which will be described in greater detail further on in the specification. Another example of a circuit module having digital-to-analog conversion functionality and load functionality is a circuit module including digital-to-analog converter module (DAC) 210 and internal load 216 connected as depicted in FIG. 2b.

With reference to FIG. 2b, when the system 200 is in use, a first terminal of external load $R_2$ 206 is connected to output 204. For the purpose of simplicity, it is assumed that the other terminal of external load $R_2$ 206 is connected to a fixed voltage 220. The resistance of external load $R_2$ 206 can be derived from the voltage $V_{ADC}$ at output 204, from the voltage at 220 and by the current $I_{out}$ flowing at output 204.

The input 202 allows receiving either a forcing voltage value or a forcing current value. In embodiments where the input 202 is for receiving a forcing voltage, the set of functional elements allows forcing the voltage $V_{ADC}$ at output 204 to a required voltage value at the external load $R_2$ 206 using a search algorithm implemented by search unit 208. The search unit 208 controls the voltage at intermediate voltage point 214, which is input to the Digital-to-Analog-Converter (DAC) 210, such that the desired voltage $V_{ADC}$ at output 204 is set as desired. In embodiments where the input 202 is for receiving a forcing current, the set of functional elements allows forcing the current $I_{out}$ at output 204 to a required current value at the external load $R_2$ 206.

Depending on the forcing parameter (the voltage $V_{ADC}$ or $I_{out}$ at output 204), different searching algorithms are implemented by the search unit 208. The algorithms implemented by search unit 208 are described in greater detail herein below.

The resistance of the internal load $R_1$ 216 depends on both terminal voltage $V_{DAC}$ at point 214 and voltage $V_{ADC}$ at output 204. The Analog-to-Digital-Converter (ADC) 212 has an input coupled to output 204 and an output coupled to the search unit 208. The ADC 212 has essentially an infinite resistance in the operating range of the system 200. As such the ADC 212 does not draw current and consequently, the current at output 204 flowing in external load 206 also flows into internal load $R_1$ 216.

Internal Load $R_1$ 216

In a specific implementation, the internal load $R_1$ 216 is a non-linear resistor device whose resistance depends on both terminal voltages $V_{DAC}$ and $V_{ADC}$. As a result, $I_{out}$ is dependent on both $V_{DAC}$ and $V_{ADC}$. A non-limiting example of the DC characteristics of internal load $R_1$ 216 is shown in FIG. 3 of the drawings.

Positive Resistance Property

Figure 3:
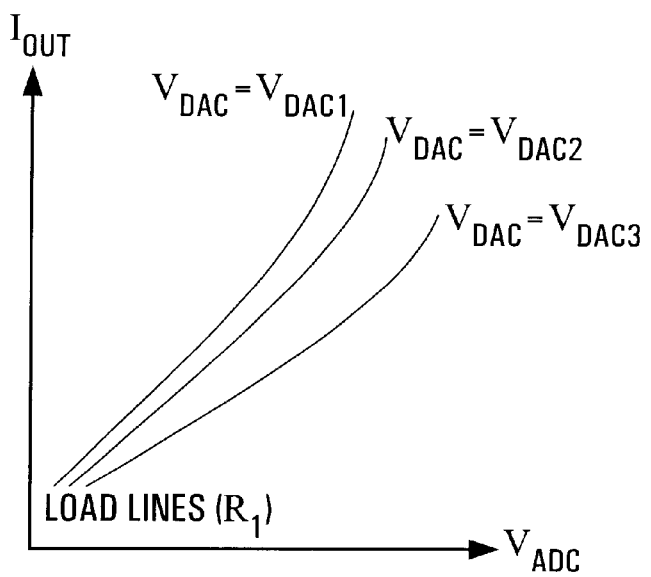
FIG. 3 is a graph showing the DC characteristics of internal load of the circuit device shown in FIG. 2b in accordance with a non-limiting example of implementation of the invention.

From FIG. 3, it can be observed that for any particular voltage $V_{DAC}$ at intermediate voltage point, current $I_{out}$ at 204 increases when the voltage $V_{ADC}$ at 204 increases. Mathematically, this can be expressed by the following:

$$\frac{\partial V_{ADC}}{\partial I_{out}} > 0 \text{ for all voltage values } V_{DAC} \qquad \text{Equation 1}$$

Figure 4A:
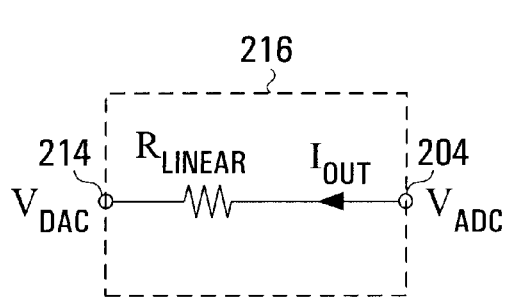
FIGS. 4a and 4b show specific example of implementation of the internal load of the circuit device shown in FIG. 2b in accordance with a non-limiting example of implementation of the invention.
Figure 4B:
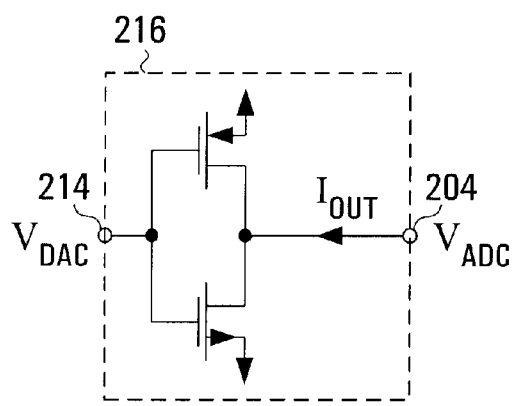

An internal load $R_1$ 216 is said to have a "positive resistance" if the condition in equation 1 is satisfied. Two non-limiting examples of implementations of such a load element are shown in FIGS. 4(a) and 4(b). FIG. 4(a) shows a linear resistor and FIG. 4(b) shows a CMOS inverter. For either one of these elements, the current $I_{out}$ at 204 increases with voltage $V_{ADC}$ if voltage $V_{DAC}$ is fixed at any voltage. Hence the examples of load elements shown in FIGS. 4(a) and 4(b) follow the relationship in equation 1.

For the purpose of simplicity, only elements with a positive resistance will be used for internal load $R_1$ 216. Therefore, in all the analysis that follows, $R_1$ will be assumed to have a positive resistance. It will be readily apparent to the person skilled in the art in light of this description that an implementation where $R_1$ has a non-positive resistance can be implemented without detracting from the spirit of the invention.

Non-Inverting Property

If the voltages at the intermediate voltage point 214 correspond to $V_{DAC}$ voltages in FIG. 3 as $V_{DAC3} > V_{DAC2} > V_{DAC1}$, then voltage $V_{ADC}$ will increase with voltage $V_{DAC}$ if $I_{out}$ is held at any constant value. Mathematically, this can be expressed by the following:

$$\frac{\partial V_{ADC}}{\partial V_{DAC}} > 0 \text{ for all } I_{out} \qquad \text{Equation 2}$$

A load element $R_1$ 216 is said to be "non-inverting" if the condition in equation 2 is satisfied. An example of a non-inverting load $R_1$ 216 is shown in FIG. 4(a). It will be readily apparent to the person skilled in the art that if current $I_{out}$ at output 204 is fixed at any value, there will be a constant potential difference between $V_{ADC}$ and $V_{DAC}$. Therefore, $V_{ADC}$ increases with $V_{DAC}$. The condition in equation 2 is satisfied.

Alternatively, load element $R_1$ 216 may be "inverting" if it satisfies the following condition. If the voltages shown in FIG. 3 at the intermediate voltage point 214 as $V_{DAC3} < V_{DAC2} < V_{DAC1}$, then $V_{ADC}$ will increase while $V_{DAC}$ decreases (and vice versa) if $I_{out}$ is held constant. Mathematically, this can be expressed by the following:

$$\frac{\partial V_{ADC}}{\partial V_{DAC}} < 0 \text{ for all } I_{out} \qquad \text{Equation 3}$$

A load element $R_1$ 216 is said to be "inverting" if the condition in equation 3 is satisfied. An example of an inverting $R_1$ is shown in FIG. 4(b). For a constant $I_{out}$, the $V_{ADC}$ increases while $V_{DAC}$ decreases, and vice versa.

Depending on whether an inverting or a non-inverting internal load $R_1$ 216 is implemented in the system 200 (shown in FIGS. 2a and 2b), slightly different search algorithms have to be implemented by the search unit 208. The search algorithms implemented by the search unit 208 will first be described with reference to an non-inverting internal load $R_1$ 216. The algorithm modifications for an inverting-type load $R_1$ 216 will be described later on in the specification.

External Load $R_2$ 206

With reference to FIGS. 2a and 2b of the drawings, the current $I_{out}$ flowing from external load $R_2$ at output 204 is dependent on the voltage $V_{ADC}$ at the output 204. In most microelectronic circuits, whenever a current is pumped into a node, the node voltage increases. In a specific example of implementation, the system 200 is designed with the assumption that current $I_{out}$ decreases as $V_{ADC}$ increases (i.e., $V_{ADC}$ increases when a positive current is pumped into $R_2$). Mathematically, this constraint can be expressed as $$\frac{\partial I_{out}}{\partial V_{ADC}} < 0 \qquad \text{Equation 4}$$

Figure 5:
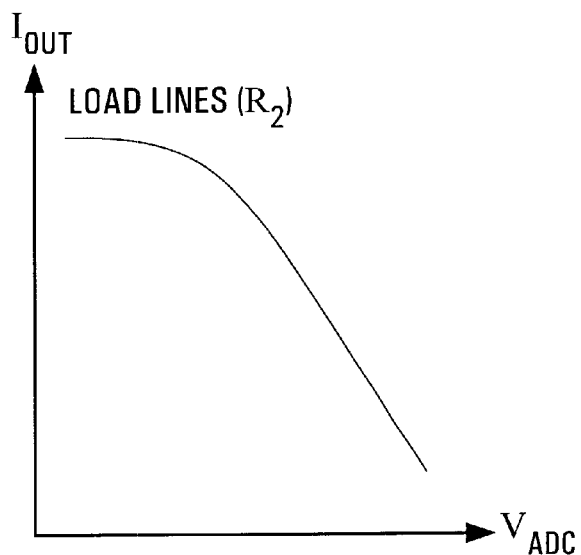
FIG. 5 is a graph showing the DC characteristics of external load $R_2$ in accordance with a non-limiting example of implementation of the invention.

An example DC characteristic of external load $R_2$ 206 that follows equation 4 is shown in FIG. 5. For the purpose of simplicity, $R_2$ is assumed to follow the property defined by equation 4. It will be readily apparent to the person skilled in the art in light of this description that an implementation where $R_2$ does not follow the property defined by equation 4 can be implemented without detracting from the spirit of the invention.

Series-Connected Loads

When the system 200 is in operation, the internal load $R_1$ 216 is connected in series with external load $R_2$ 206 as shown in FIGS. 2a and 2b. As a result, the load currents ($I_{out}$'s) through the load $R_1$ 216 and load $R_2$ 206 are equal. The DC bias points can be found by overlapping the DC plots of FIG. 3 and FIG. 5 to form a load-line plot shown in FIG. 6.

Figure 6:
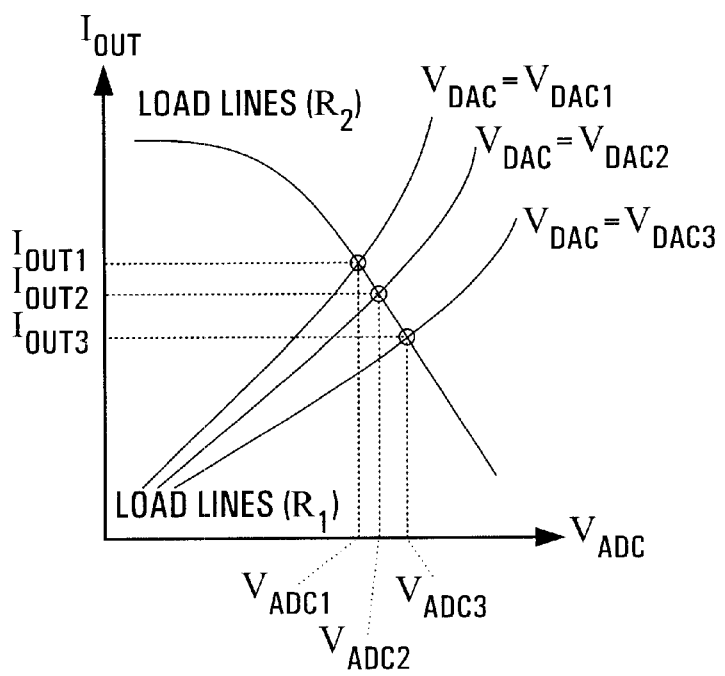
FIG. 6 is a graph showing on a same graph the load lines of internal load $R_1$ and the load line of internal load $R_2$ depicted in FIGS. 3 and 5 when the loads $R_1$ and $R_2$ are connected in series.

It can be seen from FIG. 6 that for a voltage $V_{DAC}$ at intermediate voltage point 214, there is only one valid $V_{ADC}$ and $I_{out}$ at output 204 that can satisfy the equilibrium condition. Thus $V_{ADC}$ and $I_{out}$ are functions of voltage $V_{DAC}$. Mathematically, this relationship can be expressed as two simultaneous equations:

$$V_{ADC} = f_1(V_{DAC}) \qquad \text{Equation 5}$$

$$I_{out} = f_2(V_{DAC}) \qquad \text{Equation 6}$$

The relationships in equations 5 and 6 imply that it is possible to force either a voltage ($V_{ADC}$) or a current ($I_{out}$) at output 204 by establishing a corresponding voltage $V_{DAC}$ at the intermediate voltage point 214.

Force-Voltage-Measure-Current Algorithm

In a first example of implementation of the invention, the input 202 (shown in FIGS. 2a and 2b) is adapted for receiving a forcing parameter signal indicative of a forced voltage signal $V_{force}$. In such an implementation, the system is a voltage generating circuit and the search unit 208 is said to implement a force voltage algorithm.

The Search Algorithm

An objective of the force-voltage algorithm is to vary the voltage $V_{DAC}$ at the intermediate voltage point 214 such that the voltage at the output ($V_{ADC}$) 204 will be set to approximate the desired forcing voltage $V_{force}$. We will refer to this desired $V_{DAC}$ voltage as $V^*_{DAC}$.

Figure 7:
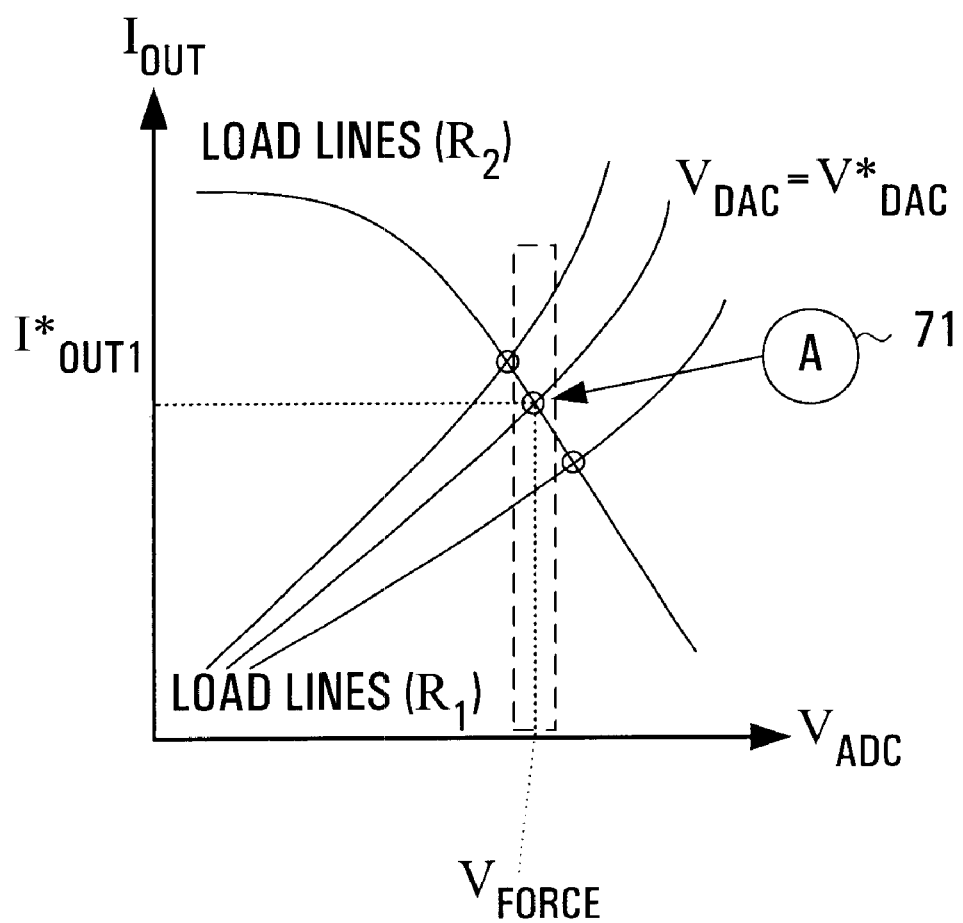
FIG. 7 is a graph showing the location of the desired voltage to apply to the intermediate voltage point $V_{DAC}$ shown in FIG. 2b of the drawings for a desired forcing parameter voltage signal $V_{force}$ in accordance with a specific example of implementation of the invention.

FIG. 7 shows a graphical view of the search process used to obtain $V^*_{DAC}$. For a particular $V_{force}$ applied at input 202, the operating current $I_{out}$ at output 204 corresponds to the intersection of a vertical line representing $V_{ADC} = V_{force}$ and the load line for $R_2$. This point of intersection is labelled as point A 71 in FIG. 7. The search algorithm adjusts $V_{DAC}$ at the intermediate voltage point 214 such that the load line for load $R_1$ 216 intersects point A 71. The corresponding $V_{DAC}$ is then $V^*_{DAC}$.

Figure 8:
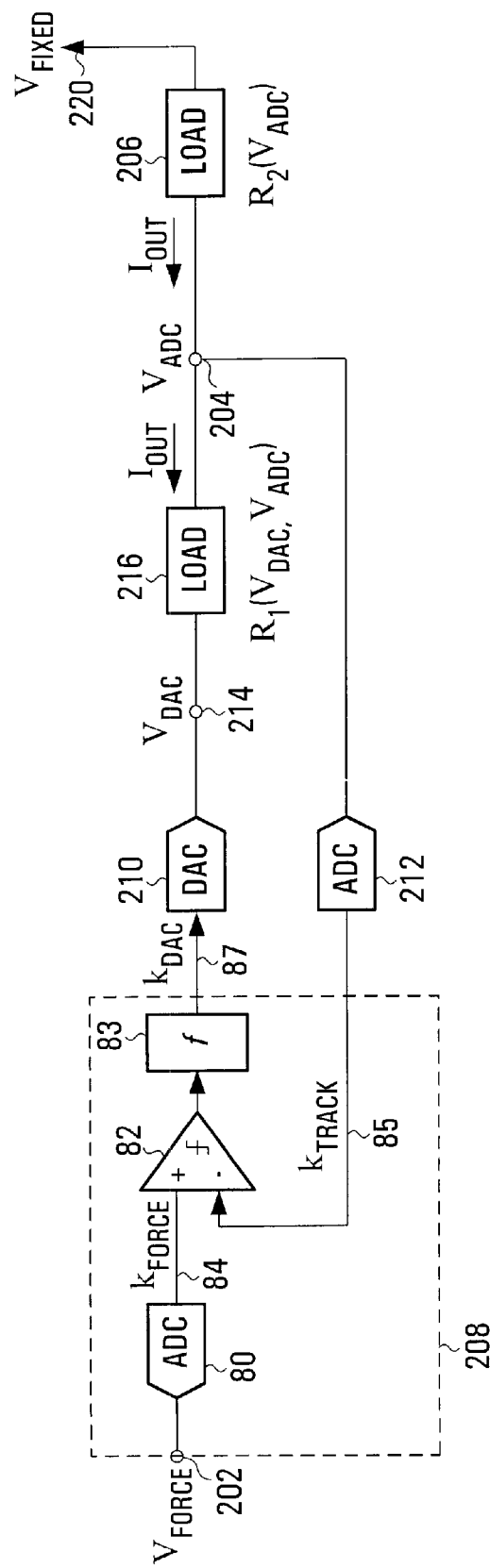
FIG. 8 shows the circuit device of FIG. 2b adapted for searching for a voltage to apply to intermediate voltage point $V_{DAC}$ for a desired forcing parameter voltage signal $V_{force}$ in accordance with a non-limiting example of implementation of the invention.

FIG. 8 shows the circuit device of FIG. 2b adapted for searching for a voltage to apply to intermediate voltage point $V_{DAC}$ for a desired forcing parameter voltage signal $V_{force}$ in accordance with a non-limiting example of implementation of the invention.

As shown in FIG. 8, a forced voltage signal $V_{force}$ is applied to input 202. The search unit 208 includes an ADC 80, a digital comparator 82, a digital integrator module 83 and an output for releasing a digital target voltage $k_{DAC}$ 87. The ADC 80 processes the forced voltage signal $V_{force}$ to generated a digital forced voltage signal $k_{FORCE}$ 84. The digital comparator 82 is for generating a digital difference voltage signal dependent on the difference between the digital forced voltage signal 84 and the digital approximation 85 of the voltage signal at the output 204 of the circuit device. The digital integrator module 83 is adapted for processing the digital difference voltage signal to derive the digital target voltage $k_{DAC}$ 87. The digital target voltage $k_{DAC}$ 87 is released at the output of the search unit 208 for processing by the digital-to-analog converter module 210. Where the forcing parameter signal is a digital signal, the ADC 80 may be omitted from the system shown FIG. 8.

Mathematically, $k_{force}$ 84 can be expressed as follows:

$$k_{force} = \frac{Q[V_{force}]}{V_{LSB-ADC}} = \frac{\hat{V}_{force}}{V_{LSB-ADC}} \qquad \text{Equation 7}$$

where Q[x] is the quantizer function of the ADC 80, $V_{LSB-ADC}$ is the LSB voltage of the ADC 80 and $\hat{V}_{force}$ is the quantized $V_{force}$ aplied at 202. Also, the digitized value of $V_{DAC}$ at intermediate point 214 is denoted by $k_{DAC}$ at point 87 in FIG. 8.

It will be readily apparent that for any voltage x and its quantized value Q[x], the difference is no bigger than half the LSB voltage of the ADC 80 ($V_{LSB-ADC}$). This voltage difference is negligible when ADC 80 has a sufficiently small quantization step. Therefore, for the purpose of simplicity of the description, the following assumption have been made:

$$x = Q[x] = k \times V_{LSB-ADC} \qquad \text{Equation 8}$$

where k is the digital representation of voltage x at the output of the ADC. From equation 8, it can be seen that:

$$V_{force} = \hat{V}_{force} \qquad \text{Equation 9}$$

Therefore, equation 7 becomes:

$$k_{force} = \frac{V_{force}}{V_{LSB-ADC}} \qquad \text{Equation 10}$$

Similarly, for the ADC 212 at the feedback path of FIG. 8, $$k_{track} = \frac{V_{ADC}}{V_{LSB-ADC}} \qquad \text{Equation 11}$$

where $V_{ADC}$ is the voltage at output 204 and $k_{track}$ is the digital approximation of the voltage signal $V_{ADC}$ at node 85 in FIG. 8.

Upon equilibrium in the system, $V_{ADC} = V_{force}$ and $V_{DAC} = V^*_{DAC}$.

Current Measurement

Once the voltage $V_{force}$ has been applied, the current $I_{out}$ at output 204 needs to be obtained in order to obtain the DC characteristics of external load $R_2$ 206.

Figure 9:
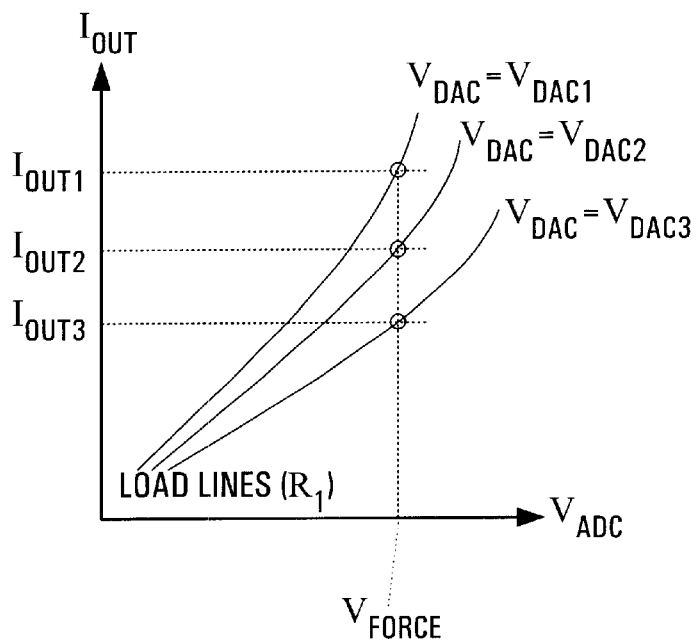
FIG. 9 is a graph showing the DC characteristics of internal load $R_1$ of the circuit device shown in FIG. 2b and showing the location of the current measurements in accordance with a non-limiting example of implementation of the invention.

With reference to FIG. 9, the load lines of internal load $R_1$ 216 are shown with reference to current $I_{out}$ at output 204. It can be seen from this figure that $I_{out}$ is dependent on both the voltage $V_{DAC}$ at the intermediate voltage point 214 and on the voltage $V_{ADC}$ at the output 204. Mathematically, this can be expressed as follows:

$$I_{out}=G(V_{DAC},V_{ADC}) \quad \text{Equation 12}$$

If the voltage $V_{ADC}$ at output 204 is kept constant at a voltage which approximates $V_{force}$, current $I_{out}$ at output 204 becomes a one variable function of the voltage $V_{DAC}$ at the intermediate voltage point 214 as follows:

$$I_{out}=G(V_{DAC},V_{force}) \quad \text{Equation 13}$$

Figure 10:
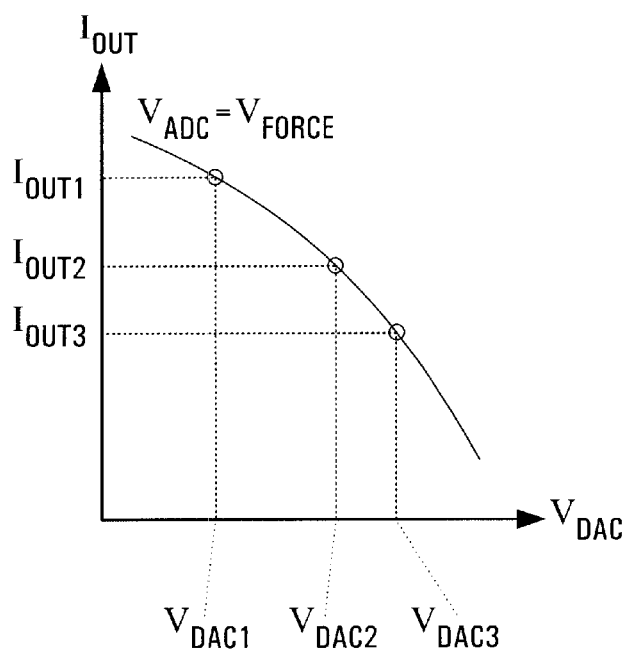
FIG. 10 is a graph illustrating a function mapping a forcing parameter signal $V_{force}$ and the voltage to apply to intermediate voltage point $V_{DAC}$ to a current value at the output of the circuit device shown in FIG. 8 in accordance with a non-limiting example of implementation of the invention.

This is illustrated in FIG. 9, where the vertical line representing $V_{ADC}=V_{force}$ have been superimposed on the load lines. As shown in FIGS. 9 and 10, the intersection points uniquely relate the current $I_{out}$ at output 204 and the voltage $V_{DAC}$ at the intermediate voltage point 214.

With reference to FIG. 8, by forcing a voltage $V_{ADC}$ at output 204 approximating a particular $V_{force}$ applied at input 202, the voltage $V_{DAC}$ at the intermediate voltage point 214 will settle at a corresponding $V^*_{DAC}$. Suppose the relationship G in equation 13 is known, then the current $I_{out}$ at output 204 can be deduced by simply substituting $V_{DAC}=V^*_{DAC}$ into equation 13 to obtain:

$$I_{out}=G(V^*_{DAC},V_{force}) \quad \text{Equation 14}$$

Using the relationship in equation 14, a current measurement mechanism can be derived as follows. First, it can be seen in FIG. 8 that the value of the voltage $V_{DAC}$ at the intermediate voltage point 214 is reconstructed from the digital value $k_{DAC}$ at point 87 via a DAC 210. If we denote the LSB voltage of the DAC 210 by $V_{LSB-DAC}$, then mathematically $V_{DAC}$ can be expressed as follows:

$$V_{DAC}=k_{DAC}\times V_{LSB-DAC} \quad \text{Equation 15}$$

When the circuit in FIG. 8 is in equilibrium, $V_{DAC}=V^*_{DAC}$. According to equation 15, the value of $k_{DAC}$ will be given by:

$$k_{DAC}=k^*_{DAC}=\frac{V^*_{DAC}}{V_{LSB-DAC}} \quad \text{Equation 16}$$

By substituting equations 7 and 16 into equation 14, the value of the current $I_{out}$ at output 204 can be deduced as follows:

$$I_{out}=G(V^*_{DAC},V_{force})=G(k^*_{DAC}\times V_{LSB-DAC},k_{force}\times V_{LSB-ADC}) \quad \text{Equation 17}$$

As $V_{LSB-DAC}$ and $V_{LSB-ADC}$ in equation 17 are constant scale factors, equation 17 can be simplified as follows:

$$I_{out}=G(k^*_{DAC}\times V_{LSB-DAC},k_{force}\times V_{LSB-ADC})=\hat{G}(k^*_{DAC},k_{force}) \quad \text{Equation 18}$$

Figure 11:
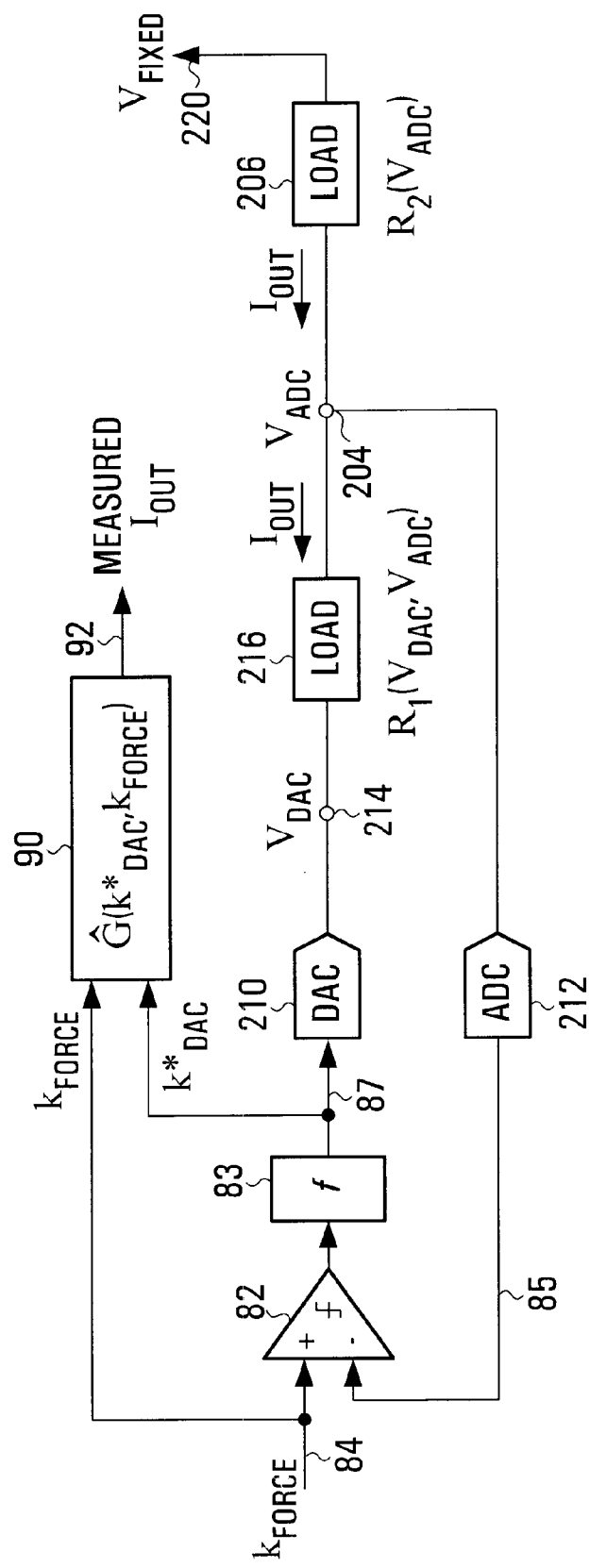
FIG. 11 shows the circuit device of FIG. 8 adapted for further providing a current measurement value in accordance with a non-limiting example of implementation of the invention.

The relationship described in equation 18 can be implemented by the circuit shown in FIG. 11.

The system depicted in FIG. 11 includes the same system as that is depicted in FIG. 8 in addition to a current measuring circuit. The current measurement circuit includes search logic 90. Search logic 90 receives a signal conveying a forced voltage signal and a signal conveying the target voltage signal at intermediate point 214 (or alternatively at point 87) and processes these signals to derive a measurement of the current flowing at the output 204 of the voltage generating circuit. In the specific example depicted in FIG. 11, the current measurement circuit includes a first input for receiving the digital representation of the second voltage signal $k_{DAC}$ 87, a second input for receiving a digital approximation of the forced voltage signal $k_{FORCE}$ 84, search logic 90 and an output 92. The search logic 90 derives a certain current measurement on the basis of the digital representation of the second voltage signal $k_{DAC}$ 87 and the digital approximation of the forced voltage signal $k_{FORCE}$ 84. The certain current measurement is released at the output 92 of the current measurement circuit. When the system is in equilibrium, the certain current measurement is indicative of an approximation of measurement of the current flowing at the output of the voltage generating circuit when the forced voltage is applied to the output 204. It will be appreciated that although the search logic 90 has been described as receiving signals in digital format, search logic 90 may be implemented such that it may receive signals in analog format without detracting from the spirit of the invention.

In accordance with a specific implementation, the search logic of the current measurement circuit includes a data structure in the form of a lookup table 90 containing $\hat{G}$. The data structure may be stored on any suitable memory unit such as a RAM, ROM, PROM, EPROM and EEPROM. In a specific non-limiting implementation, the data structure is stored on a RAM device. The values $k^*_{DAC}$ 87 and $k_{force}$ 84 are fed into lookup table 90 to derive $I_{out}$. When the system is in equilibrium, the value of $I_{out}$ can be computed using equation 18.

Calibration Techniques

In a specific implementation, to perform a force-voltage current measurement, a lookup table containing $\hat{G}$ 90 is used. In this section, two different examples of methods of the calibration procedure for generating the required lookup-table entries for $\hat{G}$ are described. It will be readily apparent that methods other than those described herein below may be used for generating the lookup table containing $\hat{G}$ 90 without detracting from the spirit of the invention.

Method 1

In a first specific example, if $k_{ADC}$ is forced to a constant value approximating $k_{force}$, equation 18 can be written as follows:

$$I_{out}=\hat{G}(k^*_{DAC},k_{ADC})|_{k_{ADC}=k_{force}} \quad \text{Equation 19}$$

Figure 12:
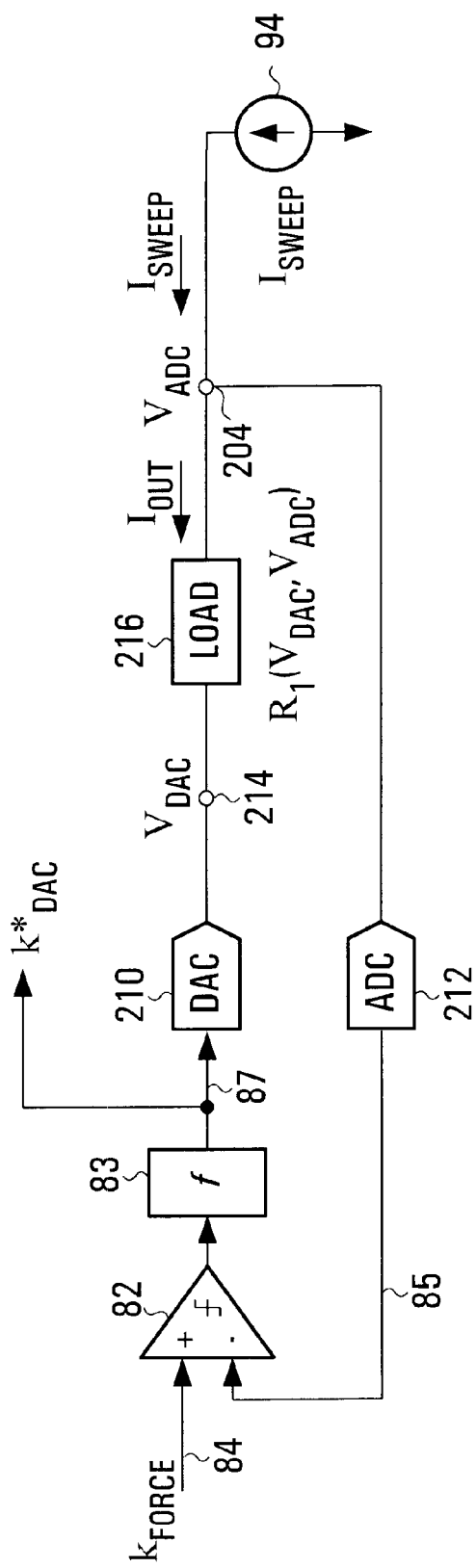
FIG. 12 shows a calibration circuit for calibrating the circuit device shown in FIG. 8 in accordance with a non-limiting example of implementation of the invention.

Equation 19 indicate that $I_{Out}$ would become a one-variable function of $k^*_{DAC}$. Alternatively, we can write the inverse relationship of equation 19 as follows:

$$k^*_{DAC}=\hat{G}^{-1}(I_{out},k_{ADC})|_{k_{ADC}=k_{force}} \quad \text{Equation 20}$$

where $k^*_{DAC}$ is a function of $I_{out}$, $\hat{G}^{-1}$ is the inverse function of G. The relationship in equation 20 can be obtained by the circuit shown in FIG. 12. In the circuit, voltage $V_{ADC}$ at output 204 is held constant at the desired forcing voltage dictated by $k_{force}$ 84. The inverse function $\hat{G}^{-1}$ is found by sweeping an external current reference $I_{sweep}$ 94 over a range of current values, followed by recording $k^*_{DAC}$ 87 at each current step. The values of $k^*_{DAC}$ may be recorded in any suitable readable memory device. In a non-limiting implementation, the values of $k^*_{DAC}$ 87 are recorded on a RAM. In other words, for a given combination of $k_{force}$ 84 and $I_{sweep}$ 94, a corresponding value of $k^*_{DAC}$ is recorded.

Once the inverse mapping $\hat{G}^{-1}$ is known, the input and output variables can be interchanged to obtain the function in equation 19. The resultant mapping $\hat{G}$ can then be used in the current measurement circuit in FIG. 11. Note that the lookup table $\hat{G}$ 90 needs to be re-calibrated using this procedure should a different forcing voltage $V_{force}/k_{force}$ be needed.

Method 2

A drawback of a force-voltage current measurement with calibration method 1 described above is that a large number of calibration points is required before an actual measurement can be done. For example, an n-bit current measurement will require a calibration of $2^n$ points for the function $\hat{G}$. If the number of actual current measurements is small, a significant amount of test time will be wasted to generate the unused entries of the lookup table $\hat{G}$ 90.

This section describes a second specific example of a calibration scheme that can avoid unnecessary calibrations. To achieve this, the current measurement system is calibrated after an actual measurement is made. The details of this algorithm are described below.

Figure 13:
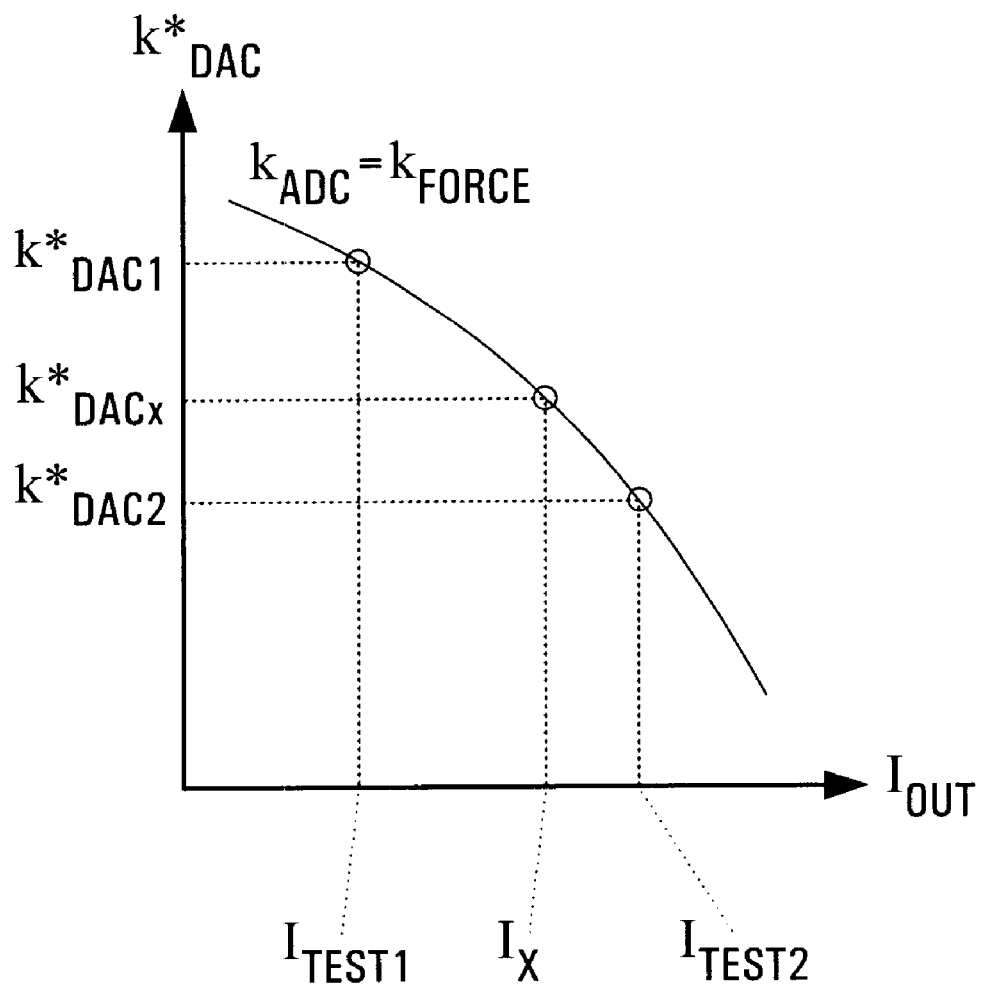
FIG. 13 is a graph showing a plot of $k^*_{DAC}$ vs. $I_{out}$ in accordance with a non-limiting example of implementation of the invention.

A plot of $\hat{G}^{-1}$ defined in equation 20 is shown in FIG. 13. It can be seen that for the same forcing voltage given by a constant $k_{ADC}=k_{force}$ 84, voltage $k^*_{DAC}$ 87 is a function of $I_{out}$ at the output 204. Suppose $I_{out}=I_x$ when the voltage at the external load $R_2$ 206 in FIG. 8 is forced to approximate $V_{force}$. According to FIG. 13, the corresponding $k^*_{DAC}$ will be given by $k^*_{DACx}$. Mathematically, this can be expressed as follows:

$$k^*_{DACx} = \hat{G}^{-1}(I_x, k_{ADC})|_{k_{ADC}=k_{force}} \quad \text{Equation 21}$$

Figure 14:
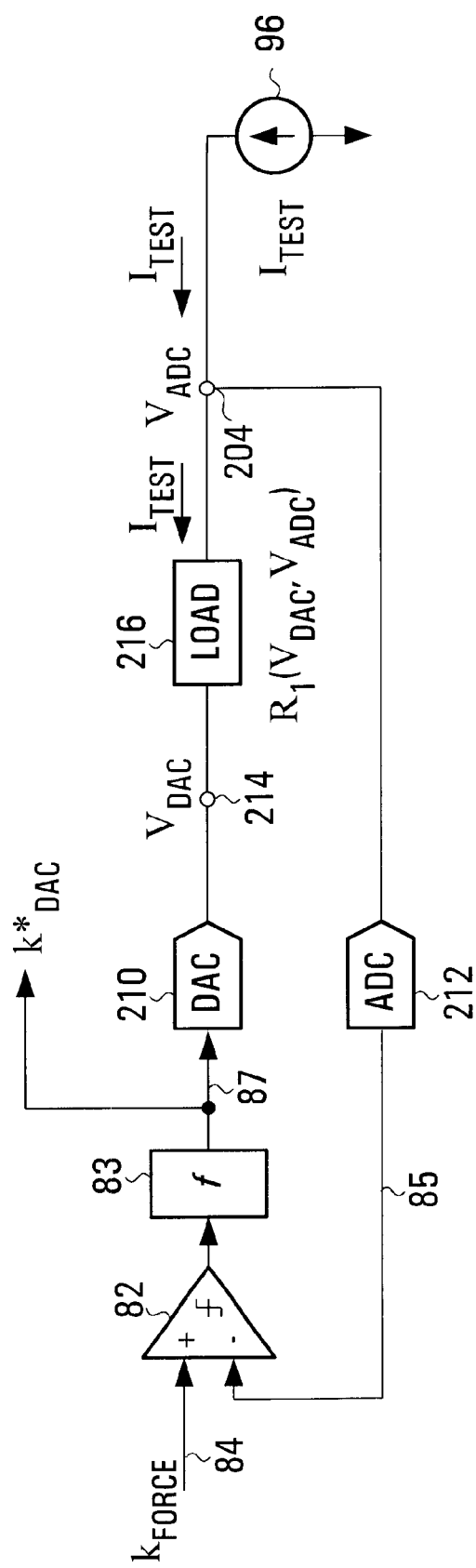
FIG. 14 shows a test circuit for calibrating the circuit device shown in FIG. 8 including a test current reference $I_{test}$ in accordance with a non-limiting example of implementation of the invention.

Now, suppose the output node 204 is connected to a current source at a value $I_{test}$ 96 as shown in FIG. 14. It can be seen from FIG. 13 that when $I_{out}$ is not equal to $I_x$ (e.g., when $I_{out}=I_{test1}$ or $I_{out}=I_{test2}$), the corresponding $k^*_{DAC}$ will not equal $k^*_{DACx}$. The principles of this calibration algorithm is to use the setup in FIG. 8 to first measure $k^*_{DACx}$ when $I_{out}$ is equal to the unknown current $I_x$. Then, a current reference is applied to the system in a manner shown in FIG. 14. A search can be conducted to find the required $I_{test}$ value that generates $k^*_{DAC}=k^*_{DACx}$. The resultant $I_{test}$ value from the search will be the value of the unknown current $I_x$.

It can be seen from FIG. 13 that when $I_{test}$ is set to $I_{test1}<I_x$, the corresponding $k^*_{DAC1}$ is bigger than $k^*_{DACx}$. From this, we can conclude that:

$$k^*_{DAC} > k^*_{DACx} \text{ when } I_{test} < I_x \quad \text{Equation 22}$$

Similarly, by observing the intersection point at $I_{out}=I_{test2}>I_x$, it can be said that $$k^*_{DAC} < k^*_{DACx} \text{ when } I_{test} > I_x \quad \text{Equation 23}$$

The relationships in equations 22 and 23 provide the basis for the calibration search algorithm. In each iteration, $I_{test}$ is set to a value and the corresponding $k^*_{DAC}$ will be compared with $k^*_{DACx}$, the comparison result can then be used to increment/decrement $I_{test}$ in the next iteration. The detail of this algorithm is summarised in Table 1.

TABLE 1

Calibration Search Algorithm

| Comparison Result | Implied Observation | Adjustment of $I_{test}$ in the next iteration |
|---|---|---|
| $k^*_{DAC} > k^*_{DACx}$ | $I_{test} < I_x$ | increase $I_{test}$; otherwise decrease $I_{test}$ |

Figure 15:
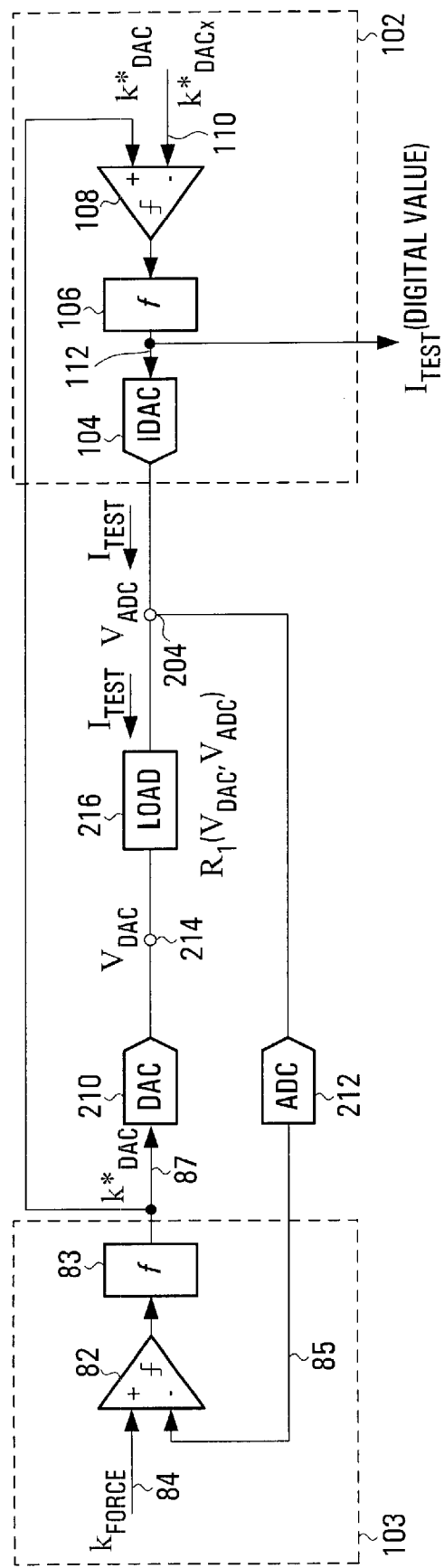
FIG. 15 shows an alternate calibration circuit for calibrating the circuit device shown in FIG. 8 in accordance with a non-limiting example of implementation of the invention.

The calibration algorithm described in Table 1 can be implemented by the calibration circuit 102 shown in FIG. 15. The calibration circuit 102 includes a current DAC (IDAC) 104, a digital comparator module 108 and a digital integrator 106. In the figure, IDAC 104 is a current DAC whose output current $I_{test}$ can be controlled digitally. Upon equilibrium, $k^*_{DAC}$ (87)=$k^*_{DACx}$ (110), the digital value of $I_{test}$ 112 would be equal to the digitised value of the unknown current $I_x$.

The advantage of this calibration algorithm is that for an n-bit current measurement, a calibration of the 2n points for function $\hat{G}$ is not required. For example, when the search algorithm in Table 1 is implemented using the step search circuit in FIG. 15, on average only $2^{n-1}$ calibration points are required. If the search algorithm in Table 1 is implemented by a binary search algorithm, only n calibration points are required for each measurement.

Force-Current-Measure-Voltage Algorithms

In a second example of implementation of the invention, the input 202 (shown in FIGS. 2a and 2b) is adapted for receiving a forcing parameter signal indicative of a forced current signal $I_{force}$.

The Search Algorithms

The objective of the force-current algorithms is to control the voltage $V_{DAC}$ at intermediate voltage point 214 or voltage $V_{ADC}$ at output 204 using the system in FIGS. 2a and 2b such that the current $I_{out}$ at output 204 will be set to approximate the desired forcing current $I_{force}$ applied at input 202.

Search Variables

Figure 16:
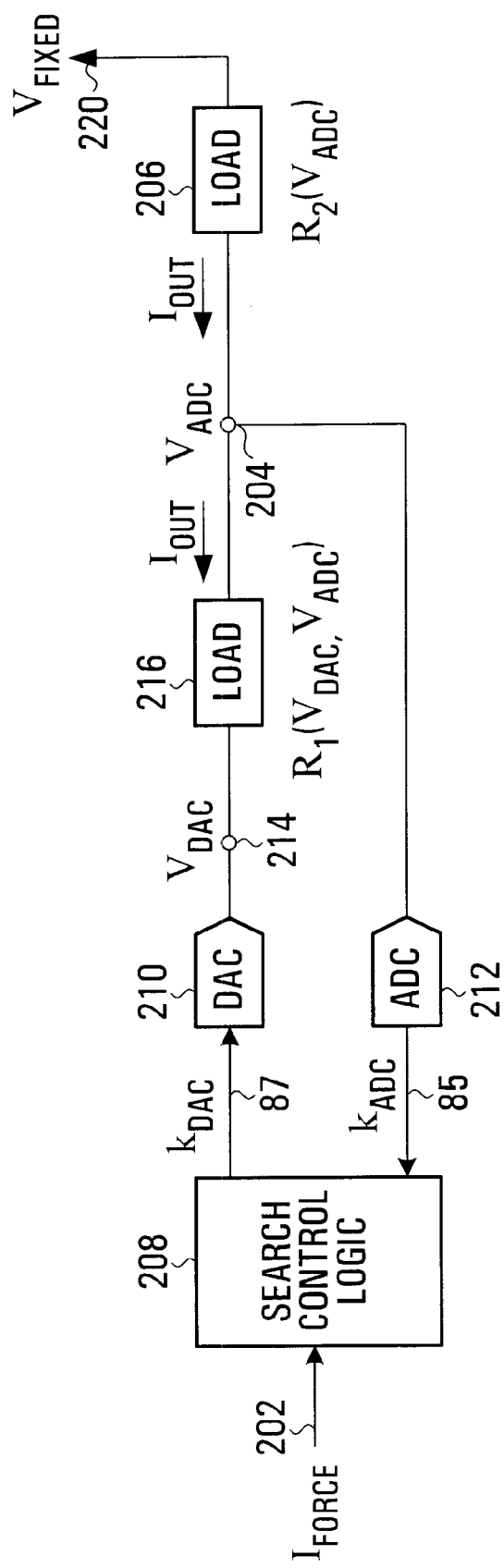
FIG. 16 shows the circuit device of FIG. 2b adapted for searching for a voltage to apply to intermediate voltage point $V_{DAC}$ for a desired forcing parameter current signal $I_{force}$ in accordance with a non-limiting example of implementation of the invention.

From equation 6, it can be seen that by varying voltage $V_{DAC}$ intermediate voltage point 214, the value of $I_{out}$ can be set to approximate a desired value, $I_{force}$. A search of the voltage $V_{DAC}$ can be implemented using the system shown in FIG. 16. The desired $V_{DAC}$ voltage is defined as $V^*_{DAC}$. Mathematically, this can be expressed as follows:

$$I_{force} = f_2(V^*_{DAC}) \quad \text{Equation 24}$$

Figure 17:
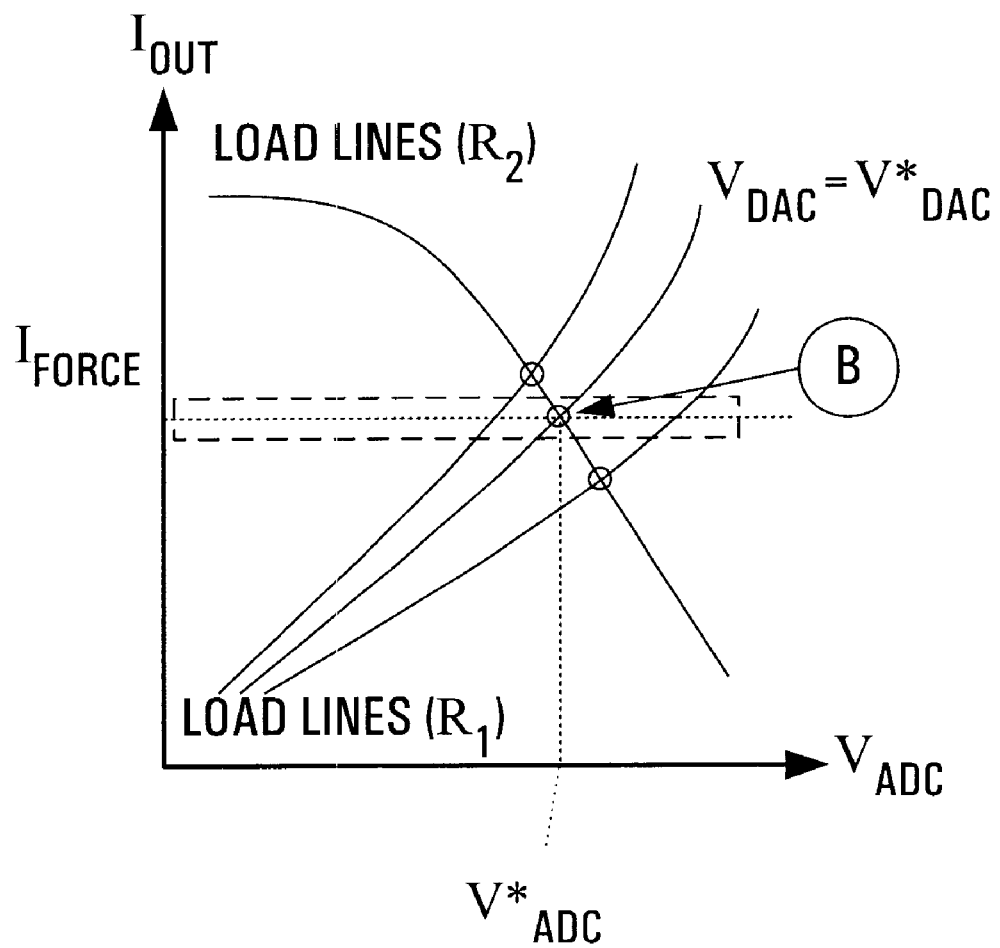
FIG. 17 is a graph showing the location of a desired voltage to apply to intermediate voltage point $V_{ADC}$ for a desired forcing parameter current signal $I_{force}$ in accordance with a non-limiting example of implementation of the invention.

FIG. 17 depicts a graphical view of the search process used to obtain $V^*_{DAC}$. For a particular $I_{force}$ applied at input 202, the operating $V_{ADC}$ (labelled $V^*_{ADC}$) corresponds to the intersection of a horizontal line representing $I_{out} \approx I_{force}$ and the load line for $R_2$ labelled point B. The search algorithm adjusts the voltage $V_{DAC}$ such that the load line for internal load $R_1$ 216 intersects point B. The corresponding $V_{DAC}$ is then $V^*_{DAC}$.

$V_{ADC}$ may also be viewed as a search variable. According to equations 5 and 6, we can write:

$$I_{out} = f_2(f_1^{-1}(V_{ADC})) = f_3(V_{ADC}) \quad \text{Equation 25}$$

Figure 18:
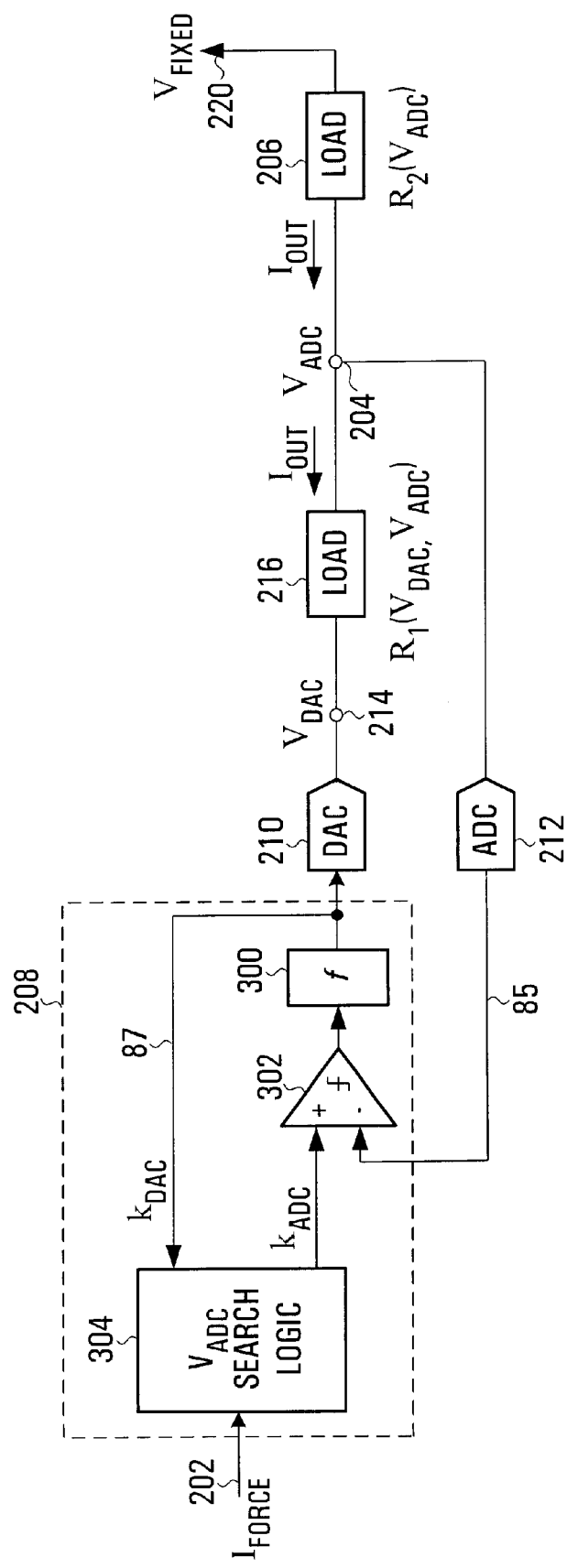
FIG. 18 shows the circuit device of FIG. 2b adapted for forcing a voltage at output $V_{ADC}$ for a desired forcing parameter voltage signal $I_{force}$ in accordance with a non-limiting example of implementation of the invention.

Equation 25 indicates that if voltage $V_{ADC}$ an output 204 can be controlled, $I_{out}$ at output 204 can be set to a desired value by searching for the corresponding $V_{ADC}$. A search of voltage $V_{ADC}$ at output 204 can be implemented using the system shown in FIG. 18. FIG. 18 shows the same system depicted in FIG. 2b but with the search unit 208 designed such that voltage $V_{ADC}$ at output 204 is set via a feedback network. In this non-limiting implementation, the search unit 208 includes a "$V_{ADC}$ Search Logic" circuit 304, a digital comparator module 302 and a digital integrator module 300. The "$V_{ADC}$ Search Logic" circuit 304 implements a search algorithm where voltage $V_{ADC}$ is a search variable. When the $I_{out}$ at output 204 is equal to $I_{force}$ applied at input 202, the desired voltage $V_{ADC}$ value is given by $V^*_{ADC}$ in:

$$I_{force} = f_3(V^*_{ADC}) \quad \text{Equation 26}$$

Figure 19:
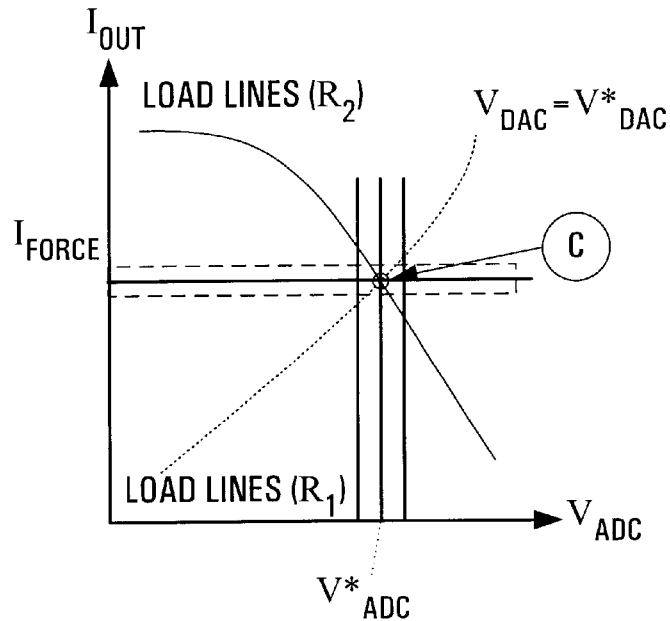
FIG. 19 is a graph showing the location of a desired voltage to apply to output $V_{ADC}$ for a desired forcing parameter current signal $I_{out}=I_{force}$ in accordance with a non-limiting example of implementation of the invention.

FIG. 19 provides a graphical view of the search process used to obtain $V^*_{ADC}$. For a particular current $I_{force}$ applied at input 202, the operating $V_{DAC}$ (labelled $V^*_{DAC}$) corresponds to the intersection of a horizontal line representing $I_{out} \approx I_{force}$ and the load line for $R_2$, labelled point C in the graph of FIG. 19. The search algorithm adjusts $V_{ADC}$ such that the vertical line representing $V_{ADC}$ intersects point C. The corresponding $V_{ADC}$ is then $V^*_{ADC}$.

Convergence Conditions

From equations 24 and 26, it can be seen that when $I_{out}=I_{force}$, the following two conditions will be satisfied:

$$V_{DAC}=V^*_{DAC} \quad \text{Equation 27}$$

$$V_{ADC}=V^*_{ADC} \quad \text{Equation 28}$$

Therefore, a search algorithm can determine if $I_{out}=I_{force}$ by observing either $V_{DAC}$ or $V_{ADC}$. This means that either equation 27 or 28 can be used as a convergence condition of the search.

The Four Search Algorithms

From the above discussions, it has been shown that a force-current search algorithm can be implemented by using either $V_{DAC}$ or $V_{ADC}$ as the search variable. Also, the convergence condition can be determined by observing either $V_{DAC}$ or $V_{ADC}$. Therefore, there are at least four possible variations for the force-current algorithm, as shown in Table 2.

TABLE 2

Four Force-Current Search Algorithms

| Algorithm | Search Variable | Convergence Condition | Algorithm Name |
|---|---|---|---|
| 1 | $V_{DAC}$ | $V_{ADC} = V^*_{ADC}$ | vary-$V_{DAC}$-compare-$V_{ADC}$ |
| 2 | $V_{ADC}$ | $V_{ADC} = V^*_{ADC}$ | vary-$V_{ADC}$-compare-$V_{ADC}$ |
| 3 | $V_{ADC}$ | $V_{DAC} = V^*_{DAC}$ | vary-$V_{ADC}$-compare-$V_{DAC}$ |
| 4 | $V_{DAC}$ | $V_{DAC} = V^*_{DAC}$ | vary-$V_{DAC}$-compare-$V_{DAC}$ |

The descriptions for four force-current algorithms will be presented in the following sections.

Voltage Measurement

For the force-current-measure-voltage operation, the voltage $V_{ADC}$ at output 204 must be measured after the force-current algorithm is applied. From the general architecture of the System in FIG. 2b, it can be seen that the value of the voltage $V_{ADC}$ at output 204 can be readily measured by reading the value $k_{ADC}$ from the ADC 212 at the end of the force-current searching process.

Convergence Criteria

In the search control logic implemented by search unit 208 of a force-current system, the convergence conditions are observed by evaluating a function (or its inverse) that relates the quantities $k_{DAC}$, $k_{ADC}$ and $I_{out}$. That function will be described in this section.

Figure 20:
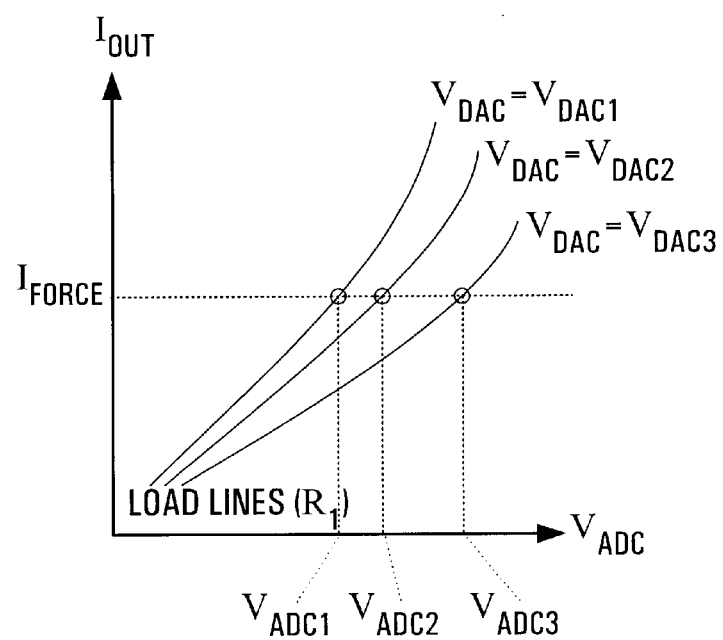
FIG. 20 is a graph showing the DC characteristics of internal load $R_1$ of the circuit device shown in FIG. 2b and showing the location of the voltage measurements for $I_{out}=I_{force}$ in accordance with a non-limiting example of implementation of the invention.

Consider the load lines of internal load $R_1$ 216 in FIG. 20. It can be seen from this figure that voltage $V_{ADC}$ at output 204 is dependent on both the voltage $V_{DAC}$ at the intermediate voltage point 214 and current $I_{out}$ at output 202. Mathematically, this can be expressed as follows:

$$V_{ADC}=H(V_{DAC},I_{out}) \quad \text{Equation 29}$$

If current $I_{out}$ at output 204 is kept constant at a value that approximates $I_{force}$, voltage $V_{ADC}$ at output 204 becomes a one variable function of $V_{DAC}$ as follows:

$$V_{ADC}=H(V_{DAC},I_{force}) \quad \text{Equation 30}$$

Figure 21:
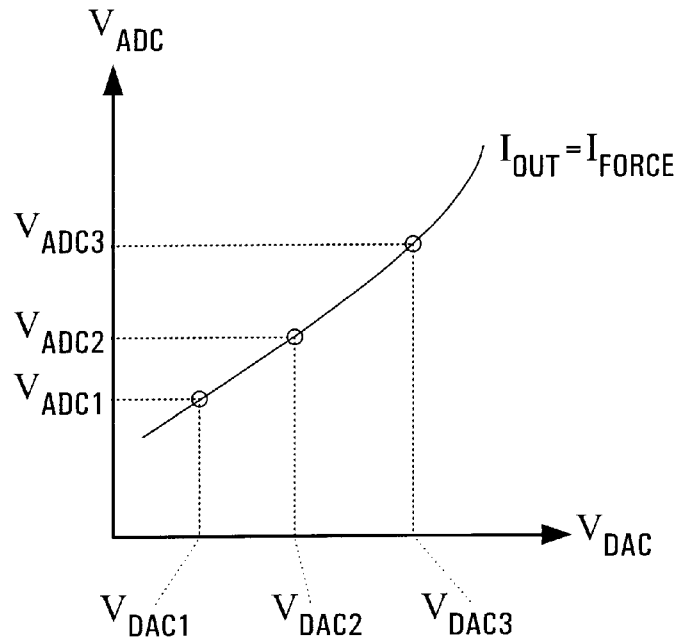
FIG. 21 is a graph illustrating a function "H" mapping a forcing parameter signal $I_{force}$ and the voltage to apply to intermediate voltage point $V_{DAC}$ to a voltage value at the output of the circuit device shown in FIG. 16 in accordance with a non-limiting example of implementation of the invention.

This is illustrated in FIG. 20, where the horizontal line representing $I_{out}=I_{force}$ is shown in the load lines for internal load $R_1$ 216. As can be seen, the intersection points uniquely relates voltage $V_{ADC}$ and voltage $V_{DAC}$ in a manner such as that shown in FIG. 21.

If we denote the LSB voltage of the DAC 210 used in the system 200 by $V_{LSB-DAC}$, then $V_{DAC}$ can be represented by a digital number $k_{DAC}$ defined in equation 15. Similarly, if the LSB voltage of the ADC 212 is defined as $V_{LSB-ADC}$, $V_{ADC}$ can be represented by a digital value $k_{ADC}$ as follows:

$$V_{ADC}=k_{ADC} \times V_{LSB-ADC} \quad \text{Equation 31}$$

Substituting equation 15 and 31 into equation 30, the following relationship is obtained:

$$k_{ADC} \times V_{LSB-ADC}=H(k_{DAC} \times V_{LSB-DAC}, I_{force}) \quad \text{Equation 32}$$

As $V_{LSB-DAC}$ and $V_{LSB-ADC}$ in equation 32 are constant scale factors, equation 32 can be simplified as follows:

$$k_{ADC} = \frac{H(k_{DAC} \times V_{LSB-DAC}, I_{force})}{V_{LSB-ADC}} = \hat{H}(k_{DAC}, I_{force}) \quad \text{Equation 33}$$

On the other hand, it can be seen from equation 30 that if current $I_{out}$ is kept constant at $I_{force}$, voltage $V_{ADC}$ is a one variable function of $V_{DAC}$. From this, the reverse relationship can be expressed as:

$$V_{DAC}=H^{-1}(V_{ADC},I_{out})|_{I_{out}=I_{force}} \quad \text{Equation 34}$$

Figure 22:
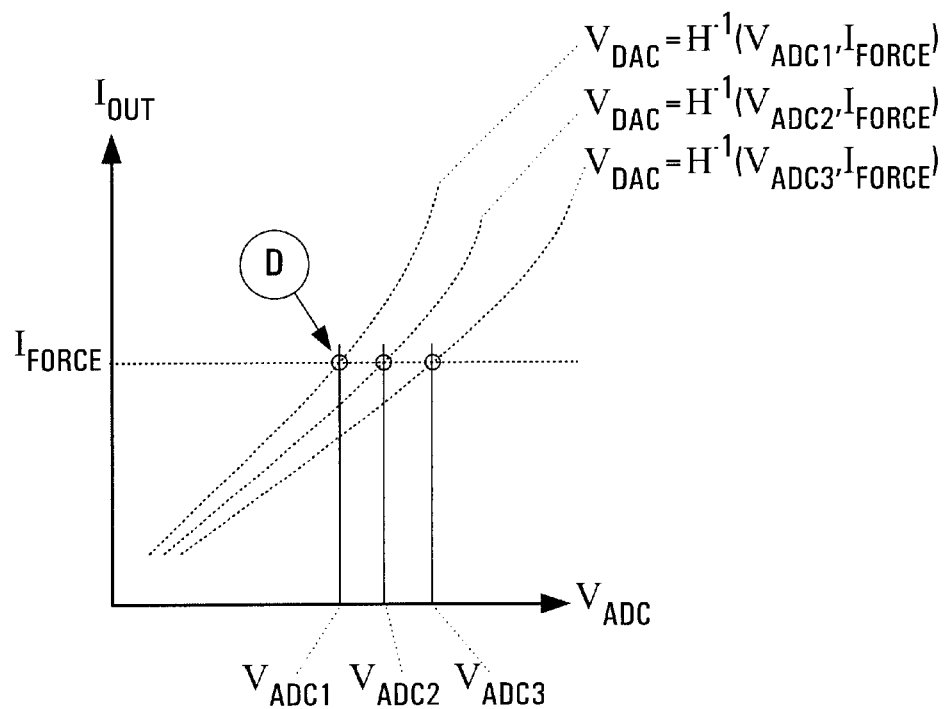
FIG. 22 is a graph illustrating a function "$H^{-1}$" mapping forcing parameter signal $I_{force}$ and to a voltage value at the output of the circuit device shown in FIG. 16 to a voltage to apply to intermediate voltage point $V_{DAC}$ in accordance with a non-limiting example of implementation of the invention.

The relationship in equation 34 is illustrated in FIG. 22, where the horizontal line representing $I_{out}=I_{force}$ is superimposed on top of vertical lines representing different values of $V_{ADC}$. The intersection points are circled in the figure. The intersection point at $V_{ADC}=V_{ADC1}$, labelled point D, will be taken as an example. For $V_{ADC}=V_{ADC1}$, the corresponding value of $V_{DAC}$ according to equation 34 is given by the load line of internal load $R_1$ 216 that intersects with Point D. Therefore the value of $V_{DAC}$ at point D is given by the following:

$$V_{DAC}=H^{-1}(V_{ADC1},I_{out})|_{I_{out}=I_{force}} \quad \text{Equation 35}$$

If $k_{DAC}$ and $k_{ADC}$ in FIG. 18 are defined by equation 15 and 31, equation 34 becomes:

$$k_{DAC} \times V_{LSB-DAC}=H^{-1}(k_{ADC} \times V_{LSB-ADC},I_{out})|_{I_{out}=I_{force}} \quad \text{Equation 36}$$

As $V_{LSB-DAC}$ and $V_{LSB-ADC}$ in equation 36 are constant scale factors, equation 36 can be simplified as follows:

$$k_{DAC} = \frac{H^{-1}(k_{ADC} \times V_{LSB-ADC}, I_{out})|_{I_{out}=I_{force}}}{V_{LSB-DAC}} = \hat{H}^{-1}(k_{ADC}, I_{force})|_{I_{out}=I_{force}} \quad \text{Equation 37}$$

The functions $\hat{H}$ and $\hat{H}^{-1}$ defined in equations 33 and 37 are used in the four force-current search algorithms. A summary of the algorithms is presented in Table 3.

TABLE 3

Force current search algorithms

| Algorithm Name | Comparison Result | Implied Observation | Adjustment in the next iteration |
|---|---|---|---|
| Vary-$V_{DAC}$-Compare-$V_{ADC}$ | $k_{ADC} > \hat{H}(k_{DAC},I_{force})$ | $k_{DAC} < k^*_{DAC}$ | increase $k_{DAC}$, otherwise decrease $k_{DAC}$ |
| Vary-$V_{ADC}$-Compare-$V_{ADC}$ | $k_{ADC} > \hat{H}(k_{DAC},I_{force})$ | $k_{ADC} < k^*_{ADC}$ | increase $k_{ADC}$, otherwise decrease $k_{ADC}$ |

TABLE 3-continued

Force current search algorithms

| Algorithm Name | Comparison Result | Implied Observation | Adjustment in the next iteration |
|---|---|---|---|
| Vary-$V_{ADC}$-Compare-$V_{DAC}$ | $k_{DAC} < \hat{H}^{-1}(k_{ADC}, I_{out})\|_{I_{out}=I_{force}}$ | $k_{ADC} < k^*_{ADC}$ | increase $k_{ADC}$, otherwise decrease $k_{ADC}$ |
| Vary-$V_{DAC}$-Compare-$V_{DAC}$ | $k_{DAC} < \hat{H}^{-1}(k_{ADC}, I_{out})\|_{I_{out}=I_{force}}$ | $k_{DAC} < k^*_{DAC}$ | increase $k_{ADC}$, otherwise decrease $k_{DAC}$ |

Table 4 is an index to the figures corresponding to the Force-Current Search Algorithms described in the specification. It will be appreciated that binary searches can also be performed by replacing the integrators 352 362 372 376 in FIG. 23(a) to (d) with Successive Approximation Registers (SARs) without detracting from the spirit of the invention.

TABLE 4

Force-Current Search Algorithms - Diagrams and Descriptions

Figure 26:
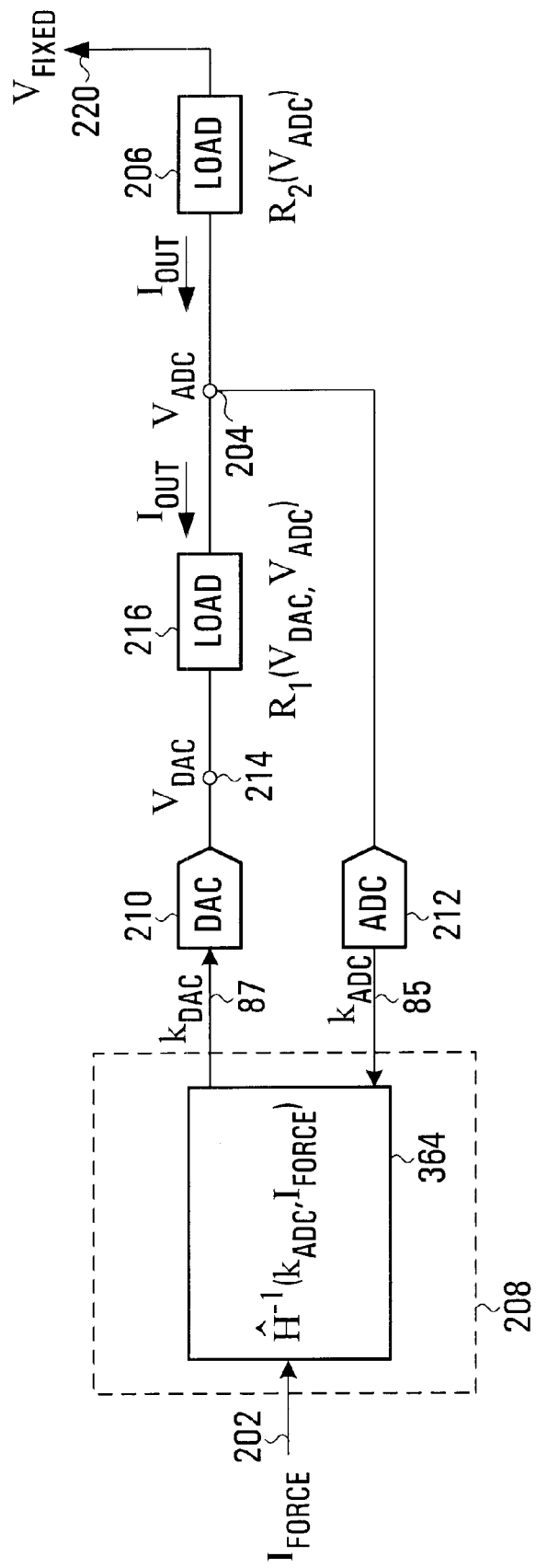
FIG. 26 shows an alternate specific example of implementation of the circuit device of FIG. 2b adapted for searching for a voltage to apply to intermediate voltage point $V_{DAC}$ for a desired forcing parameter voltage signal $I_{force}$ in accordance with a non-limiting example of implementation of the invention.

| Algorithm Name (Algorithm Number) | Circuit Diagram(s) |
|---|---|
| vary-$V_{DAC}$-compare-$V_{ADC}$ (Algorithm 1) | FIG. 23 (a) |
| vary-$V_{ADC}$-compare-$V_{ADC}$ (Algorithm 2) | FIG. 23 (b) |
| vary-$V_{ADC}$-compare-$V_{DAC}$ (Algorithm 3) | FIG. 23 (c) |
| vary-$V_{DAC}$-compare-$V_{DAC}$ (Algorithm 4) | FIG. 23 (d), FIG. 26 (Simplified) |

The Four Search Implementations

In this section, details of the four search algorithms will be described. Note that because of the similarities in the four algorithms, the reader should get the basic idea from any one of the four algorithm descriptions and may not need to read the other descriptions. In addition, the algorithms are described for signals represented in digital format. It will be appreciated that corresponding algorithms for signals represented in the analog domain may be used without detracting from the spirit of the invention. Such corresponding algorithms and will become apparent to a person skilled in the art in light of the present specification and as such will not be described further here.

Vary-$V_{DAC}$-Compare-$V_{ADC}$ (Algorithm 1)

Figure 24:
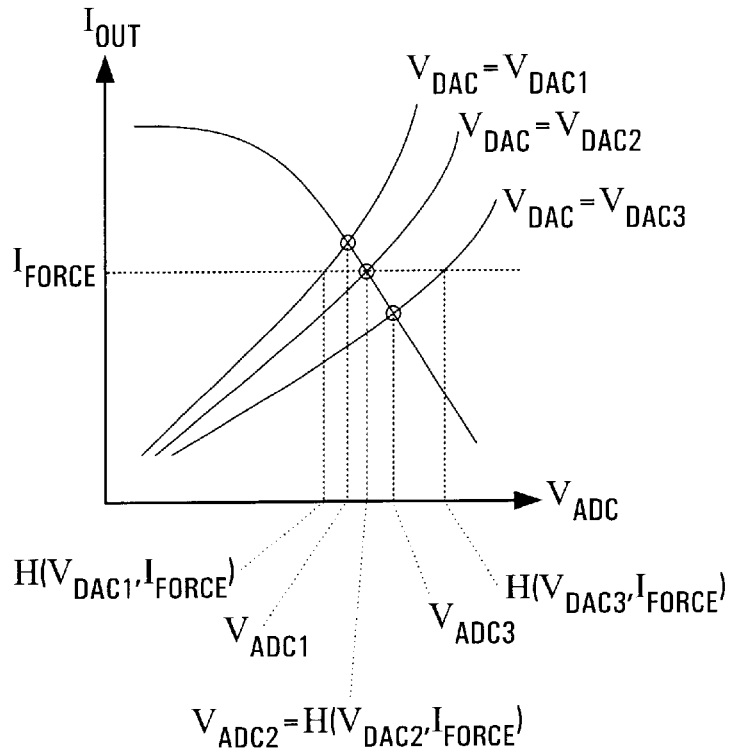
FIGS. 24 and 25 are graphs showing on a same plot the load lines of internal load $R_1$ and the load line of internal load $R_2$ when the loads $R_1$ and $R_2$ are connected in series in accordance with a non-limiting example of implementation of the invention.

The plot in FIG. 6 can be superimposed with that in FIG. 20 to form a load line plot in FIG. 24. It can be seen that out of all the three $V_{DAC}$ voltages, $V_{DAC2}$ will yield $I_{out}=I_{force}$, i.e., $V^*_{DAC}=V_{DAC2}$. Also, at $V_{DAC2}$, the corresponding $V_{ADC}$ voltage ($V_{ADC2}$) follows the following relationship:

$$V_{ADC2}=H(V_{DAC2},I_{force}) \qquad \text{Equation 38}$$

Therefore, it follows that:

$$V_{ADC}=H(V_{DAC},I_{force}) \text{ when } V_{DAC}=V^*_{DAC} \qquad \text{Equation 39}$$

Moreover, it can be seen that for $V_{DAC1}<V_{DAC2}$, the corresponding $V_{ADC1}$ is given by:

$$V_{ADC1}>H(V_{DAC1},I_{force}) \qquad \text{Equation 40}$$

Therefore, $$V_{ADC}>H(V_{DAC},I_{force}) \text{ when } V_{DAC}<V^*_{DAC} \qquad \text{Equation 41}$$

Similarly, by observing $V_{DAC3}$, it can be shown that:

$$V_{ADC}<H(V_{DAC},I_{force}) \text{ when } V_{DAC}>V^*_{DAC} \qquad \text{Equation 42}$$

Figure 23A:
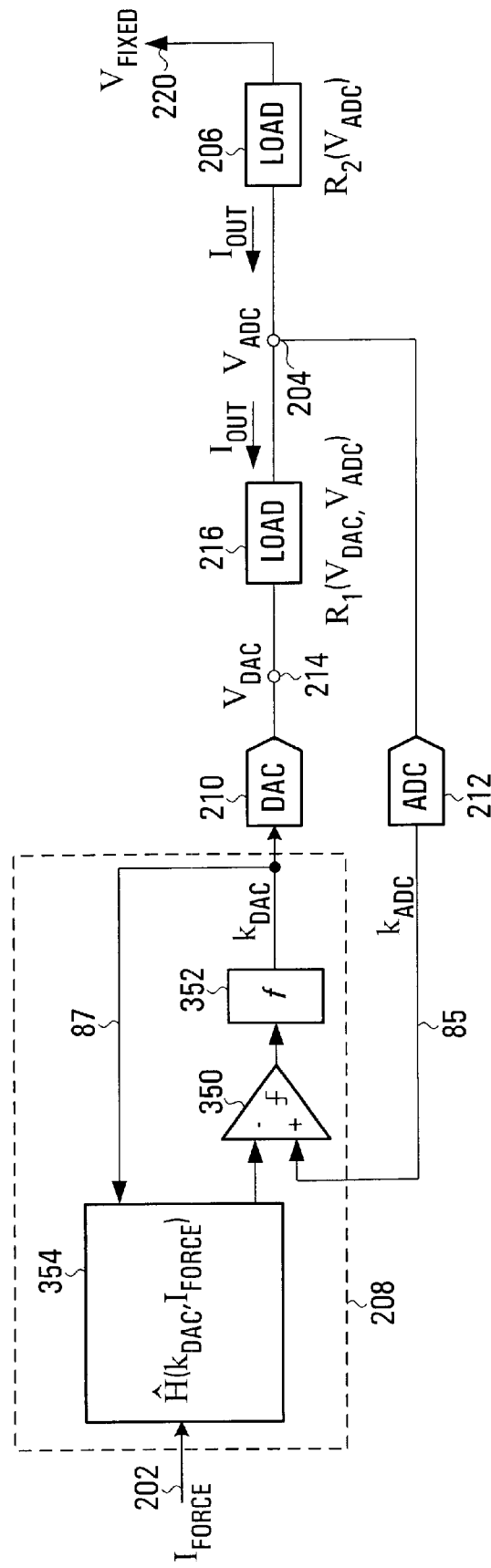
FIGS. 23a), b), c) and d) show four alternate specific examples of implementation of the circuit device of FIG. 2b adapted for searching for a voltage to apply to intermediate voltage point $V_{DAC}$ or $V_{ADC}$ for a desired forcing parameter voltage signal $I_{force}$ in accordance with non-limiting examples of implementation of the invention.

The relationships in equations 39, 41 and 42 provides the search algorithm required to force $I_{out}=I_{force}$. In each iteration, voltage $V_{DAC}$ is set to a value and the corresponding $V_{ADC}$ will be compared with $H(V_{DAC}, I_{force})$. The comparison result can then be used to increment/decrement $V_{DAC}$ in the next iteration. Using the definitions of $k_{DAC}$, $k_{ADC}$ and $\hat{H}$ in equations 15, 31 and 33, the conditions in equations 41 and 42 can be summarised into the force current algorithm in Table 3. The corresponding circuit implementation is shown in FIG. 23(a). As shown, the search unit 208 implemented in accordance with this first algorithm includes a lookup table 354 containing the function $\hat{H}$, a digital comparator 350 and a digital integrator 352.

Vary-$V_{ADC}$-Compare-$V_{ADC}$ (Algorithm 2)

An alternative force-current approach can be derived by interpreting the load line plot in FIG. 24 in another manner. Let voltage $V_{ADC}$ be the search variable and the desired $V_{ADC}$ that yield $I_{out}=I_{force}$ be $V^*_{ADC}$. It can be seen from FIG. 24 that out of all the three $V_{ADC}$ voltages, $V_{ADC2}$ will yield $I_{out}=I_{force}$, i.e., $V^*_{ADC}=V_{ADC2}$. Also, at $V_{ADC2}$ the corresponding $V_{DAC}$ voltage ($V_{DAC2}$) follows the following relationship:

$$V_{ADC2}=H(V_{DAC2},I_{force}) \qquad \text{Equation 43}$$

Therefore, it follows that:

$$V_{ADC}=H(V_{DAC},I_{force}) \text{ when } V_{ADC}=V^*_{ADC} \qquad \text{Equation 44}$$

Moreover, by observing the intersection points at $V_{ADC}=V_{ADC1}$ and $V_{ADC}=V_{ADC3}$, it can be shown that:

$$V_{ADC}>H(V_{DAC},I_{force}) \text{ when } V_{ADC}<V^*_{ADC} \qquad \text{Equation 45}$$

$$V_{ADC}<H(V_{DAC},I_{force}) \text{ when } V_{ADC}>V^*_{ADC} \qquad \text{Equation 46}$$

Figure 23B:
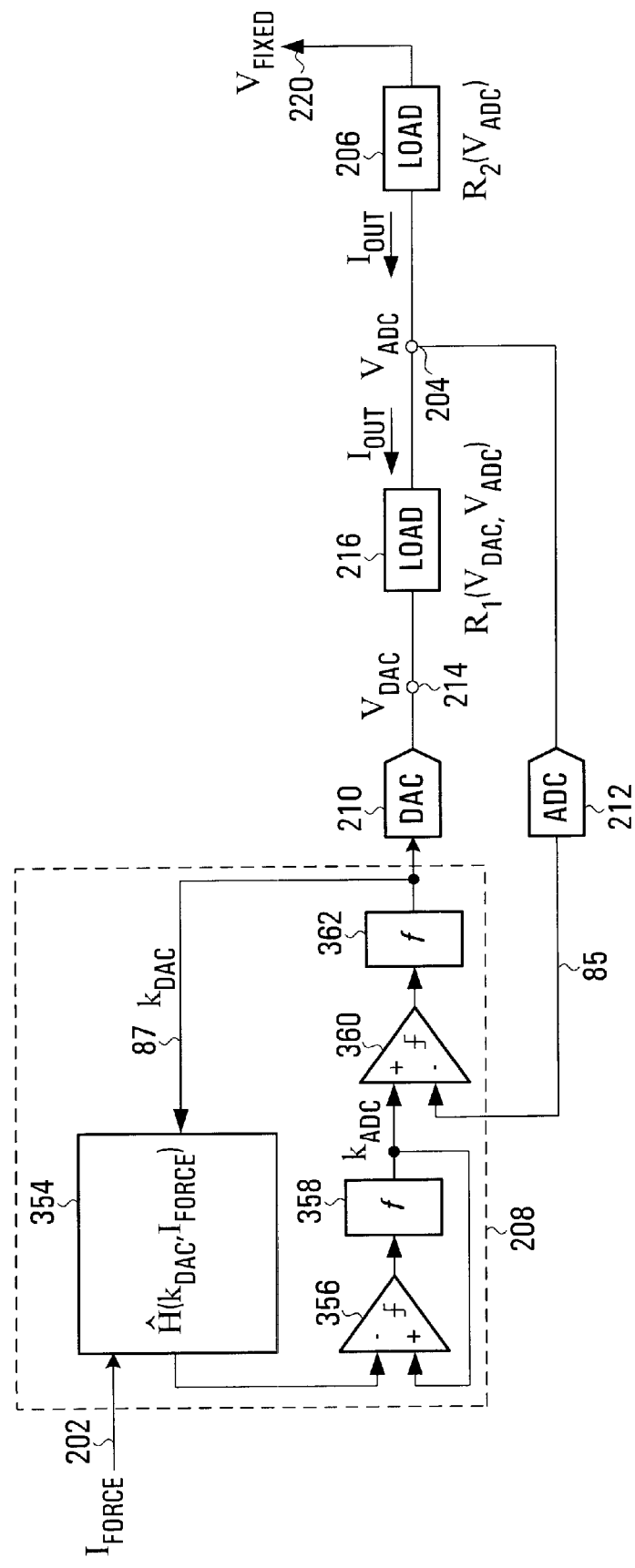

Using the definitions of $k_{DAC}$, $k_{ADC}$ and $\hat{H}$ in equations 15, 31 and 33, the conditions in equations 45 and 46 can be summarised into the force current algorithm in Table 3. The corresponding circuit implementation is shown in FIG. 23(b). As shown, the search unit 208 implemented in accordance with this second algorithm includes a lookup table 354 containing the function $\hat{H}$, a first digital comparator 356, a first digital integrator 358, a second digital comparator 360 and a second digital integrator 362.

Vary-$V_{ADC}$-Compare-$V_{ADC}$ (Algorithm 3)

Figure 25:
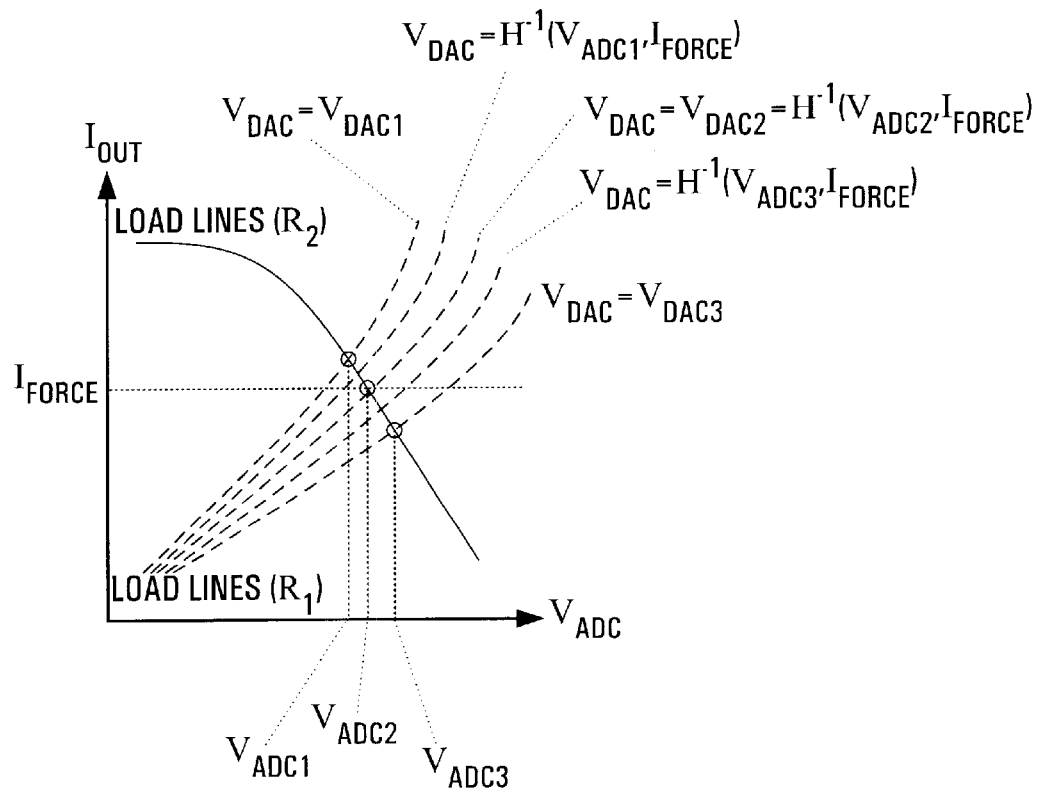

The graph in FIG. 6 can be superimposed with that in FIG. 22 to form a load line plot in FIG. 25. It can be seen that out of all the three $V_{ADC}$ voltages, $V_{ADC2}$ will yield $I_{out}=I_{force}$, i.e., $V^*_{ADC}=V_{ADC2}$. Also, at $V_{ADC2}$ the corresponding $V_{DAC}$ voltage ($V_{DAC2}$) follows the following relationship:

$$V_{DAC2}=H^{-1}(V_{ADC2},I_{force})|_{I_{out}=I_{force}} \qquad \text{Equation 47}$$

Therefore, it follows that:

$$V_{DAC}=H^{-1}(V_{ADC},I_{force})|_{I_{out}=I_{force}} \text{ when } V_{ADC}=V^*_{ADC} \qquad \text{Equation 48}$$

Moreover, it can be seen that for $V_{ADC1}<V_{ADC2}$, the corresponding $V_{DAC1}$ is given by:

$$V_{DAC1}<H^{-1}(V_{ADC1},I_{force})|_{I_{out}=I_{force}} \qquad \text{Equation 49}$$

Therefore, $$V_{DAC}<H^{-1}(V_{ADC},I_{force})|_{I_{out}=I_{force}} \text{ when } V_{ADC}<V^*_{ADC} \qquad \text{Equation 50}$$

Similarly, by observing $V_{ADC3}$, it can be shown that:

$$V_{DAC}>H^{-1}(V_{ADC},I_{force})|_{I_{out}=I_{force}} \text{ when } V_{ADC}>V^*_{ADC} \qquad \text{Equation 51}$$

Figure 23C:
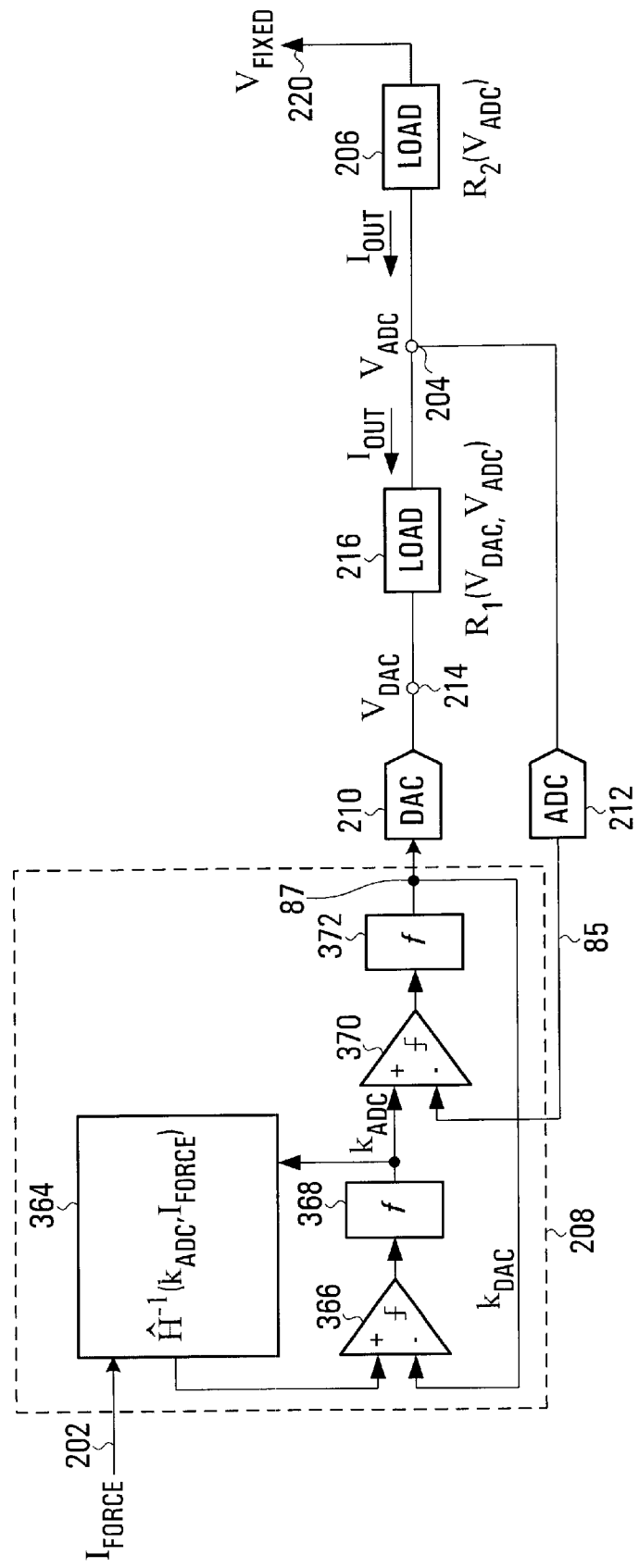
Figure 23D:
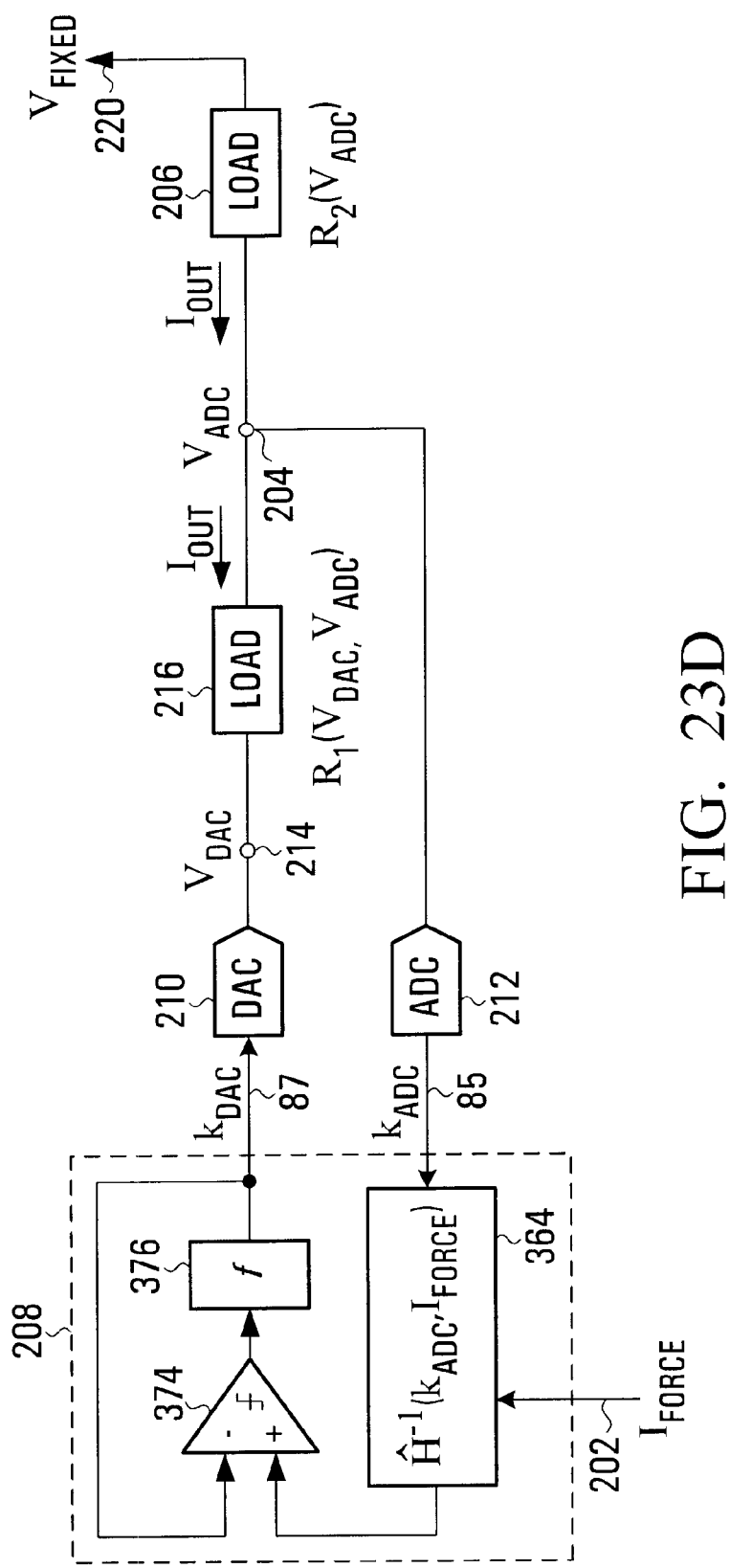

The relationships in equations 48, 50 and 51 provides the search algorithm required to force $I_{out}=I_{force}$. In each iteration, $V_{ADC}$ is set to a value and the corresponding $V_{DAC}$ will be compared with $H^{-1}(V_{ADC}, I_{force})|_{I_{out}=I_{force}}$, the comparison result can then be used to increment/decrement $V_{ADC}$ in the next iteration. Using the definitions of $k_{DAC}$, $k_{ADC}$ and $H^{-1}$ in equations 15, 31 and 37, the conditions in equations 50 and 51 can be summarised into the force current algorithm in Table 3. The corresponding circuit implementation is shown in FIG. 23c. As shown, the search unit 208 implemented in accordance with this third algorithm includes lookup table 364 containing the function $\hat{H}^{-1}$, a first digital comparator 366, a first digital integrator 368, a second digital comparator 370 and a second digital integrator 372.

Vary-$V_{DAC}$-Compare-$V_{DAC}$ (Algorithm 4)

An alternative force-current approach can be derived by interpreting the load line plot in FIG. 25 in another manner. Let $V_{DAC}$ be the search variable and the desired $V_{DAC}$ that yield $I_{out}=I_{force}$ be $V^*_{DAC}$. It can be seen from FIG. 25 that out of all the three $V_{DAC}$ voltages, $V_{DAC2}$ will yield $I_{out}=I_{force}$, i.e., $V^*_{DAC}=V_{DAC2}$. Also, at $V_{DAC2}$, the corresponding $V_{ADC}$ voltage ($V_{ADC2}$) follows the following relationship:

$$V_{DAC2}=H^{-1}(V_{ADC2}, I_{force})|_{I_{out}=I_{force}} \qquad \text{Equation 52}$$

Therefore, it follows that:

$$V_{DAC}=H^{-1}(V_{ADC}, I_{force})|_{I_{out}=I_{force}} \text{ when } V_{DAC}=V^*_{DAC} \qquad \text{Equation 53}$$

Moreover, by observing the intersection points at $V_{DAC}=V_{DAC1}$, and $V_{DAC}=V_{DAC3}$, it can be shown that:

$$V_{DAC}<H^{-1}(V_{ADC}, I_{force})|_{I_{out}=I_{force}} \text{ when } V_{DAC}<V^*_{DAC} \qquad \text{Equation 54}$$

$$V_{DAC}>H^{-1}(V_{ADC}, I_{force})|_{I_{out}=I_{force}} \text{ when } V_{DAC}>V^*_{DAC} \qquad \text{Equation 55}$$

Using the definitions of $k_{DAC}$, $k_{ADC}$ and $\hat{H}^{-1}$ in equations 15, 31 and 37, the conditions in equations 54 and 55 can be summarized into the force current algorithm in Table 3. The algorithm described in Table 3 can be implemented by the circuit shown in FIG. 23(d). As shown, the search unit 208 implemented in accordance with this fourth algorithm includes lookup table 364 containing the function $\hat{H}^{-1}$, a digital comparator 374 and a digital integrator 376. It can be observed that the circuit in FIG. 23(d) including 374, 376 and the feedback line from 376 to 374 is a unity gain buffer. As such, the circuit can be simplified to the implementation shown in FIG. 26.

In the circuit in FIG. 26 the search unit 208 is implemented by a memory module 364, such as a RAM. In a non-limiting implementation, the search unit 208 is implemented by a RAM without any addition digital circuitry for performing the searching functionality.

Calibration Techniques

In the first and second force-current algorithms described above, a lookup table 354 containing the function $\hat{H}$ is used in the circuit implementation as shown in FIGS. 23a) and 23b). Also in the third and fourth force-current algorithms, a lookup table 364 containing the function $\hat{H}^{-1}$ is used in the circuit implementation as shown in FIGS. 23c) and 23d). The calibration procedures for these functions will be described herein below.

Figure 27:
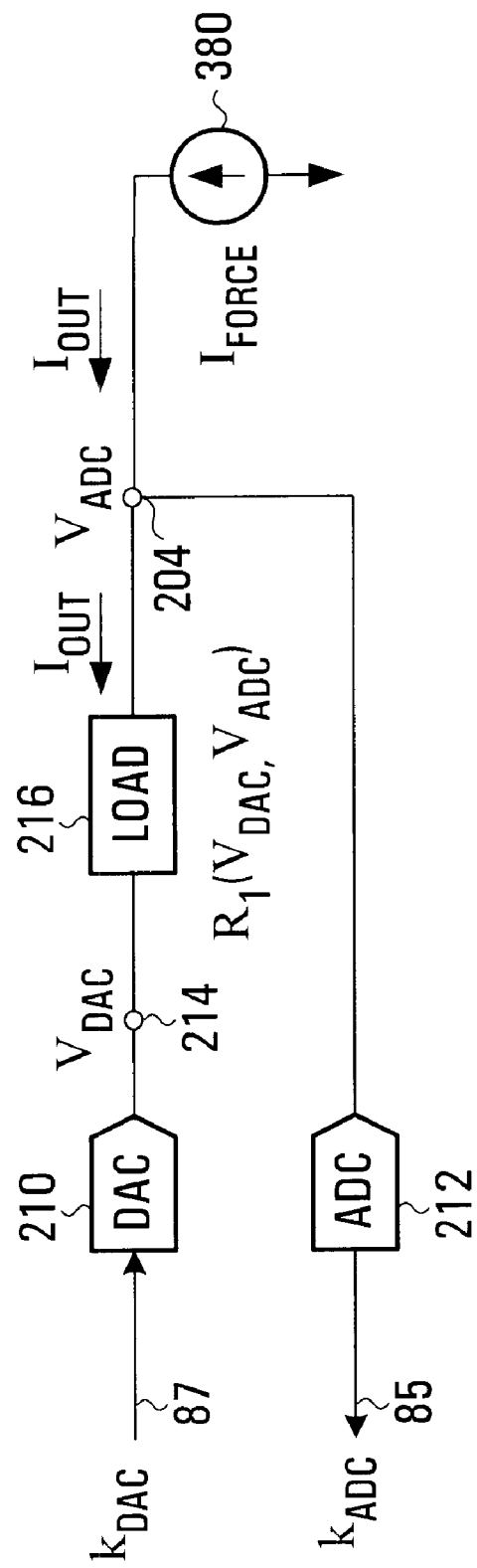
FIGS. 27 and 28 show portions of calibrating circuits for calibrating the circuit device shown in FIG. 23 in accordance with a non-limiting example of implementation of the invention.

The function $\hat{H}$ defined in equation 34 can be found using the circuit shown in FIG. 27. In the circuit, $I_{out}$ at output 204 is held constant at the desired forcing current $I_{force}$ by current source 380. The function $\hat{H}$ is found by sweeping $k_{DAC}$ over the full-scale range of the DAC 210, followed by recording $k_{ADC}$ 85 at each step.

Figure 28:
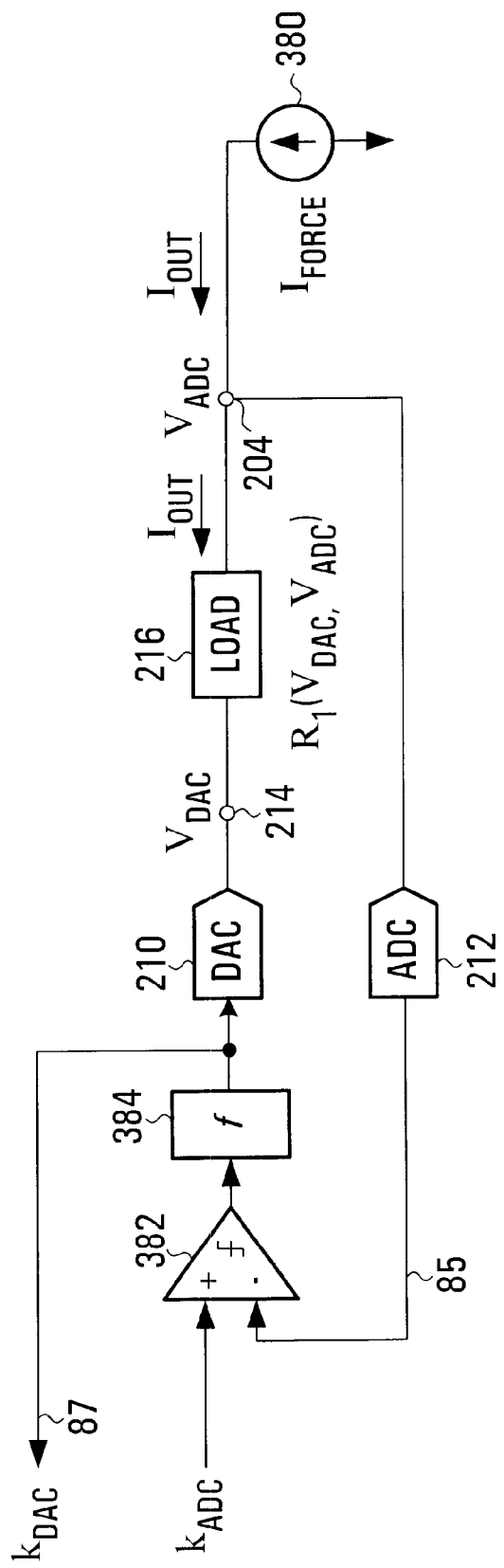

On the other hand, the function $\hat{H}^{-1}$, defined in equation 37, can be found using the circuit shown in FIG. 28. In this circuit, $I_{out}$ at output 204 is held constant at the desired forcing current $I_{force}$ by current source 380. The function $\hat{H}^{-1}$ is found by sweeping $k_{ADC}$ over the full-scale range of the ADC 212, followed by recording $k_{DAC}$ 87 at each step.

Note that, alternatively, the function $\hat{H}$ can be obtained by first finding the functional relationship $\hat{H}^{-1}$ followed by a switch of input and output variables. Similarly, the function $\hat{H}^{-1}$ can be obtained by switching the input and output variable after finding $\hat{H}$.

The lookup table $\hat{H}$ (or $\hat{H}^{-1}$, whichever is employed in the force-current search algorithm) needs to be re-calibrated should a different forcing current $I_{force}$ be needed.

Algorithm Modifications for an Inverting Load

The section below describes the circuit modifications when the internal load $R_1$ 216 used in the system 200 is an inverting load.

Force-Voltage-Measure-Current Algorithms

Figure 29:
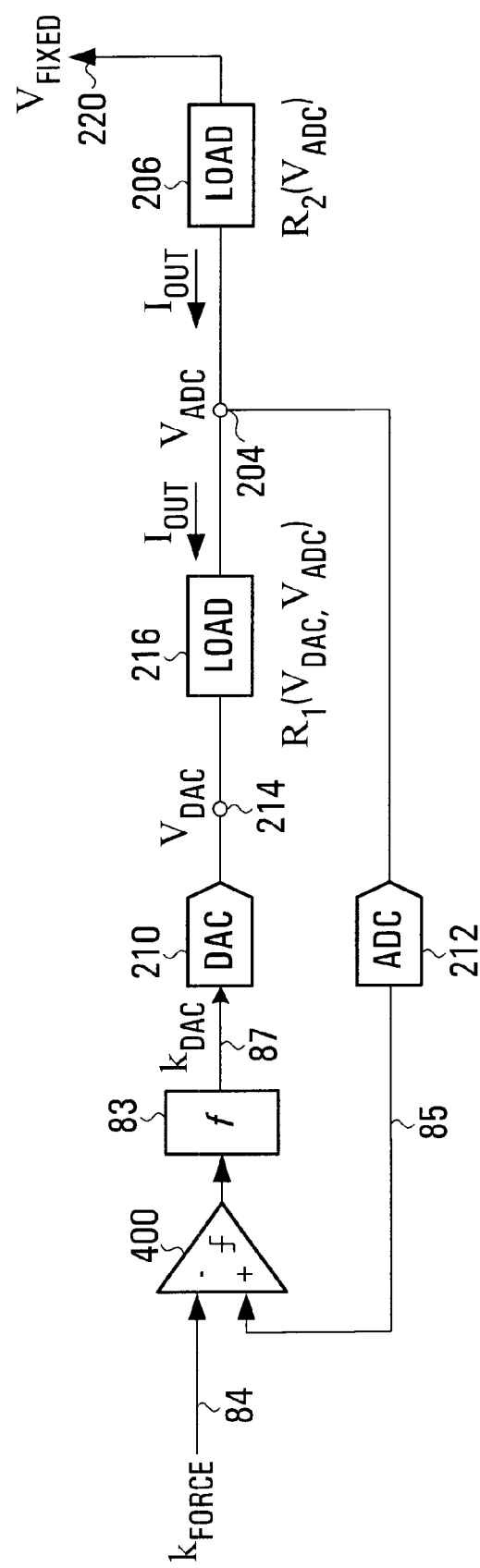
FIG. 29 shows the circuit device of FIG. 2b adapted for searching for a voltage to apply to intermediate voltage point $V_{DAC}$ for a desired forcing parameter voltage signal $V_{force}$ in accordance with a non-limiting example of implementation of the invention where the internal load $R_1$ is an inverting load.

If the internal load $R_1$ 216 of the system 200 follows the inverting property defined in equation 3, the feedback loop in FIG. 8 needs to maintain negative feedback by switching the polarity of the comparator 82. The modified circuit is shown in FIG. 29 where the comparator 82 of FIG. 8 has been replaced by comparator 400 in FIG. 29. Note that the same change also applies to the measurement and calibration circuits in FIGS. 11, 12 and 14.

Figure 30:
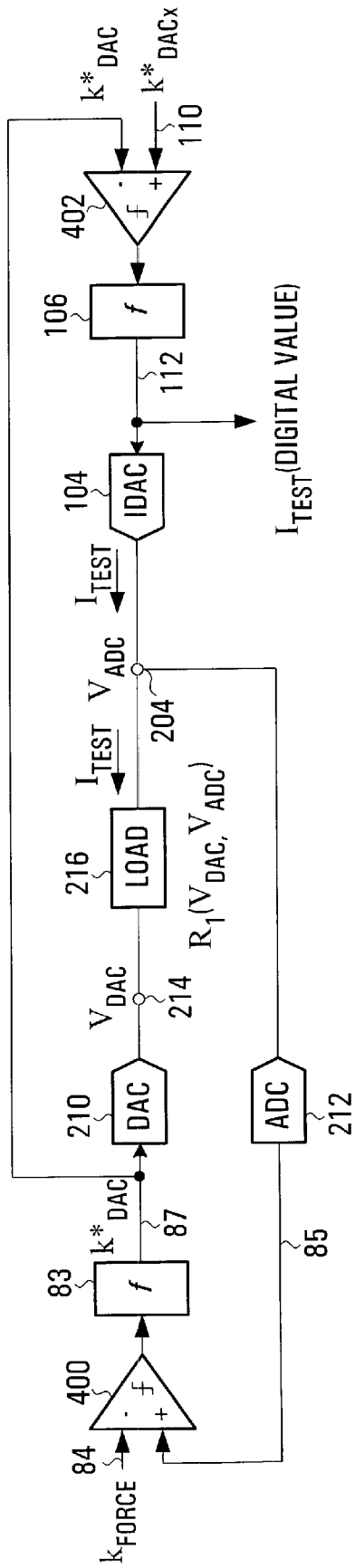
FIG. 30 shows a modified version of the calibration circuit of FIG. 15 adapted for an inverting internal load $R_1$ in accordance with a non-limiting example of implementation of the invention.

The current measurement and the first calibration method described above for a non-inverting internal load $R_1$ 216 do not need to be modified for an inverting $R_1$ because $V^*_{DAC}$ (as well as $k^*_{DAC}$) is still a one-to-one corresponding function of $I_{out}$ for any particular $V_{ADC}=V_{force}$. However, the second calibration method described needs to be modified for an inverting $R_1$. A modified calibration search algorithm is shown in Table 5. The modified calibration search circuit in FIG. 15 is shown in FIG. 30 where the comparators 82 and 108 of FIG. 15 have been replaced by comparators 400 and 402 respectively in FIG. 30.

TABLE 5

Modified Calibration Search Algorithm for an Inverting $R_1$

| Comparison Result | Implied Observation | Adjustment of $I_{test}$ in the next iteration |
|---|---|---|
| $k^*_{DAC} < k^*_{DACx}$ | $I_{test} < I_x$ | increase $I_{test}$, otherwise decrease $I_{test}$ |

Force-Current-Measure-Voltage Algorithms

Figure 31:
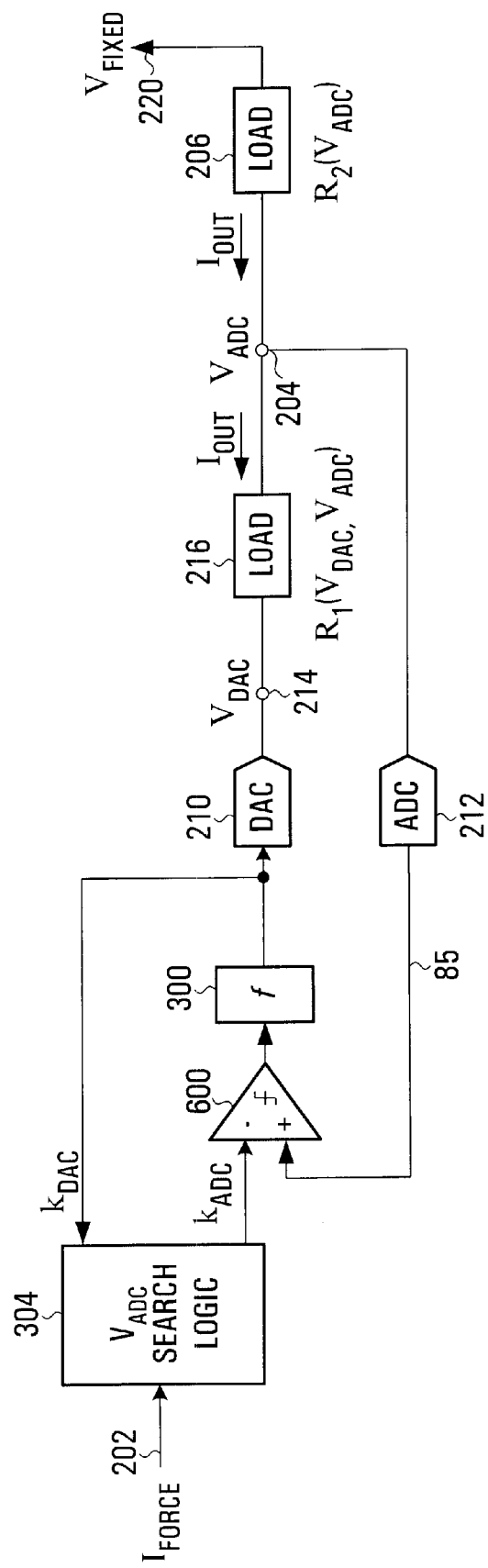
FIG. 31 shows a modified version of the calibration circuit of FIG. 18 adapted for an inverting internal load $R_1$ in accordance with a non-limiting example of implementation of the invention.
Figure 32:
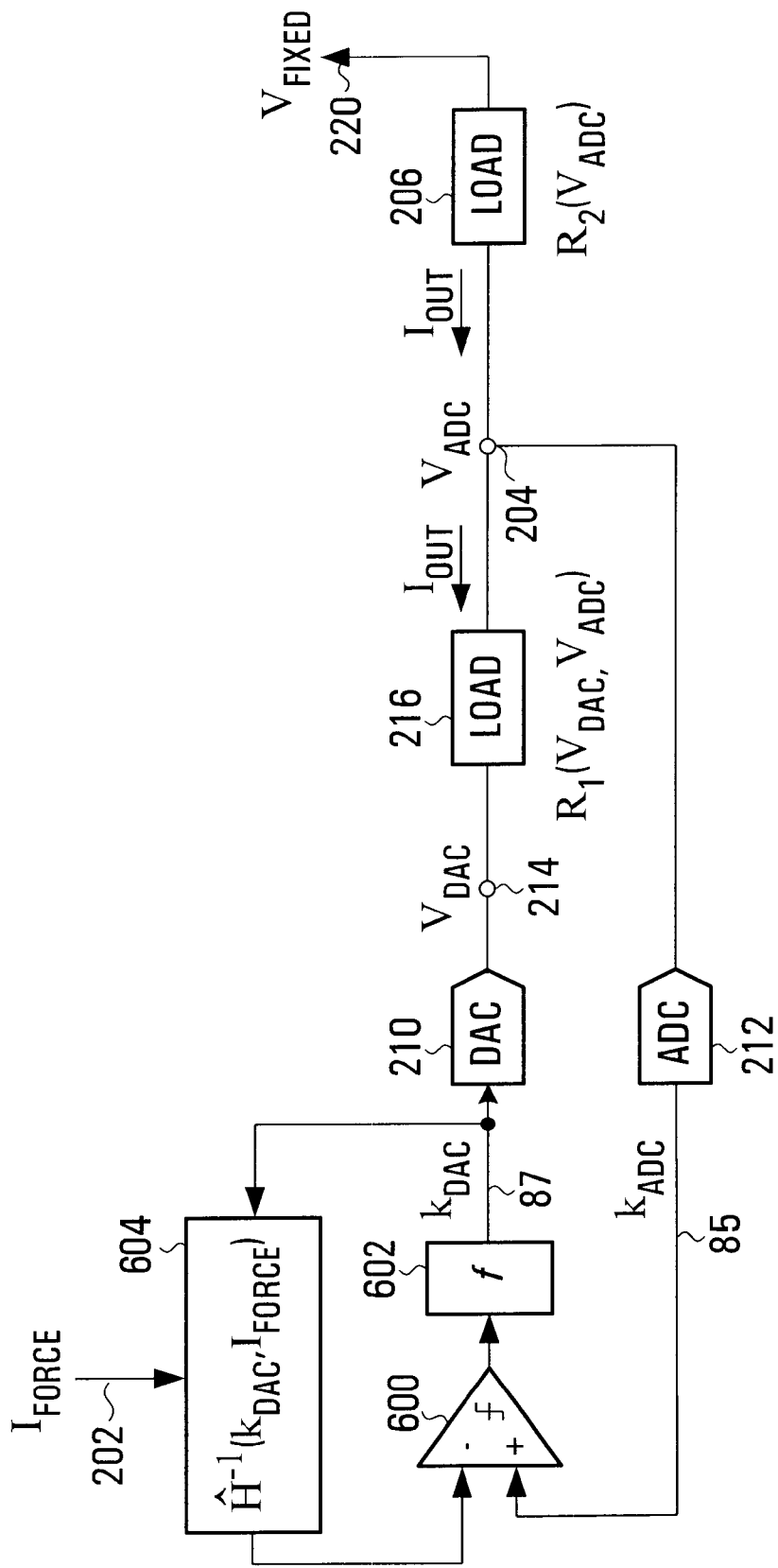
FIG. 32 shows a modified version of the calibration circuit of FIG. 23a) adapted for an inverting internal load $R_1$ in accordance with a non-limiting example of implementation of the invention.

When the internal load $R_1$ 216 of the system 200 follows the inverting property as defined in equation 3, the feedback loop in the general force-$V_{ADC}$ architecture in FIG. 18 needs to maintain negative feedback by switching the polarity of the comparator. The modified circuit is shown in FIG. 31 where the comparator 302 of FIG. 18 has been replaced by comparator 600 in FIG. 31. Similarly the $V_{ADC}$ search logic module 304 in FIG. 18 is replaced by modified $V_{ADC}$ search logic module 604 for certain algorithms (as in FIG. 32).

The modifications for each force-current algorithm is described herein below.

Vary-$V_{DAC}$-Compare-$V_{ADC}$ (Algorithm 1)

When an inverting internal load $R_1$ 216 is used, this search algorithm is modified in order to maintain convergence of the target current value $I_{force}$. The modified search algorithm and its implementation are shown in Table 6 and FIG. 32. As shown, the search unit 208 implemented in accordance with this first algorithm when an inverting internal load $R_1$ 216 is used includes a lookup table 364 containing the function $\hat{H}^{-1}$, a digital comparator 600 and a digital integrator 602.

TABLE 6

Force current algorithm for an inverting $R_1$
(vary-$V_{DAC}$-compare-$V_{ADC}$)

| $k_{ADC}$ Comparison Result | Implied Observation | Adjustment of $k_{DAC}$ in the next iteration |
|---|---|---|
| $k_{ADC} > \hat{H}(k_{DAC}, I_{force})$ | $k_{DAC} > k^*_{DAC}$ | Decrease $k_{DAC}$, otherwise increase $k_{DAC}$ |

Vary-$V_{ADC}$-Compare-$V_{ADC}$ (Algorithm 2)

Figure 33:
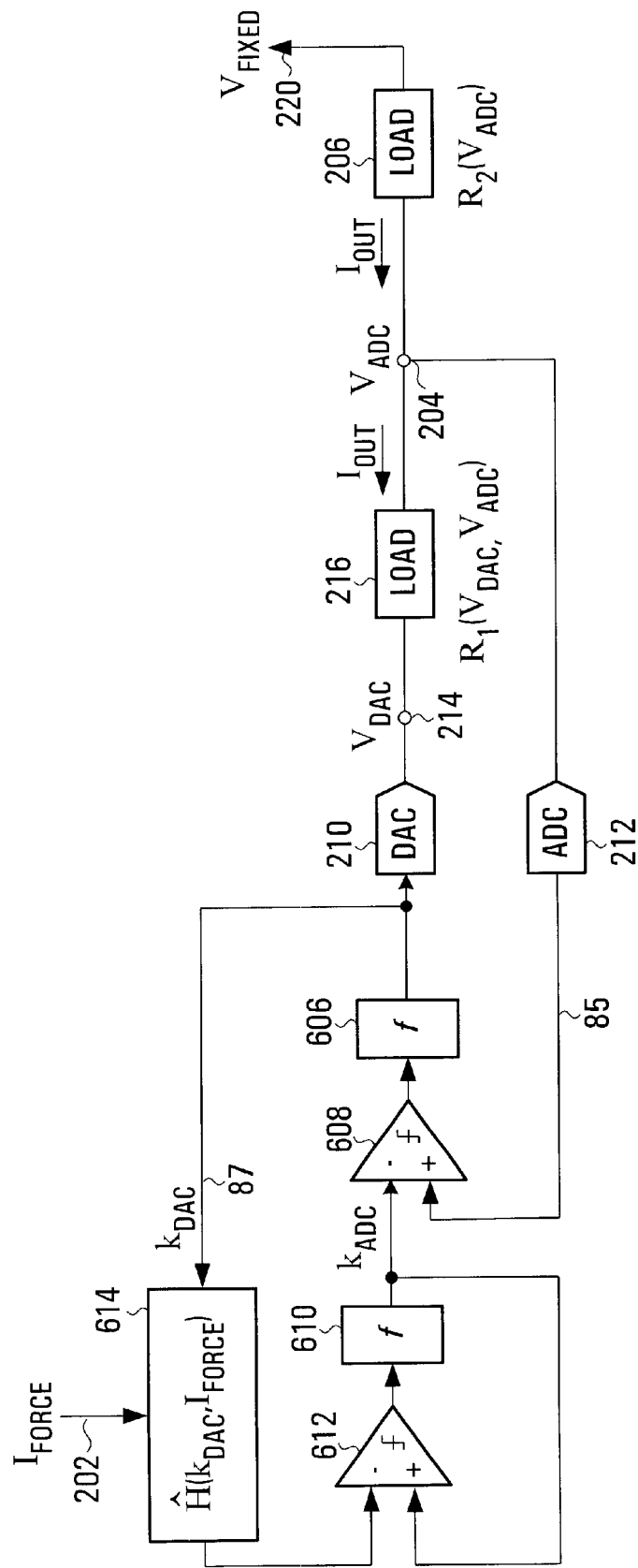
FIG. 33 shows a modified version of the calibration circuit of FIG. 23b) adapted for an inverting internal load $R_1$ in accordance with a non-limiting example of implementation of the invention.

There is no change in this search algorithm when an inverting internal load $R_1$ 216 is used. However, because this algorithm has a force-$V_{ADC}$ circuit implementation, the modification in FIG. 31 is required. The modified circuit is shown in FIG. 33. As shown, the search unit 208 implemented in accordance with this second algorithm includes a lookup table 614 containing the function $\hat{H}$, a first digital comparator 612, a first digital integrator 610, a second digital comparator 608 and a second digital integrator 606.

Vary-$V_{ADC}$-Compare-$V_{DAC}$ (Algorithm 3)

Figure 34:
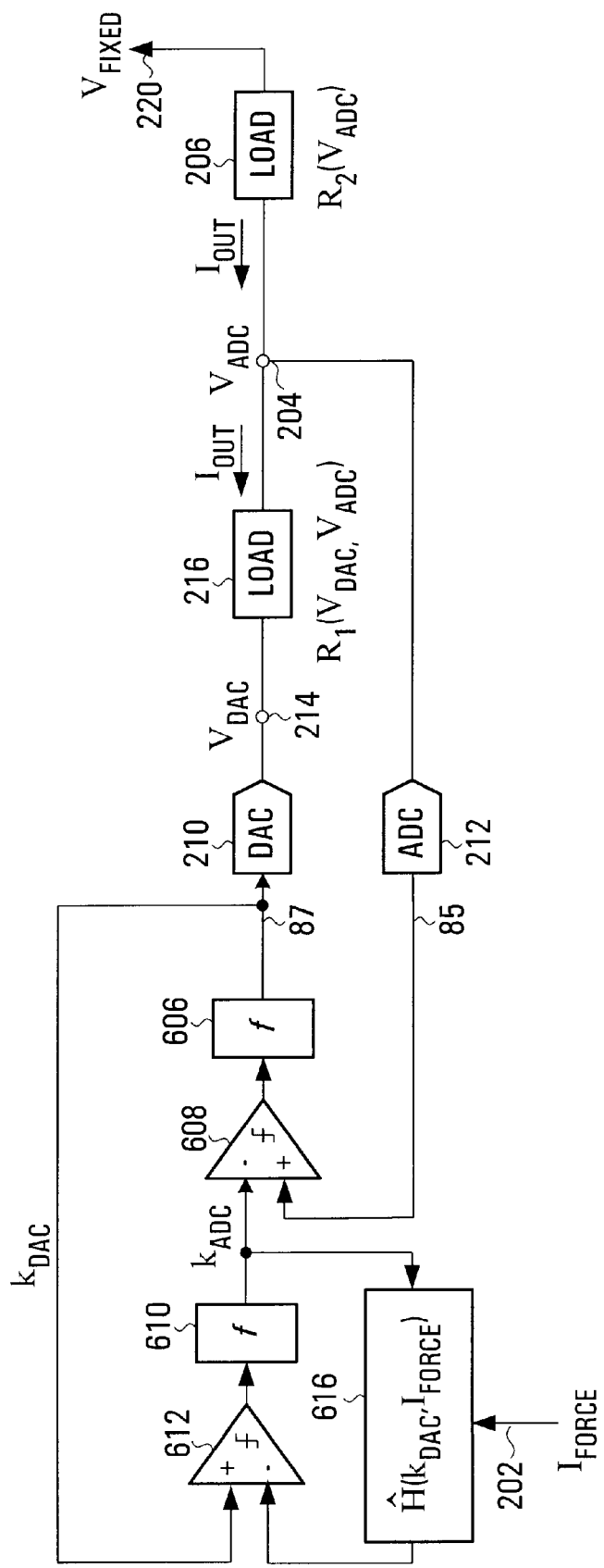
FIG. 34 shows a modified version of the calibration circuit of FIG. 23c) adapted for an inverting internal load $R_1$ in accordance with a non-limiting example of implementation of the invention.

When an inverting internal load $R_1$ 216 is used, this search algorithm has to change in order to maintain convergence of the target current value. The modified search algorithm is shown in Table 7. Also, because this algorithm has a force-$V_{ADC}$ circuit implementation, the modification in FIG. 31 is required. The modified circuit is shown in FIG. 34. As shown, the search unit 208 implemented in accordance with this third algorithm includes a lookup table 616 containing the function $\hat{H}$, a first digital comparator 612, a first digital integrator 610, a second digital comparator 608 and a second digital integrator 606.

TABLE 7

Force current algorithm for an inverting $R_1$
(vary-$V_{ADC}$-compare-$V_{DAC}$)

| $k_{DAC}$ Comparison Result | Implied Observation | Adjustment of $k_{DAC}$ in the next iteration |
|---|---|---|
| $k_{DAC} < \hat{H}^{-1}(k_{ADC}, I_{out})\|_{I_{out}=I_{force}}$ | $k_{ADC} > k^*_{ADC}$ | decrease $k_{ADC}$, otherwise increase $k_{ADC}$ |

Vary-$V_{DAC}$-Compare-$V_{DCA}$ (Algorithm 4)

There is no change in this algorithm or its implementation if an inverting $R_1$ is used.

Special Case: Using an Internal Linear Resistive Load $R_1$ 216

Figure 35:
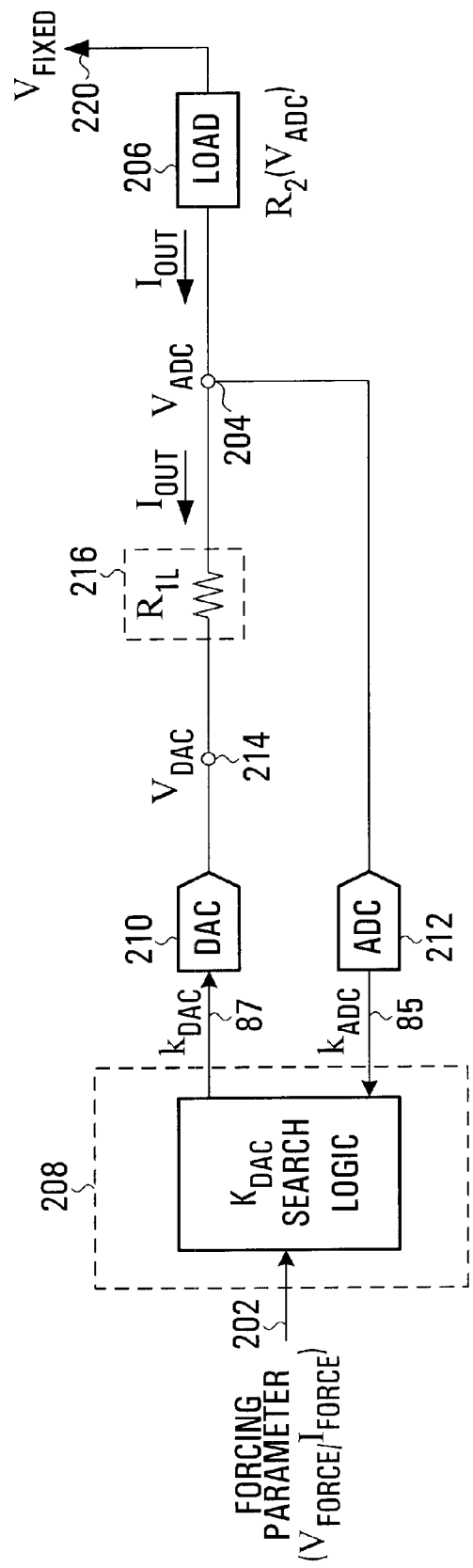
FIG. 35 shows the circuit device of FIG. 2b adapted for forcing voltage $V_{DAC}$ on the basis of a forcing parameter including a linear resistive internal load $R_1$ in accordance with a non-limiting example of implementation of the invention.
Figure 36:
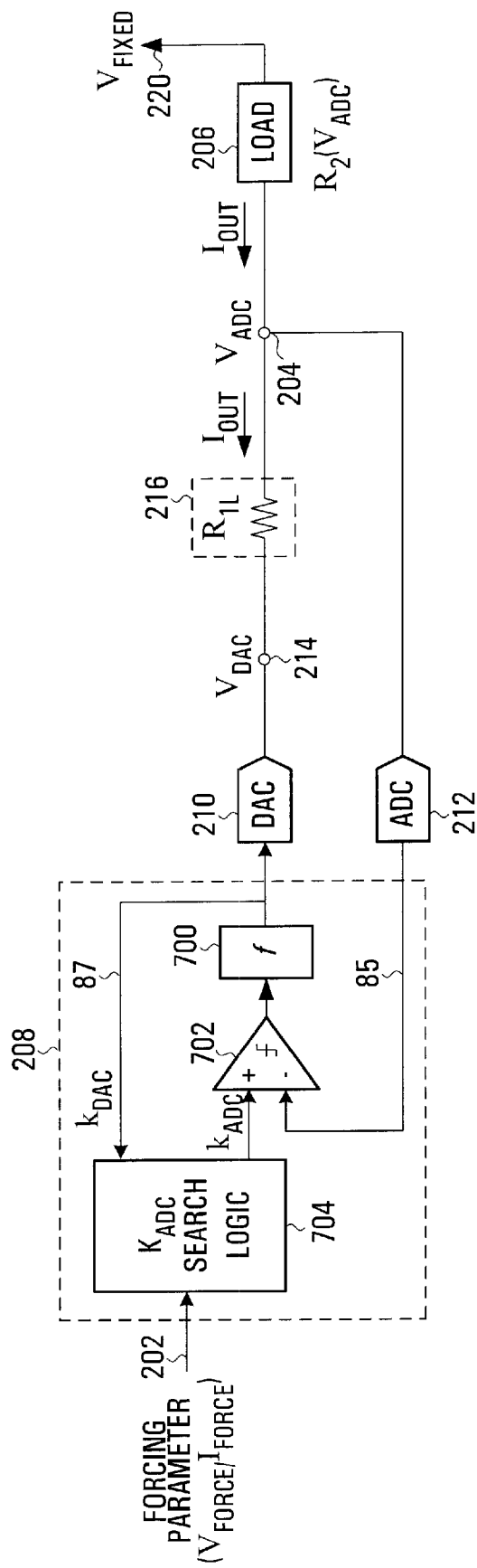
FIG. 36 shows the circuit device of FIG. 2b adapted for forcing voltage $V_{ADC}$ on the basis of a forcing parameter including a linear resistive internal load $R_1$ in accordance with another non-limiting example of implementation of the invention.

This section deals with the special case where the internal load $R_1$ 216 used in the system 200 is a linear resistor. The general architectures of the system that forces $V_{DAC}$ and $V_{ADC}$ are shown in FIG. 35 and FIG. 36. In both figures, the internal load $R_1$ 216 is a linear resistor and is denoted by $R_{1L}$. In FIG. 36, the search unit 208 includes search logic 704, a digital comparator 702 and a digital integrator 700. Upon equilibrium, the current $I_{out}$ at output 204 in both circuits is given by:

$$I_{out} = \frac{k_{ADC} \times V_{LSB-ADC} - k_{DAC} \times V_{LSB-DAC}}{R_{1L}} + I_{offset} \quad \text{Equation 56}$$

where $I_{offset}$ is a current offset term resulted from the offset voltages of the DAC 210 and the ADC 212. A calibration process is required to determine the values of the constants $R_{1L}$ and $I_{offset}$. After these values are found, the lookup tables can be readily constructed for the force-voltage-measure-current or the force-current-measure-current algorithms.

From equation 56, it can be seen that the quantities $I_{out}$, $k_{ADC}$ and $k_{DAC}$ are linearly related. As we will see in the following sections, this linearity property will dramatically deduce the amount calibration time required.

Current Measurement

Figure 37:
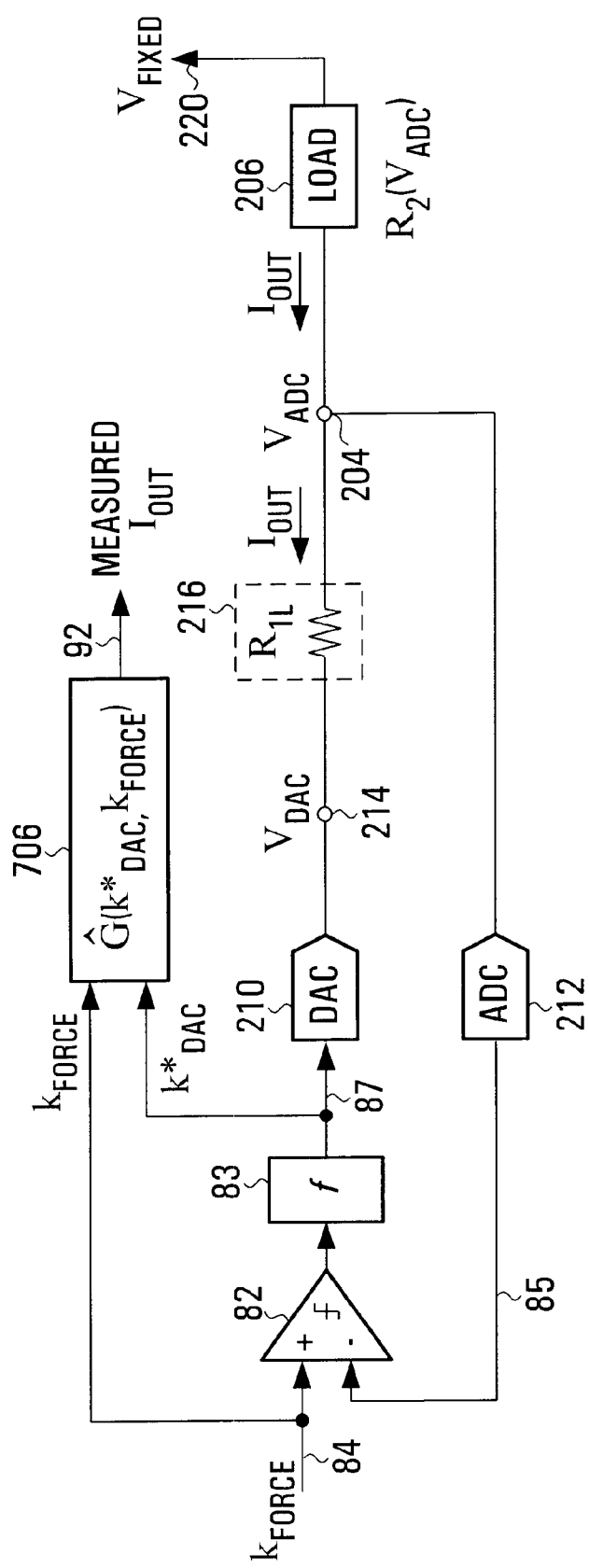
FIG. 37 shows the circuit device of FIG. 11 where internal load $R_1$ is a linear resistive load in accordance with a non-limiting example of implementation of the invention.

Consider the force-voltage-measure-current circuit in FIG. 37. It is the same as the circuit in FIG. 11 except that internal load $R_1$ 216 is a linear resistor denoted by $R_{1L}$. For this circuit, we can write $\hat{G}$ defined in equation 18 as:

$$I_{out} = \hat{G}(k^*_{DAC}, V_{force}) = \quad \text{Equation 57}$$
$$\frac{k_{ADC} \times V_{LSB-ADC} - k^*_{DAC} \times V_{LSB-DAC}}{R_{1L}} + I_{offset}$$

where the values of $R_{1L}$ and $I_{offset}$ can be found using the calibration method described further on in the specification.

The relationship in equation 57 indicates that the lookup table $\hat{G}$ 706 in the current measurement system (shown in FIG. 37) can be generated by two calibration points. Moreover, from equation 57, it can also be seen that the lookup table $\hat{G}$ 706 need not be re-calibrated if a different forcing voltage is required. This is different from the lookup table $\hat{G}$ 90 shown in FIG. 11 for the generalized current measurement system, where the function $\hat{G}$ needs to be re-calibrated whenever a different forcing voltage ($V_{force}$) is needed.

Current Generation

With the relationship in equation 56, we can write $\hat{H}$ defined in equation 33 as follows:

$$\hat{H}(k_{DAC}, I_{force}) = \quad \text{Equation 58}$$
$$k_{ADC} = \frac{(I_{force} - I_{offset})R_{1L}}{V_{LSB-ADC}} + k_{DAC} \times \frac{V_{LSB-DAC}}{V_{LSB-ADC}}$$

Similarly, we can write $\hat{H}^{-1}$ defined in equation 37 as follows:

$$\hat{H}^{-1}(k_{ADC}, I_{force})\big|_{I_{out}=I_{force}} = \quad \text{Equation 59}$$
$$k_{DAC} = -\frac{(I_{force} - I_{offset})R_{1L}}{V_{LSB-DAC}} + k_{ADC} \times \frac{V_{LSB-ADC}}{V_{LSB-DAC}}$$

The relationships in equations 58 and 59 mean that the lookup table $\hat{H}$ and $\hat{H}^{-1}$ in the force-current system described previously for the case of a general internal load $R_1$ 216 can be generated by two calibration points when internal load $R_1$ 216 is a linear resistor. Moreover, from equations 58 and 59, it can also be seen that the lookup tables need not be re-calibrated if a different forcing current is required. This is different from the lookup tables for the generalised current forcing system in Section 2.4, where the functions $\hat{H}$ and $\hat{H}^{-1}$ need to be re-calibrated whenever a different forcing current ($I_{force}$) is needed.

Calibration Circuits

Figure 38:
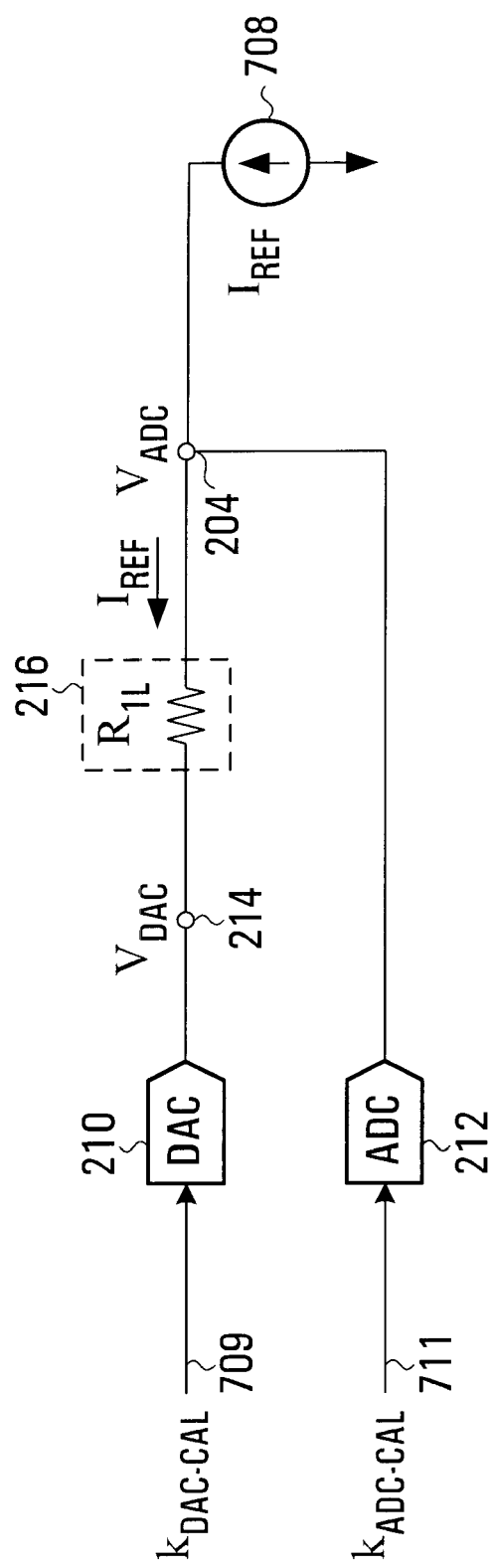
FIGS. 38 and 39 show calibration circuits for a a linear resistive internal load $R_1$ suitable for use in calibrating the circuit devices of FIGS. 36 and 37 in accordance with non-limiting examples of implementation of the invention.

The force-voltage circuit in FIG. 38 is analogous to the front end of the system in FIG. 35. In FIG. 38, a reference current source 708 with value $I_{ref}$ is connected to the resistor 216 at output 204. The voltage $V_{DAC}$ at output 204 is forced by the digital value $k_{DAC-cal}$ 709. When the circuit in FIG. 38 is in equilibrium, the value of voltage $V_{ADC}$ at output 204 is represented by $k_{ADC-cal}$ 711. The reference current source $I_{ref}$ 708 can be expressed as:

$$I_{ref} = \frac{k_{ADC-cal} \times V_{LSB-ADC} - k_{DAC-cal} \times V_{LSB-DAC}}{R_{1L}} + I_{offset} \qquad \text{Equation 60}$$

Figure 39:
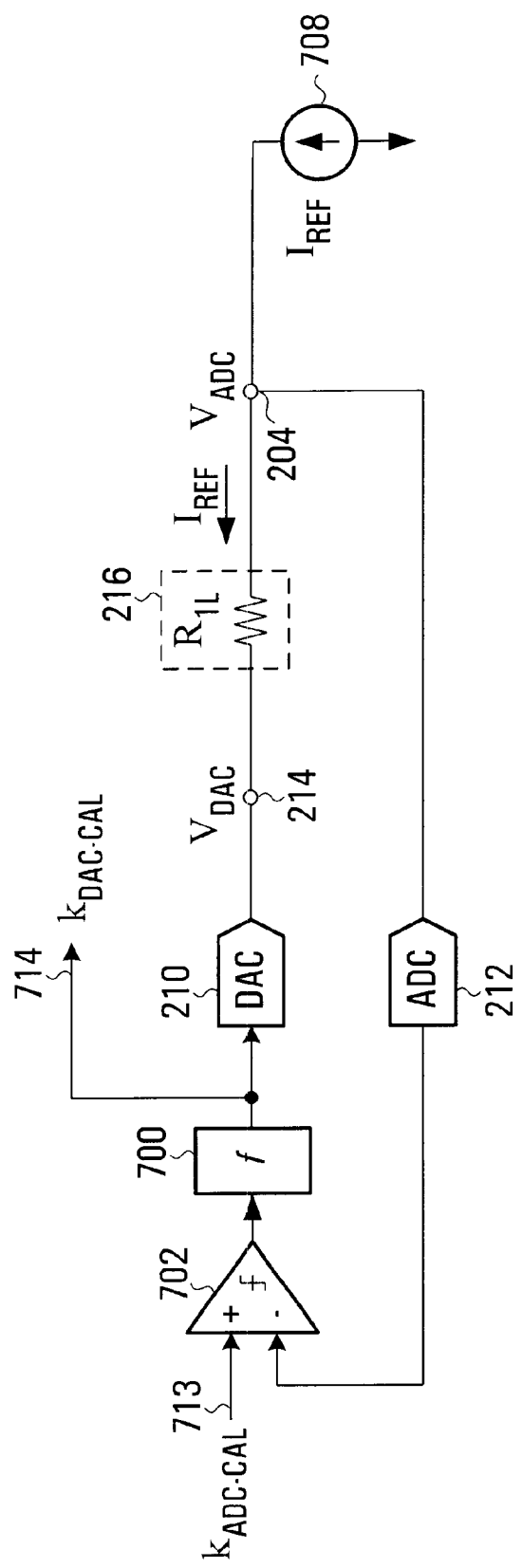

Another force-voltage circuit is shown in FIG. 39. This circuit is similar to the force-$V_{ADC}$ architecture shown in FIG. 36. The voltage $V_{ADC}$ at output 204 is set by the digital value $k_{ADC-cal}$ 713. When the circuit is shown in FIG. 39 is in equilibrium, the value of voltage $V_{DAC}$ at intermediate voltage point 214 is represented by $k_{DAC-cal}$ 714. The expression in equation 60 can also be used to describe current $I_{ref}$ 708.

A purpose of the calibration process is to determine the values of the constants $R_{1L}$ and $I_{offset}$. To find these two constants, two calibration points are used. Note that either one of the circuits in FIG. 38 and FIG. 39 can be used as the calibration circuit as they both follow equation 60.

For the circuit in FIG. 38, a value of $K_{DAC-cal}$ 709 and a reference current $I_{ref}$ 708 is set at each calibration point. Then the resultant $k_{ADC}$ value, $k_{ADC-cal}$ 711, is recorded. For the circuit in FIG. 39, a value of $k_{ADC-cal}$ 713 and a reference current $I_{ref}$ 708 is set at each calibration point. Then the resultant $k_{DAC}$ value, $K_{DAC-cal}$ 714, is recorded.

The values of $k_{ADC-cal}$ for the two calibration points will be designated as $k_{ADC-cal1}$ and $k_{ADC-cal2}$. Similarly, the calibration values for $k_{DAC-cal}$ and $I_{ref}$ can be written as $k_{DAC-cal1}$, $k_{DAC-cal2}$, $I_{ref1}$ and $I_{ref2}$. Using equation 60, two equations can be generated after two calibration points:

$$I_{ref1} = \frac{k_{ADC-cal1} \times V_{LSB-ADC} - k_{DAC-cal1} \times V_{LSB-DAC}}{R_{1L}} + I_{offset} \qquad \text{Equation 61}$$

$$I_{ref2} = \frac{k_{ADC-cal2} \times V_{LSB-ADC} - k_{DAC-cal2} \times V_{LSB-DAC}}{R_{1L}} + I_{offset} \qquad \text{Equation 62}$$

Equations 61 and 62 can be solved to yield the values of $R_{1L}$ and $I_{offset}$ as follows:

$$R_{1L} = \frac{(k_{ADC-cal2} - k_{ADC-cal1}) \times V_{LSB-ADC} + (k_{DAC-cal1} - k_{DAC-cal2}) \times V_{LSB-DAC}}{I_{ref2} - I_{ref1}} \qquad \text{Equation 63}$$

$$I_{offset} = \frac{(I_{ref1} \times k_{ADC-cal2} - I_{ref2} \times k_{ADC-cal1}) \times V_{LSB-ADC} + (I_{ref2} \times k_{DAC-cal1} - I_{ref1} \times k_{DAC-cal2}) \times V_{LSB-DAC}}{(k_{ADC-cal2} - k_{ADC-cal1}) \times V_{LSB-ADC} + (k_{DAC-cal1} - k_{DAC-cal2}) \times V_{LSB-DAC}} \qquad \text{Equation 64}$$

Special Case: Simplified Calibration and Measurement

Equations 57, 58 and 59 can be used to generate a lookup table with the generic calibration procedure described previously in the specification. The section below shows how to simplify equations 63 and 64 to reduce the computational complexity of generating a lookup table for a linear resistive load.

Equations 57, 58 and 59 can be simplified if constraints are imposed on the design of the system and on the calibration procedures. This section describes an example of such a set of constraints that enables effective implementation of the system with a linear element. It will be readily appreciated that other methods for simplifying the computations may also be used without detracting from the spirit of the invention.

To avoid unnecessary arithmetic due to LSB conversions, the system 200 can be designed such that:

$$V_{LSB-ADC} = V_{LSB-DAC} \qquad \text{Equation 65}$$

In other words, the LSB voltage of ADC 212 and DAC 210 are the same. In the calibration procedure, the force-$V_{ADC}$ circuit in FIG. 39 is used. The two calibration points are given in Table 8.

TABLE 8

| Calibration Point | Calibration Points | | |
|---|---|---|---|
| | Setting of $k_{ADC-cal}$ | Setting of $I_{ref}$ | Recorded $k_{DAC-cal}$ |
| 1 | $k_{ADC-cal1} = k_{force-ref}$ | $I_{ref1} = I_{force-ref}$ | $k_{DAC-cal1}$ |
| 2 | $k_{ADC-cal2} = k_{force-ref}$ | $I_{ref2} = 0$ | $k_{DAC-cal2}$ |

The zero reference current $I_{ref2}$ can be easily set by merely disconnecting the output 204. Hence, only one calibration point $I_{force-ref}$ requires an external reference. The calibration process is summarised in Table 9 with reference to FIG. 39.

TABLE 9

Calibration of the System with Linear $R_1$ 216

| Step | Operation |
|---|---|
| 1 | Connect output 204 to the external current reference $I_{ref}$ 708 |
| 2 | Set the external reference to make $I_{out} = I_{ref1} = I_{force-ref}$ |
| 3 | Force $k_{ADC} = k_{force-ref}$ 713 and record $k_{DAC-cal1}$ 714 |
| 4 | Disconnect output 204 from the external current reference $I_{ref}$ 708 to make $I_{out} = I_{ref2} = 0$ |
| 5 | Force $k_{ADC} = k_{force-ref}$ 713 and record $k_{DAC-cal2}$ 714 |

With the system requirement in equation 65 and the calibration points in Table 8, equations 57, 58 and 59 can be simplified as follows:

$$I_{out} = \hat{G}(k_{DAC}^*, V_{force}) = \left[ \frac{k_{DAC}^* - k_{DAC-cal2} + k_{force-ref} - k_{force}}{k_{DAC-cal1} - k_{DAC-cal2}} \right] I_{force-ref} \qquad \text{Equation 66}$$

$$k_{ADC} = \hat{H}(k_{DAC}, I_{force}) = k_{DAC} + L(I_{force}) \qquad \text{Equation 67}$$

$$k_{DAC} = \hat{H}^{-1}(k_{ADC}, I_{force})\big|_{I_{out}=I_{force}} = k_{ADC} - L(I_{force}) \qquad \text{Equation 68}$$

where:

$$L(I_{force}) = (k_{DAC-cal2} - k_{DAC-cal1}) \frac{I_{force}}{I_{force-ref}} + (k_{force-ref} - k_{DAC-cal2}) \qquad \text{Equation 69}$$

These formulas can be reasonably easily implemented by a digital circuit. The force-voltage-measure-current process using the calibrated values is summarised in Table 10 with reference to FIG. 37.

TABLE 10

Force-Voltage Current Measurement Procedure

| Step | Operation |
|---|---|
| 1 | Connect output 204 to the external load $R_2$ 206 |
| 2 | Set $k_{force}$ at node 84 according to the required forcing voltage |
| 3 | Record $k^*_{DAC}$ at node 87 |
| 4 | Deduce the value of $I_{out}$ 92 using equation 66 |

The calibrated system can also be used to force any arbitrary current $I_{out}$ at output 204 to the external load $R_2$ 206 and measure the voltage $V_{ADC}$ at output 204. Any force-current algorithm in FIGS. 23 or 26 can be used. This process is summarised in Table 11.

TABLE 11

Force-Current Voltage Measurement Procedure

| Step | Operation |
|---|---|
| 1 | Connect the output 204 to the external load $R_2$ 206 |
| 2 | Run the force-current algorithm with $\hat{H}$ or $\hat{H}^{-1}$ given by equations 67 and 68. The value $I_{force}$ is set to the desired current value. |
| 3 | Record $k_{ADC}$ |

Circuit Implementations

The following part of this specification describes specific examples of implementations of the general system 200 shown in FIGS. 2a and 2b. Circuit implementations of the force-voltage-measure-current and the force-current-measure-voltage algorithms will be described.

General Architectures of the Force-Voltage/Force-Current Algorithms

In a non-limiting implementation, the system 200 shown in FIG. 2b may be implemented using digital logic components and a front-end circuit. The details of the front-end circuit are provided herein below.

Force-Voltage-Measure-Current Algorithm

Figure 40:
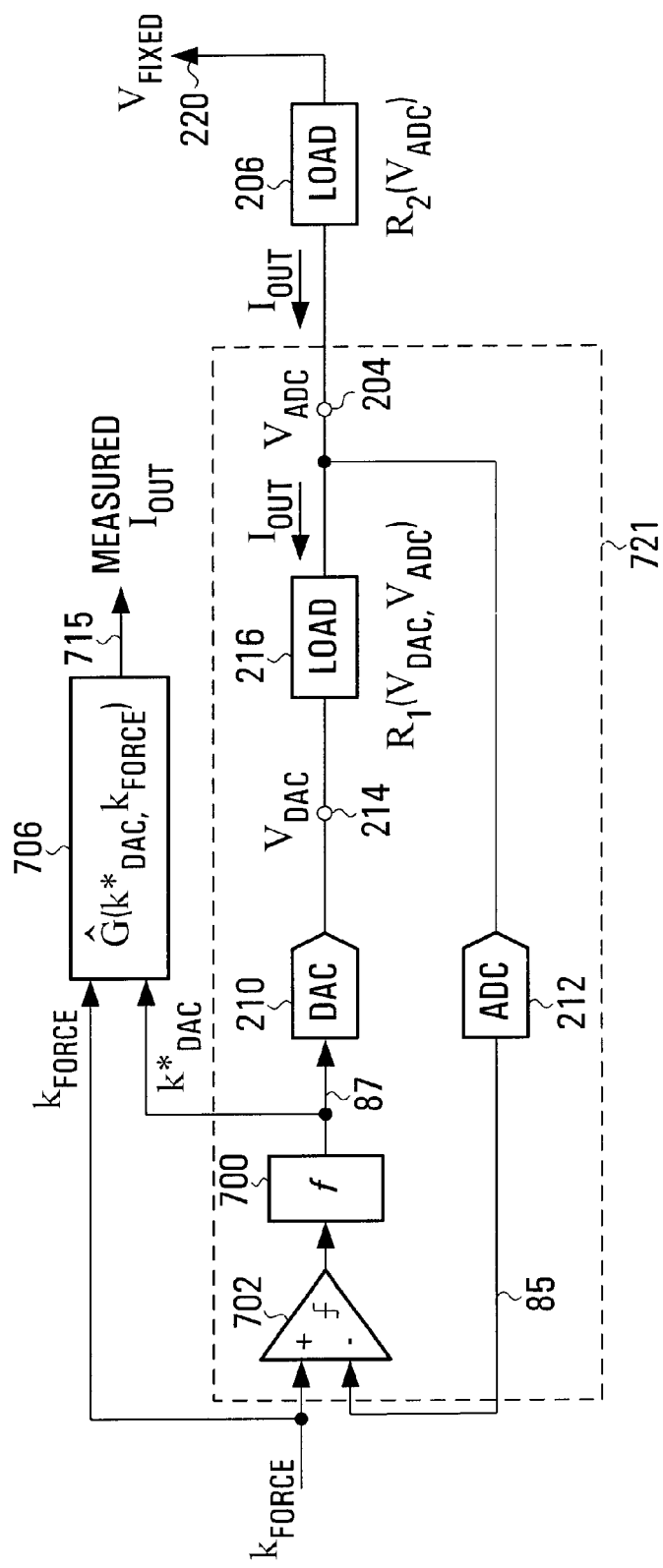
FIGS. 40–62 show various embodiments of the circuit device of FIG. 2b in accordance with non-limiting examples of implementation of the invention.

The general structure of the system for implemented a force-voltage-measure-current circuit is shown in FIG. 40. As depicted, the system includes a lookup table 706 containing $\hat{G}$ and a front-end circuit, referred to as "$V_{ADC}$-Forcing circuit" 721 in FIG. 40. In this non-limiting implementation, lookup table 706 is implemented by a RAM. Lookup table 706 releases a current measurement at output 715. It will be appreciated that other suitable memory devices may be used without detracting from the spirit of the invention. The $V_{ADC}$-Forcing circuit 721 is shown in isolation in FIG. 41. Details of the $V_{ADC}$-Forcing circuit 721 will be described further on in the specification.

Force-Current-Measure-Voltage Algorithm

Figure 42:
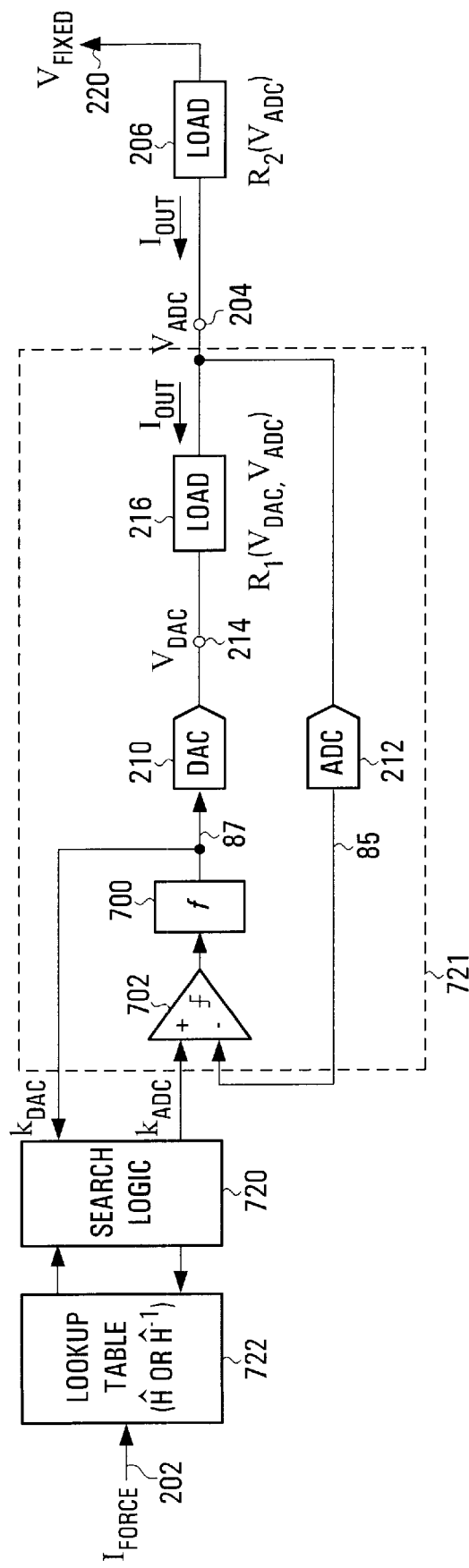
Figure 43:
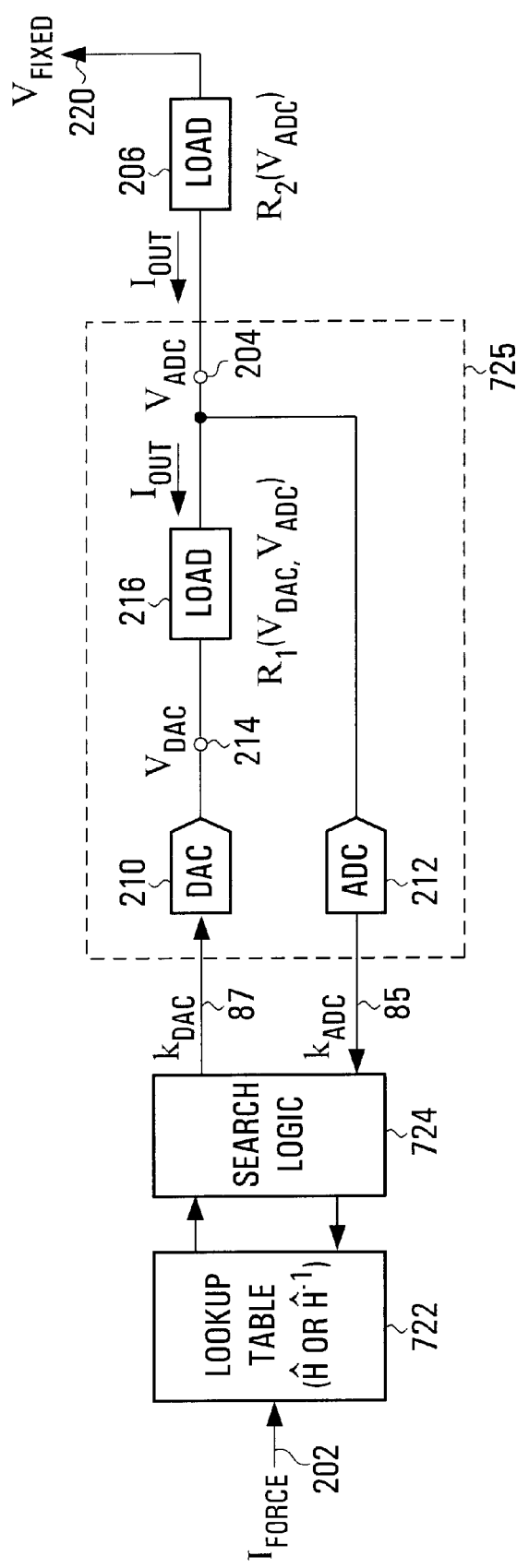

With reference to FIGS. 23a), b), c), d) and FIG. 26, two basic architectures have been described for the Force-Current-Measure-Voltage Circuit, depending on whether the search variable is the voltage $V_{ADC}$ at output 204 or voltage $V_{DAC}$ at the intermediate voltage point 214. The two basic architectures are shown in FIGS. 42 and 43. As shown, for both of these architectures, the search logic 720 724 accesses a lookup table 722 where either function $\hat{H}$ or function $\hat{H}^{-1}$ is stored. In this non-limiting implementation, lookup table 722 is implemented by a RAM device. It will be appreciated that other suitable memory devices may be used without detracting from the spirit of the invention.

Figure 41:
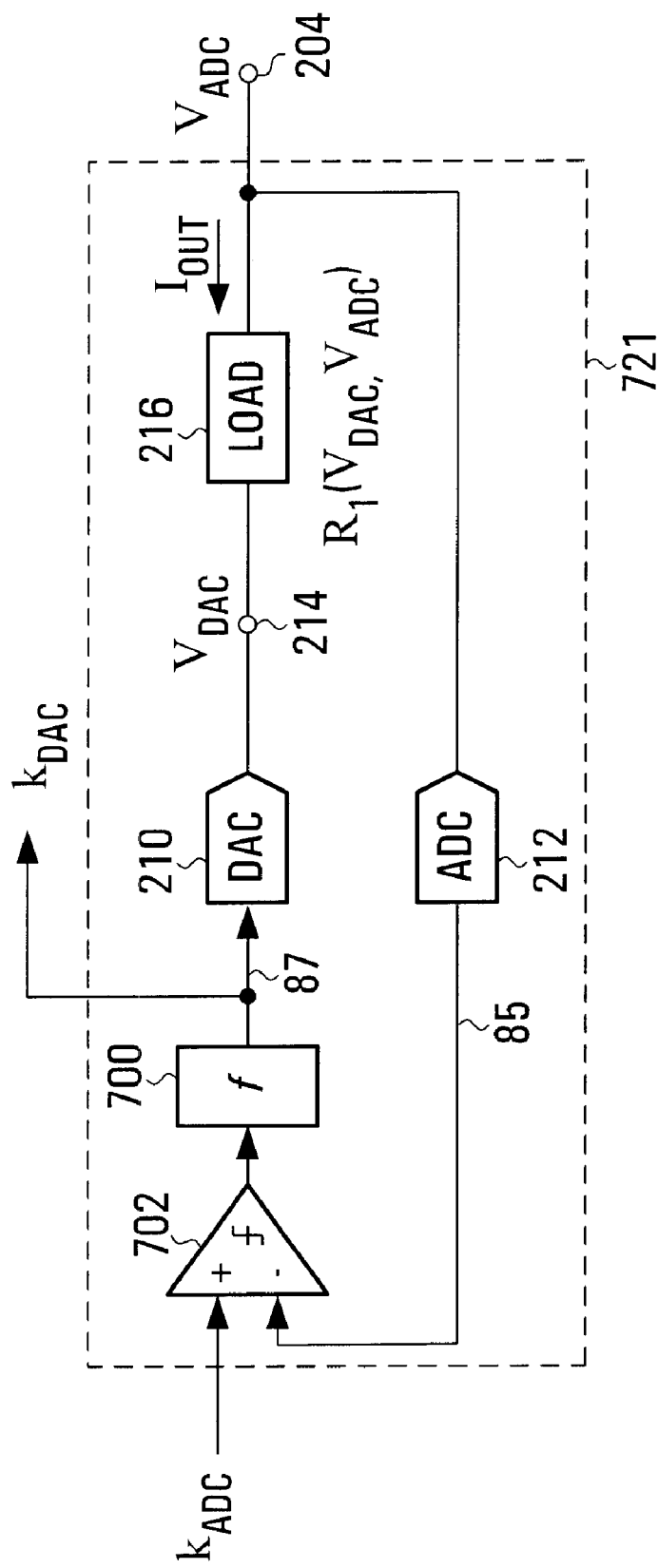

For the force-current architecture that uses voltage $V_{ADC}$ at output 204 as a search variable, shown in FIG. 42, the $V_{ADC}$-Forcing circuit 721 shown in FIG. 41 is used as a front-end circuit. For the force-current architecture that uses voltage $V_{DAC}$ at the intermediate voltage point 214 as a search variable, shown in FIG. 43, the value voltage $V_{DAC}$ at point 214 is reconstructed from value $k_{DAC}$ at node 87 using DAC 210. The $V_{DAC}$-Forcing circuit 725 shown in FIG. 43 and in FIG. 44 includes DAC 210, internal load $R_1$ 216 and the ADC 212. Details of the $V_{DAC}$-Forcing circuit 725 will be described herein below.

$V_{DAC}$-Forcing Circuit 725

In a non-limiting implementation, the architecture of the $V_{DAC}$-Forcing Circuit 725 in FIG. 44 includes of a DAC 210 with essentially zero output impedance, hereinafter referred to as a "low-impedance DAC" 210, an internal load element $R_1$ 216 and an ADC 212 with infinite input impedance, hereinafter referred to as a "high-impedance ADC". It is to be appreciated that the expression "infinite input impedance" is meant to designate a device, which in its effective operating range will draw a quantity of current that is considered to be essentially negligible. The components of the $V_{DAC}$-Forcing Circuit 725 are described in the following sections.

DAC 210 and the Internal Load Element $R_1$ 216

Figure 45:
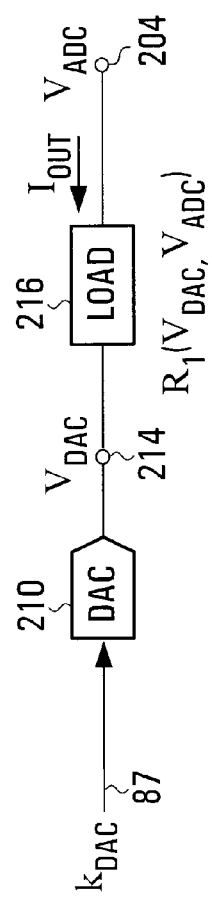

The partial front-end circuit with the low-impedance DAC 210 and internal load $R_1$ 216 is shown in FIG. 45. The combination of the DAC 210 and internal load $R_1$ 216 as separate components is one example of implementation of a circuit module having digital-to-analog conversion functionality and load functionality. The voltage $V_{ADC}$ at output 204 is given by a function of voltage $V_{DAC}$ at intermediate voltage point 214 and current $I_{out}$ at output 204 as follows:

$$V_{ADC}=H_{R1}(V_{DAC},I_{out}) \qquad \text{Equation 70}$$

where the function $H_{R1}$ is dependent on the internal load $R_1$ 216. The voltage $V_{DAC}$ at intermediate voltage point 214 is described by:

$$V_{DAC}=k_{DAC} \times V_{LSB-DAC} \qquad \text{Equation 71}$$

In this description, five alternative specific implementations of the circuit module having digital-to-analog conversion functionality and load functionality in FIG. 45 will be described. It will be readily appreciated that other configurations of the circuit in FIG. 45 may be used without detracting from the spirit of the invention.

Two of these implementations are shown in FIGS. 46a) and 46b). The implementations in FIGS. 46a) and 46b) are hereinafter referred to as Load Configurations A and B respectively. In both circuits, a PDM generator 801 generates digital pulses with a specific density of 1's (hereinafter referred to as "pulse density") controlled by $k_{DAC}$. When the digital pulses pass through the low-pass filter (LPF) formed by $R_{Ax}$ and $C_{Ax}$ (where x=1 to m), the output voltage $V_{ADC}$ at output 204 is settled at a specific DC value that is dependent on the pulse density. Also, it can be seen that for a particular pulse density, the DC value of voltage $V_{ADC}$ at output 204 will change depending on current $I_{out}$ at output 204. Therefore, the circuits in FIGS. 46a) and 46b) can be represented by a low-impedance DAC connected with a resistor. The parameters of the equivalent DAC 210 and the internal load $R_1$ 216 shown in FIG. 45 can be derived as follows. For the circuits in FIGS. 46a) and 46b), if the PDM generator 801 can generate $2^n$ distinct pulse densities, $V_{LSB-DAC}$ of the equivalent DAC 210 (in FIG. 45) is given by:

$$V_{LSB-DAC} = \frac{V_{DD}}{2^n}$$ Equation 72 where $V_{DD}$ is the voltage representing the high value of the PDM generator 801. Also, the equivalent internal load $R_1$ 216 is linear and is given by the values in Table 12 below.

TABLE 12

Equivalent load resistances of Load Configurations A and B

| Load Configuration | Value of Equivalent $R_1$ |
|---|---|
| A | Equation 73 $$R_1 = \sum_{i=1}^{m} R_{Ai}$$ |
| B | Equation 74 $$R_1 = R_B + \sum_{i=1}^{m} R_{Ai}$$ |

Alternatively, the circuit in FIG. 45 can be implemented using other configurations. Consider the three implementations shown in FIGS. 47(*a*) to (*c*) (hereinafter referred to as Load Configurations C to E). In these circuits, the PDM generator 801 and the low-pass filter (LPF) 805 corresponds to the low-impedance DAC 210 in FIG. 45. If the PDM generator 801 can generate $2^n$ distinct pulse densities, $V_{LSB-DAC}$ of the equivalent DAC 210 in FIG. 45 is given by equation 72.

Each of the MOS circuits 807 in FIGS. 47(*a*) to (*c*), correspond to the internal load $R_1$ 216 in FIG. 45. It can be seen that the equivalent internal load $R_1$ 216 for any one of the MOS circuits shown is inverting because the equivalent voltage $V_{DAC}$ at intermediate voltage point 214 (not shown) increases while voltage $V_{ADC}$ at output 204 decreases for a particular current $I_{out}$ at output 204. Note that in practice, the current sources in FIGS. 47(*b*) and (*c*) of the MOS circuits 807 will generally have a positive differential output resistance. Hence, $I_{bias}$ is dependent on voltage $V_{ADC}$ at output 204. Moreover, load configurations D and E (shown in FIGS. 47(*b*) and (*c*)) can also be implemented with the bias current sources removed (i.e., $I_{bias}=0$). In this case, configuration D (in FIGS. 47(*b*)) can be used to measure/generate negative output currents (where $I_{out}<0$) only while configuration E (in FIGS. 47(*c*)) can be used to measure/generate positive output currents (where $I_{out}>0$) only.

Figure 48A:
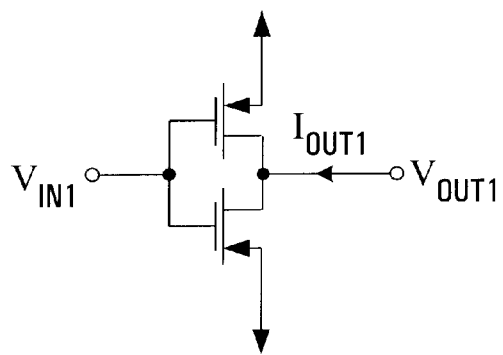
Figure 48B:
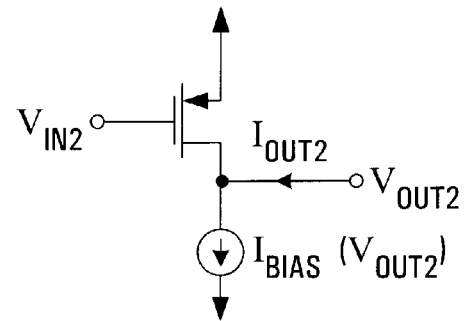
Figure 48C:
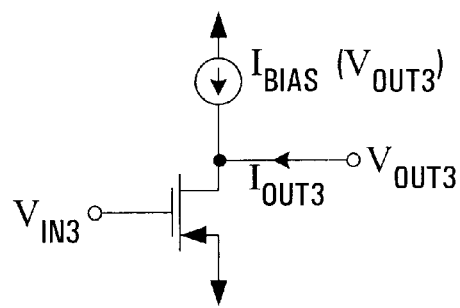

The value of voltage $V_{ADC}$ at output 204 for the five configurations described above can be easily deduced and is shown in Table 13. In Table 13, voltage $V_{DAC}$ at intermediate node 214 is the equivalent DAC voltage given by equation 71. The functions $H_{NOT}$, $H_{PMOS}$ and $H_{NMOS}$ are DC transfer functions of the CMOS inverter, PMOS and NMOS circuits shown in FIGS. 48(*a*), (*b*) and (*c*), respectively, which can be written as:

$$V_{out1} = H_{NOT}(V_{in1}, I_{out1})$$ Equation 75

$$V_{out2} = H_{PMOS}(V_{in2}, I_{out2})$$ Equation 76

$$V_{out3} = H_{NMOS}(V_{in3}, I_{out3})$$ Equation 77

TABLE 13

Value of $V_{ADC}$ for different load configurations

| Load Configuration | Value of $V_{ADC}$ | Properties of Equivalent $R_1$ |
|---|---|---|
| A | Equation 78 $$V_{ADC} = V_{DAC} + \left[\sum_{i=1}^{m} R_{Ai}\right] \times I_{out}$$ | non-inverting, linear |
| B | Equation 79 $$V_{ADC} = V_{DAC} + \left[R_B + \sum_{i=1}^{m} R_{Ai}\right] \times I_{out}$$ | |
| C | Equation 80 $$V_{ADC} = H_{NOT}(V_{DAC}, I_{out})$$ | inverting, non-linear |
| D | Equation 81 $$V_{ADC} = H_{PMOS}(V_{DAC}, I_{out})$$ | |
| E | Equation 82 $$V_{ADC} = H_{NMOS}(V_{DAC}, I_{out})$$ | |

It will be appreciated that although the examples shown in FIGS. 46(*a*), 46(*b*) and 47(*a*) to (*c*) include the PDM generator 801, the latter may be replaced by a suitable general-purpose pulse generator that provides a digital pulse.

ADC 212 (Digital Integration/Successive Approximation)

Figure 44:
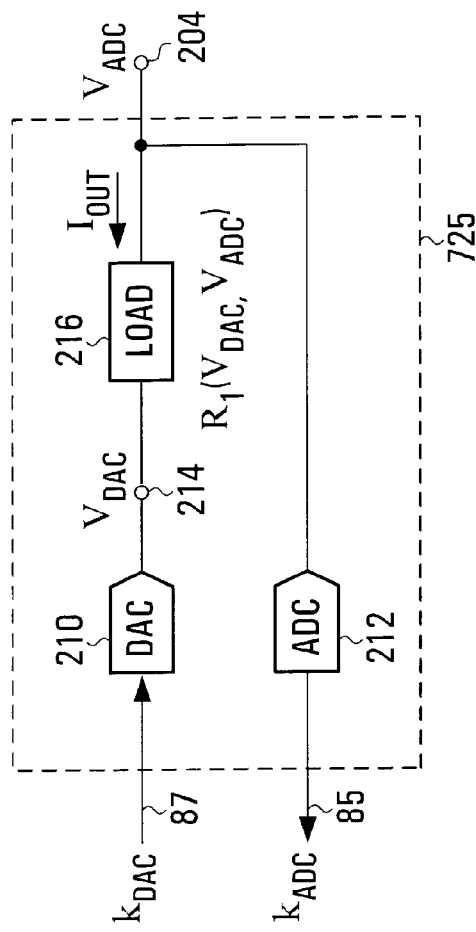

In a non-limiting implementation, the ADC 212 shown in FIG. 44 can be implemented by a delta-modulator of the type described in U.S. Pat. No. 2,605,361 issued to Cassius C. Cutler et al. in Jul. 29, 1952. The content of this document is hereby incorporated by reference. This implementation is shown in FIG. 49.

As shown, the analog-to-digital converter module 212 includes an analog comparator 504, a digital integrator 502 and a feedback circuit. The analog comparator 504 receives a signal indicative of the voltage at the output 204 and a tracking voltage $V_{track}$ and generates a difference signal on the basis of the signals received. The digital integrator 502 receives the difference signal and generates successive digital approximations of the voltage signal at the output of the circuit device. The feedback circuit processes the successive digital approximations of the voltage signal to generate the tracking voltage $V_{track}$ and provide the latter to the analog comparator 504. In a non-limiting implementation, the feedback circuit includes a digital-to-analog converter module 500.

Figure 49:
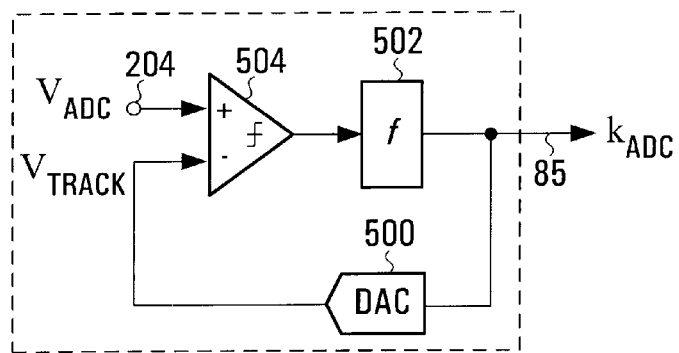

In a non-limiting implementation, the DAC 500 in FIG. 49 can be implemented using the voltage reference described in M. M. Hafed, S. Laberge, G. W. Roberts, "A Robust Deep Submicron Programmable DC Voltage Generator", Proc. IEEE International Symposium on Circuits and Systems, Vol. 4, pp. 5–8, May 2000 and depicted in FIG. 50. The content of this document is hereby incorporated by reference.

The output of the digital integrator 502, $k_{ADC}$, increases or decreases by a constant amount depending on the result from the comparator 504. Upon equilibrium, the tracking voltage $V_{track}$ released by the DAC 500 will equal voltage $V_{ADC}$. The value $k_{ADC}$ will become a digital representation of $V_{ADC}$.

Figure 51:
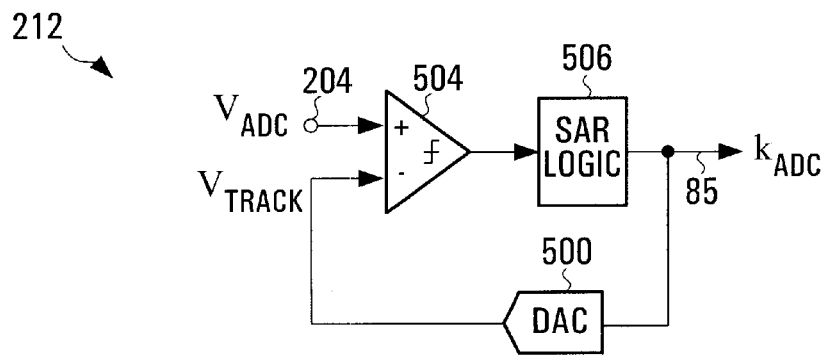

In accordance with an alternative specific example of implementation, the ADC 212 shown in FIG. 44 can be implemented by successive-approximation circuit of the type described in D. A. Johns, K. Martin, Analog Integrated Circuit Design, John Wiley & Sons, Inc., pp. 492–493, 1997. The content of this document is hereby incorporated by reference. As shown in FIG. 51, the digital integrator 502 in the analog-to-digital converter module in FIG. 49 is replaced by a successive-approximation register (SAR) 506 module. In this implementation, the Successive-Approximation Register Logic (SAR Logic) 506 binary searches for the value of $k_{ADC}$ that equalises $V_{ADC}$ and $V_{track}$. The output value $k_{ADC}$ will be a quantized representation of $V_{ADC}$ given by:

$$k_{ADC} = \frac{V_{ADC}}{V_{LSB-ADC}} \qquad \text{Equation 83}$$

where $V_{LSB-ADC}$ is the LSB voltage of the ADC circuit 212. If we denote the LSB voltage of the DAC 500 that is used in the ADC circuit in FIGS. 49 and 51 by $V_{LSB-DAC(ADC)}$, the value of $V_{LSB-ADC}$ will be given by:

$$V_{LSB-ADC} = V_{LSB-DAC(ADC)} \qquad \text{Equation 84}$$

ADC 212 (Delta Modulator)

Figure 52:
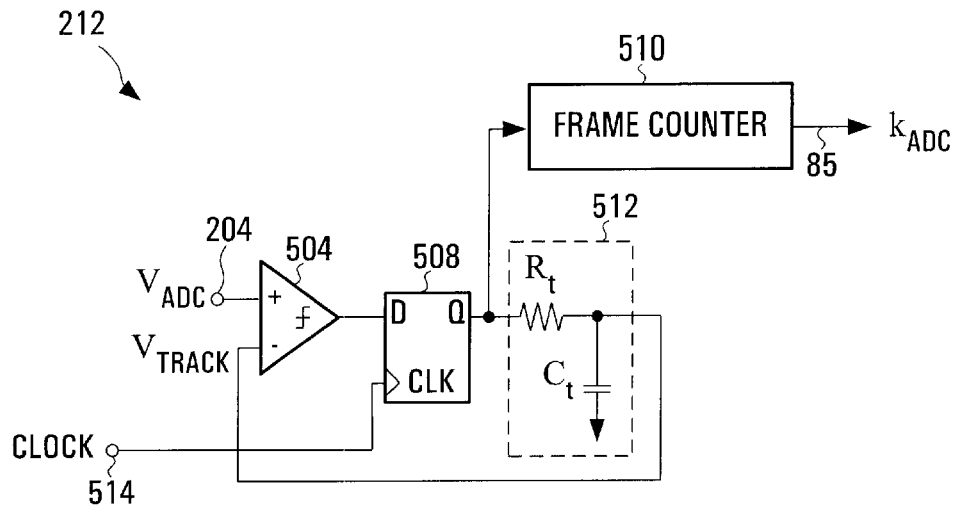

In yet another alternative implementation, the ADC 212 is implemented by a delta-modulator of the type described in D. J. G. Janssen, "Delta Modulation in DVM Design", IEEE Journal of Solid-State Circuits, Vol. SC-7, pp. 503–507, December 1972. The content of this document is hereby incorporated by reference. A non-limiting implementation of the circuit is shown in FIG. 52. As shown, the ADC 212 includes an analog comparator 504, a D-Flip-Flop (D-FF) 508, an RC filter 512 and a frame counter 510. It will be appreciated that although the example shown in FIG. 52 includes a the frame counter 510, the latter may be replaced by a general purpose digital filter implementing accumulation functionality such as a digital integrator for example.

At equilibrium, the tracking voltage $V_{track}$ will equal voltage $V_{ADC}$ at output 204. The DC value of $V_{track}$ (and thus $V_{ADC}$) can be deduced by observing the density of 1's (hereinafter referred to as "pulse density") from the D-FF 508. The frame counter 510 captures a frame of bits from the output of the D-FF 508 and counts the number of 1's in a frame. The resultant count $k_{ADC}$ will become a digital representation of voltage $V_{ADC}$. For example, if the length of the frame captured is $2^n$ bits, the output value $k_{ADC}$ will be a quantized representation of $V_{ADC}$ given by equation 83, where:

$$V_{LSB-ADC} = \frac{V_{DD}}{2^n} \qquad \text{Equation 85}$$

Functional Relationship Between $k_{ADC}$, $k_{DAC}$ $I_{out}$

When the $V_{DAC}$-Forcing circuit 725 (FIG. 44) is used to implement the first and second current-searching algorithm, the corresponding function $\hat{H}$ defined in equation 33 is dependent on the internal load $R_1$. From equations 70, 71 and 83, $\hat{H}$ can be written as:

$$\hat{H}(k_{DAC}, I_{out}) = k_{ADC} = \frac{H_{R1}(k_{DAC} \times V_{LSB-DAC}, I_{out})}{V_{LSB-ADC}} \qquad \text{Equation 86}$$

where $V_{LSB-ADC}$ is the LSB voltage of the ADC 212 in the $V_{DAC}$-Forcing circuit 725. Using equation 86, the relationships in Table 13 can be rewritten as functions $\hat{H}$ listed in Table 14.

TABLE 14

Value of $k_{ADC}$ for different load configurations

| Load Configuration | Definition of $\hat{H}$ |
|---|---|
| A | Equation 87 $$\hat{H}(k_{DAC}, I_{out}) = \frac{k_{DAC} \times V_{LSB-DAC} + \left[\sum_{i=1}^{m} R_{Ai}\right] \times I_{out}}{V_{LSB-ADC}}$$ |
| B | Equation 88 $$\hat{H}(k_{DAC}, I_{out}) = \frac{k_{DAC} \times V_{LSB-DAC} + \left[R_B + \sum_{i=1}^{m} R_{Ai}\right] \times I_{out}}{V_{LSB-ADC}}$$ |
| C | Equation 89 $$\hat{H}(k_{DAC}, I_{out}) = \frac{H_{NOT}(k_{DAC} \times V_{LSB-DAC}, I_{out})}{V_{LSB-ADC}}$$ |
| D | Equation 90 $$\hat{H}(k_{DAC}, I_{out}) = \frac{H_{PMOS}(k_{DAC} \times V_{LSB-DAC}, I_{out})}{V_{LSB-ADC}}$$ |
| E | Equation 91 $$\hat{H}(k_{DAC}, I_{out}) = \frac{H_{NMOS}(k_{DAC} \times V_{LSB-DAC}, I_{out})}{V_{LSB-ADC}}$$ |

$V_{ADC}$-Forcing Circuits 721

$V_{ADC}$-Forcing Circuits 721, of the type shown in FIG. 42, are used in the force-voltage-measure-current algorithm as well as the third and fourth force-current-measure-voltage algorithms. In this section, two specific non-limiting implementations of the $V_{ADC}$-Forcing circuits 721 will be described. It will be readily apparent that other suitable implementations are possible without detracting from the spirit of the invention. Before the description of the two implementations, the definition of a function that relates the key variables of the $V_{ADC}$-Forcing Circuit 721 is provided in the following.

When a $V_{ADC}$-Forcing Circuit 721 is in equilibrium, the quantities $k_{DAC}$, $k_{ADC}$ and $I_{out}$ will be related by a function which is dependent on the internal load $R_1$ 216. That function will be described in the following. Let us define a DC transfer characteristic $W_{R1}$ for internal load $R_1$ 216 such that voltage $V_{DAC}$ at intermediate voltage point 214 is a function of the voltage $V_{ADC}$ and the current $I_{out}$ at the output 204. Mathematically, this can be expressed as follows:

$$V_{DAC} = W_{R1}(V_{ADC}, I_{out}) \qquad \text{Equation 92}$$

When the circuit in FIG. 44 is in equilibrium, $k_{DAC}$ can be expressed as:

$$k_{DAC} = \frac{W_{R1}(k_{ADC} \times V_{LSB-ADC}, I_{out})}{V_{LSB-DAC}} \qquad \text{Equation 93}$$

where $V_{LSB-ADC}$ and $V_{LSB-DAC}$ are the LSB voltages of the equivalent ADC 212 and the DAC 210 employed in the $V_{ADC}$-forcing circuit 721, respectively. Function $\hat{W}_{R1}$ can be defined as:

$$\hat{W}_{RI}(k_{ADC}, I_{out}) = k_{DAC} = \frac{W_{RI}(k_{ADC} \times V_{LSB-ADC}, I_{out})}{V_{LSB-DAC}} \quad \text{Equation 94}$$

For each variation of the $V_{ADC}$-Forcing Circuit 721 described in the following sub-sections, the function $\hat{W}_{R1}$ will be derived and listed. At the end of the section, we will show that the function $\hat{W}_{R1}$ for the $V_{ADC}$-Forcing circuits described is related to the functions $\hat{G}$ and $\hat{H}$ used the force-voltage/force-current algorithms.

$V_{ADC}$-Forcing Circuit 721 (Digital Integration/Successive Approximation)

Figure 53:
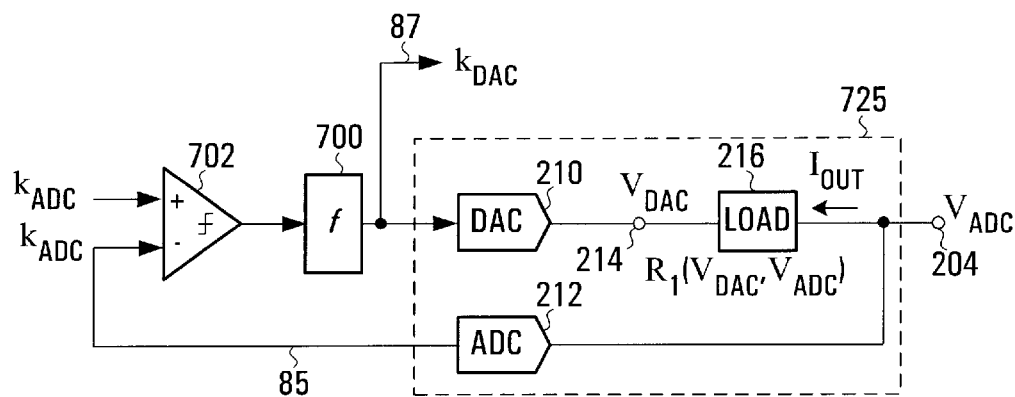

The $V_{ADC}$-Forcing Circuit 721 in FIG. 41 is redrawn in FIG. 53. It can be seen that the $V_{ADC}$-Forcing circuit 721 includes a $V_{DAC}$-Forcing circuit 725 with a digital comparator 702 and a digital integrator 700. Therefore, a $V_{ADC}$-Forcing Circuit 721 can be implemented using a $V_{DAC}$-Forcing circuit 725 described above in addition to the digital logic shown in FIG. 53.

In a non-limiting implementation where the combination of DAC 210 and internal load $R_1$ 216 is of the type shown in FIGS. 46a) or b) (type A or B), the equivalent internal load $R_1$ 216 is linear and the corresponding values are shown in Table 12 above.

Figure 47A:
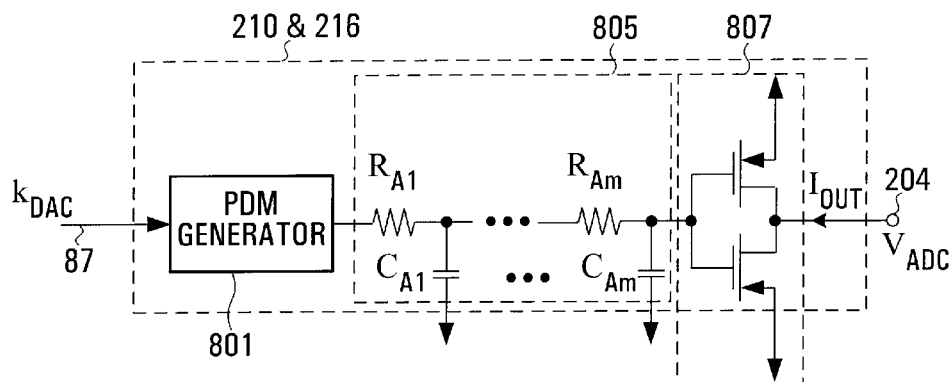
Figure 47B:
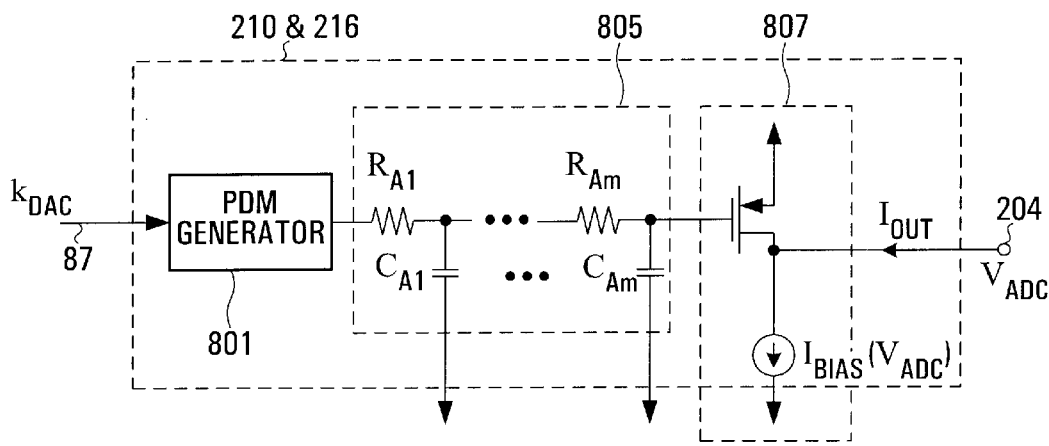
Figure 47C:
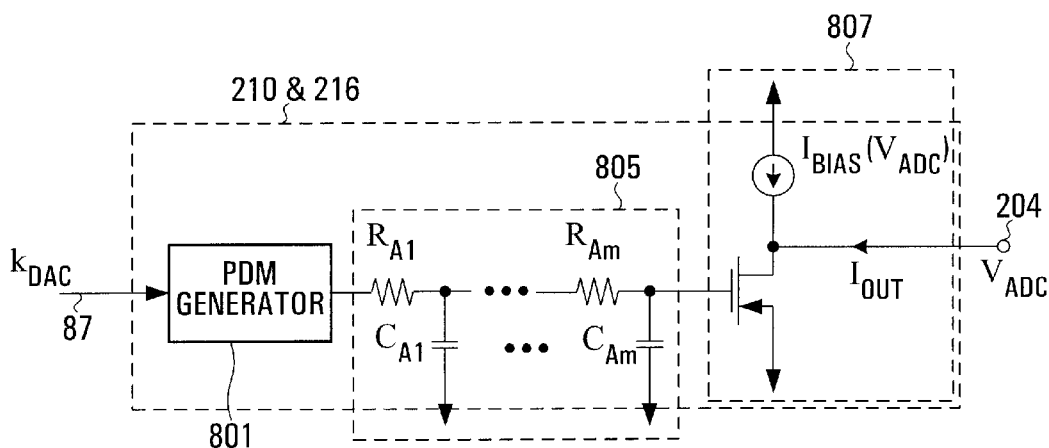

If an alternative non-limiting implementation where the combination of DAC 210 and the internal load $R_1$ 216 is of the type shown in FIGS. 47a), b) or c) (type C or D or E), the equivalent internal load $R_1$ 216 will be an inverting load. For these implementations, the polarity of the digital comparator 702 in FIG. 53 should be inverted to maintain negative feedback. This modification is shown in FIG. 54 where digital comparator 702 was replaced by digital comparator 730.

Figure 54:
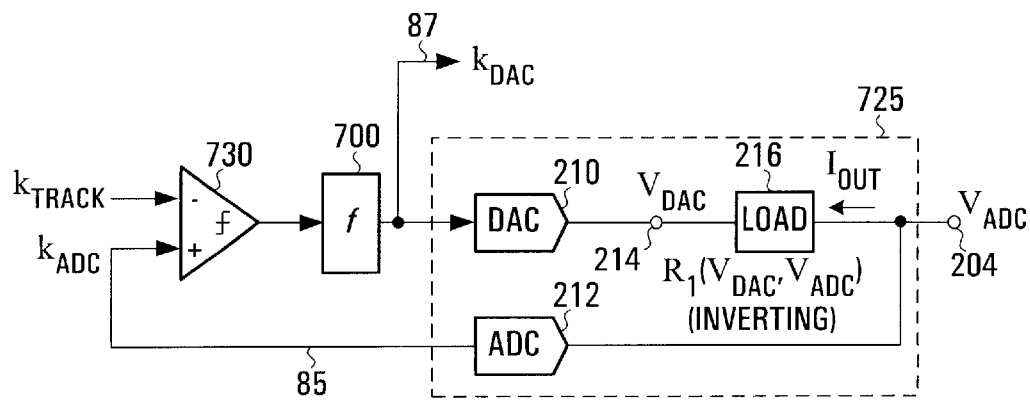

Similarly to the ADC circuit 212 described above with reference to FIGS. 49 and 51, the digital integrator 700 in FIGS. 53 and 54 can be replaced by an SAR Logic unit such that the value of $k_{DAC}$ can be obtained by a binary search.

Upon equilibrium, the function $\hat{W}_{R1}$ for each load configuration is given by Table 15. In Table 15, $V_{LSB-ADC}$ and $V_{LSB-DAC(PDM)}$ are the LSB voltages of the equivalent ADC 212 and the DAC 210. The functions $W_{NOT}$, $W_{PMOS}$ and $W_{NMOS}$ represent the DC transfer characteristics of the CMOS inverter, PMOS and NMOS circuits shown in FIG. 48(a), (b) and (c), which can be written as:

$$V_{in1} = W_{NOT}(V_{out1}, I_{out1}) \quad \text{Equation 95}$$

$$V_{in2} = W_{PMOS}(V_{out2}, I_{out2}) \quad \text{Equation 96}$$

$$V_{in3} = W_{NMOS}(V_{out3}, I_{out3}) \quad \text{Equation 97}$$

TABLE 15

The Value of $k_{DAC}$ for different load configurations

| Load Configuration | Definition of the function $\hat{W}_{R1}$ |
|---|---|
| A | Equation 98 $$\hat{W}_{R1}(k_{ADC}, I_{out}) = \frac{k_{ADC} \times V_{LSB-ADC} - \left[\sum_{i=1}^{m} R_{Ai}\right] \times I_{out}}{V_{LSB-DAC(PDM)}}$$ |
| B | Equation 99 $$\hat{W}_{R1}(k_{ADC}, I_{out}) = \frac{k_{ADC} \times V_{LSB-ADC} - \left[R_B + \sum_{i=1}^{m} R_{Ai}\right] \times I_{out}}{V_{LSB-DAC(PDM)}}$$ |
| C | Equation 100 $$\hat{W}_{R1}(k_{ADC}, I_{out}) = \frac{W_{NOT}(k_{ADC} \times V_{LSB-ADC}, I_{out})}{V_{LSB-DAC(PDM)}}$$ |
| D | Equation 101 $$\hat{W}_{R1}(k_{ADC}, I_{out}) = \frac{W_{PMOS}(k_{ADC} \times V_{LSB-ADC}, I_{out})}{V_{LSB-DAC(PDM)}}$$ |
| E | Equation 102 $$\hat{W}_{R1}(k_{ADC}, I_{out}) = \frac{W_{NMOS}(k_{ADC} \times V_{LSB-ADC}, I_{out})}{V_{LSB-DAC(PDM)}}$$ |

$V_{ADC}$-Forcing Circuit 721 (Delta Modulation)

The $V_{ADC}$-Forcing Circuits 721 in FIGS. 53 and 54 can be simplified into a group of circuits derived from a Delta-Modulator structure. Specific examples of implementation of such circuits are shown in FIGS. 55(a) to (e). Each circuit shown in FIG. 55 includes a DAC 904, an analog comparator 902 (916 in FIGS. 55(c) to (e)), a D-FF 906 and a digital filter in the form of a frame counter 900. It will be appreciated that although the example shown in FIGS. 55(a) to (e) includes frame counter 900, the latter may be replaced by a general purpose digital filter implementing accumulation functionality such as a digital integrator for example. The corresponding set-ups for load configurations shown in FIGS. 46(a) and (b) and in FIGS. 47(a) to (c) (i.e. Load Configurations A to E) are shown in FIG. 55(a) to (e) respectively.

Upon equilibrium, the voltage $V_{ADC}$ at output 204 will be equal to the DC value set by $k_{ADC}$ and the DAC 904. As previously described, the value of $k_{DAC}$ can be deduced by observing the pulse density from the D-Flip Flop 906 using a frame counter 900.

The function $\hat{W}_{R1}$ for the different load configurations are given by equations 105 to 109 shown in Table 16. In the table, $V_{LSB-ADC}$ is given by:

$$V_{LSB-ADC} = V_{LSB-DAC(Force-VADC)} \quad \text{Equation 103}$$

where $V_{LSB-DAC(Force-VADC)}$ is the LSB voltage of the DAC used in the Force-$V_{ADC}$ circuits in FIGS. 55(a) to (d).

The value of $V_{LSB-DAC}$ in Table 16 depends on the length of a captured frame in the frame counter 900. For a captured frame with $2^n$ bits in length, $V_{LSB-DAC}$ is given by:

$$V_{LSB-DAC} = \frac{V_{DD}}{2^n} \quad \text{Equation 104}$$

TABLE 16

Value of $k_{DAC}$ for different load configurations

| Load Configuration | Definition of the function $\hat{W}_{R1}$ |
|---|---|
| A | Equation 105<br>$\hat{W}_{R1}(k_{ADC}, I_{out}) = \dfrac{k_{ADC} \times V_{LSB-ADC} - R_{A1} \times I_{out}}{V_{LSB-ADC}}$ |
| B | Equation 106<br>$\hat{W}_{R1}(k_{ADC}, I_{out}) = \dfrac{k_{ADC} \times V_{LSB-ADC} - (R_{A1} + R_B) \times I_{out}}{V_{LSB-ADC}}$ |
| C | Equation 107<br>$\hat{W}_{R1}(k_{ADC}, I_{out}) = \dfrac{W_{NOT}(k_{ADC} \times V_{LSB-DAC}, I_{out})}{V_{LSB-ADC}}$ |
| D | Equation 108<br>$\hat{W}_{R1}(k_{ADC}, I_{out}) = \dfrac{W_{PMOS}(k_{ADC} \times V_{LSB-DAC}, I_{out})}{V_{LSB-ADC}}$ |
| E | Equation 109<br>$\hat{W}_{R1}(k_{ADC}, I_{out}) = \dfrac{W_{NMOS}(k_{ADC} \times V_{LSB-DAC}, I_{out})}{V_{LSB-ADC}}$ |

Comparing the equations in Table 16 to that in Table 15, it can be seen that the structures in FIG. 55(a) to (d) can also be mapped into the generalised architecture of the $V_{ADC}$-forcing circuit in FIG. 41. For the load configuration of type shown in FIGS. 46(a) and (b) (type A or B), the equivalent internal load $R_1$ 216 is linear and the corresponding values are shown in Table 17. For load configurations shown in FIGS. 47(a) to (c) (type C, D or E) the equivalent internal load $R_1$ 216 will be an inverting load.

TABLE 17

Equivalent load resistances

| Load Configuration | Value of Equivalent $R_1$ |
|---|---|
| A | Equation 110<br>$R_1 = R_{A1}$ |
| B | Equation 111<br>$R_1 = R_{A1} + R_B$ |

Functional Relationship between $k_{ADC}$, $k_{DAC}$ and $I_{out}$

When the $V_{ADC}$-Forcing circuit 721 (FIG. 41) is used to implement the force-voltage-measure-current or the third or fourth current-searching algorithm, the corresponding functions $\hat{G}$ and $\hat{H}$, defined in equations 18 and 33, will be dependent on the internal load $R_1$.

Comparing equation 94 to equations 20 and 37, it can be seen that $\hat{W}_{R1}$ represents $\hat{G}^{-1}$ in the force-voltage-measure-current algorithm and $\hat{H}^{-1}$ in the force-current measurement voltage algorithm, i.e.:

$$\hat{G}^{-1}(k_{ADC}, I_{out})|_{k_{ADC}=k_{force}} = k^*_{DAC} = \hat{W}_{R1}(k_{ADC}, I_{out})|_{k_{ADC}=k_{force}}$$
Equation 112

$$\hat{H}^{-1}(k_{ADC}, I_{out})|_{I_{out}=I_{force}} = k_{DAC} = \hat{W}_{R1}(k_{ADC}, I_{out})|_{I_{out}=I_{force}}$$
Equation 113

Therefore, for all the $V_{ADC}$-Forcing circuit 721 with $\hat{W}_{R1}$ defined in equations 105 to 109, the corresponding $\hat{G}$ and $\hat{H}$ for the force-voltage-measure-current algorithm and the third and fourth force-current-measure-voltage algorithm are given by equations 112 and 113.

Specific Examples of Implementation

Example 1

System with Non-Linear Inverting Load Element $R_1$ 216

Figure 50:
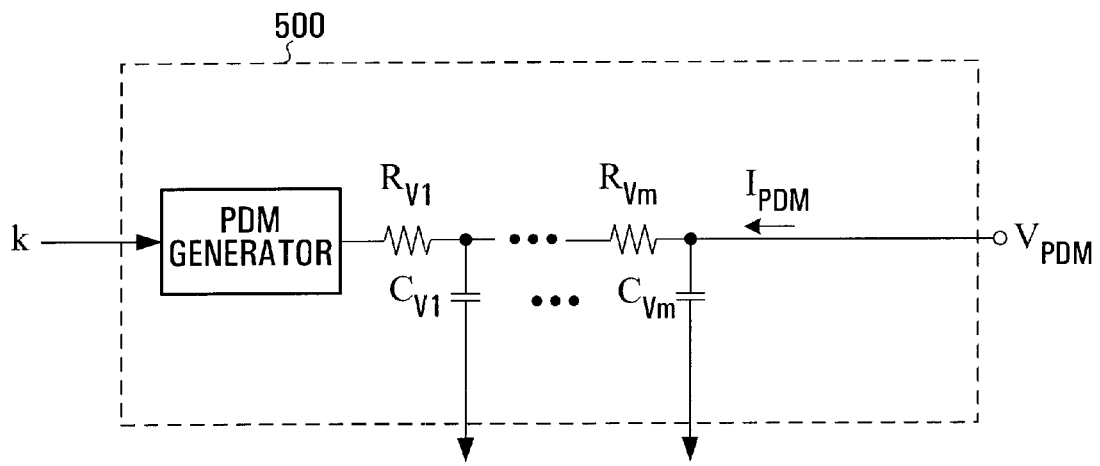
Figure 55A:
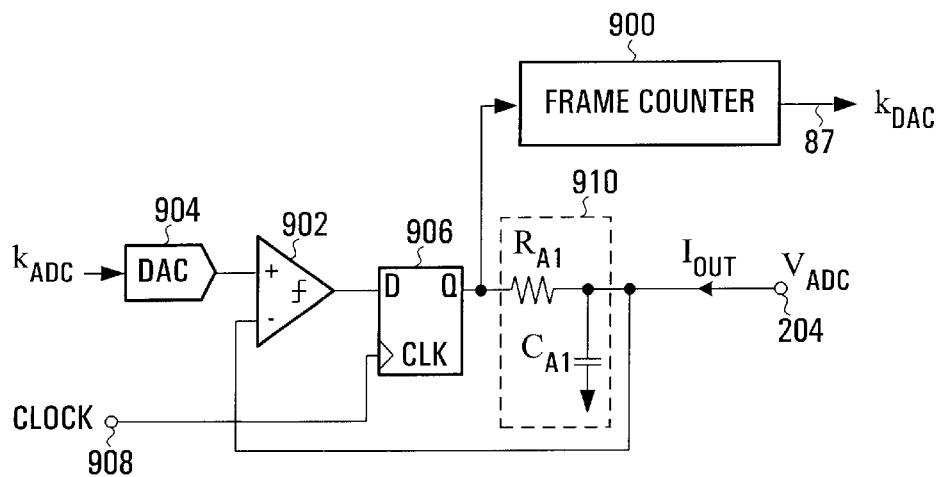
Figure 55B:
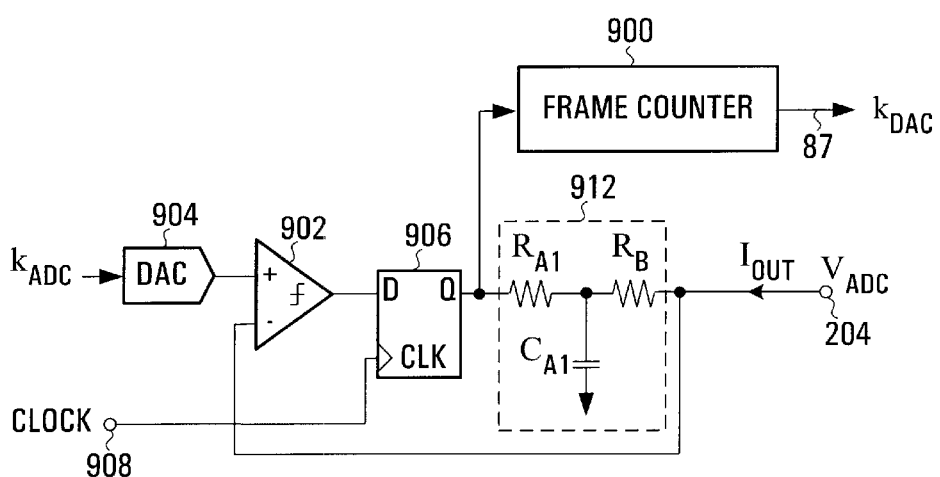
Figure 55C:
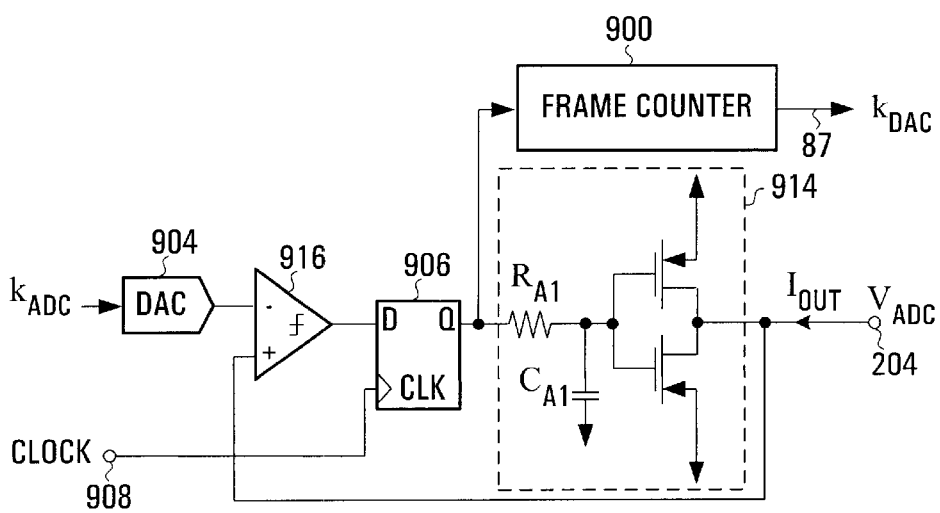
Figure 55D:
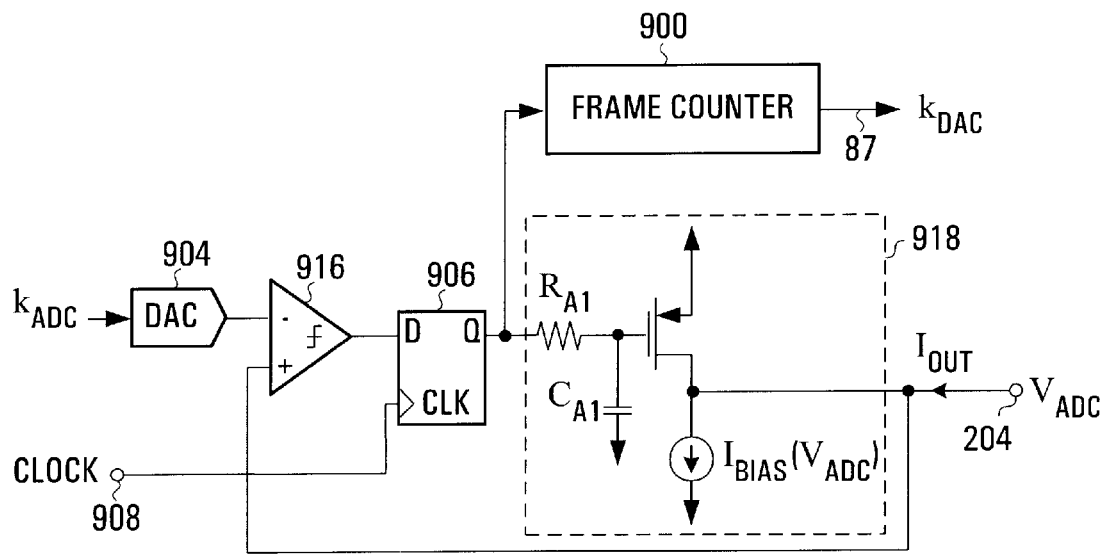
Figure 55E:
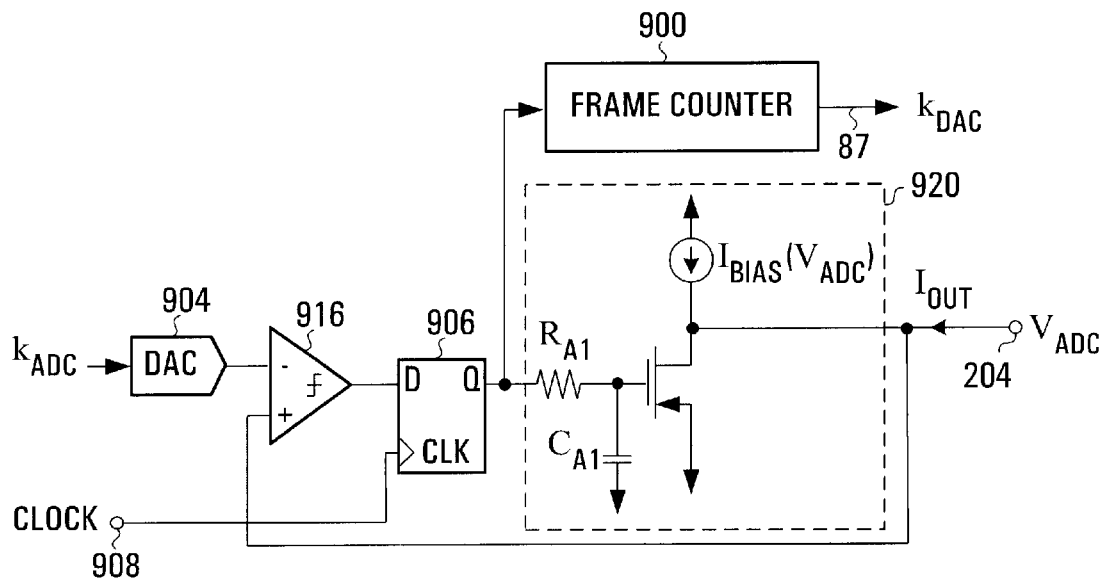
Figure 56:
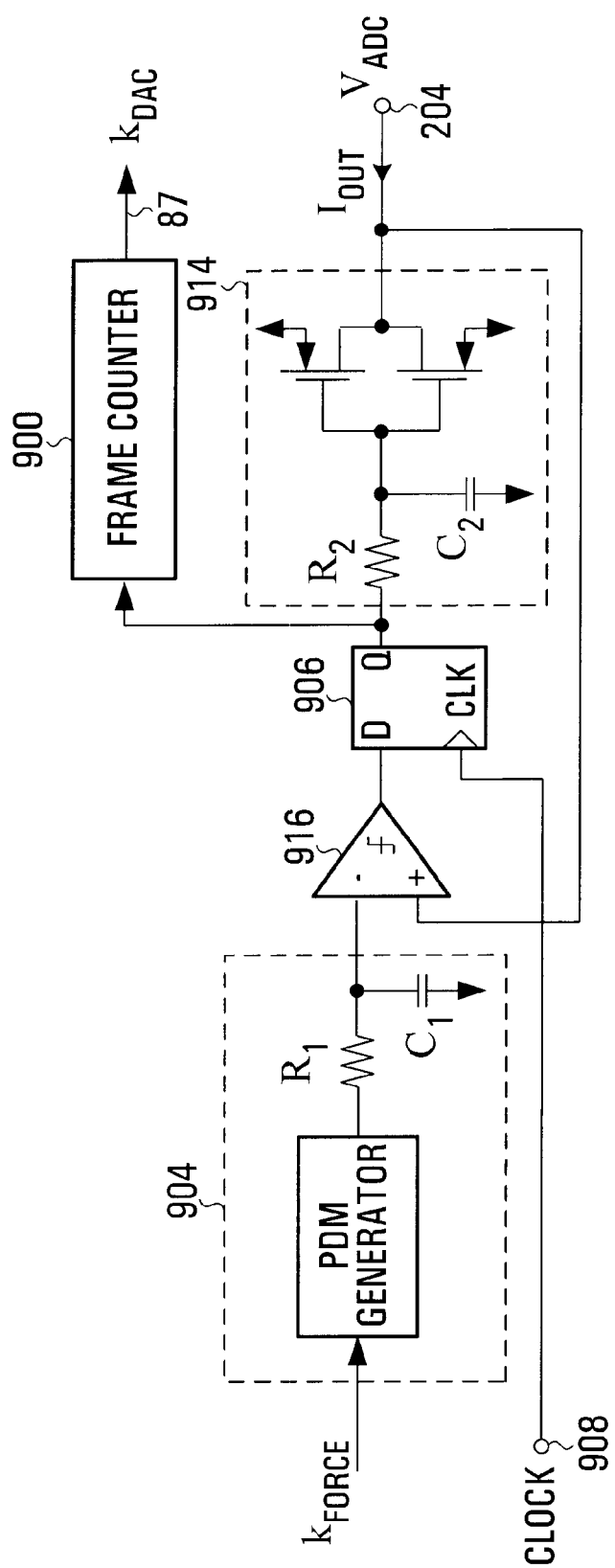

In a first alternative specific example, depicted in FIG. 56, the system includes a $V_{ADC}$-Forcing circuit described in FIG. 55(c) with the DAC 904 implemented by the circuit shown FIG. 50. A first-order RC filter is used for the DAC 904. In the figure, both the PDM generator and the frame counter 900 have 8-bit (256 distinct levels) resolution. The analog full-scale voltage range is from 0 V to 5 V.

Current Measurement

Figure 57:
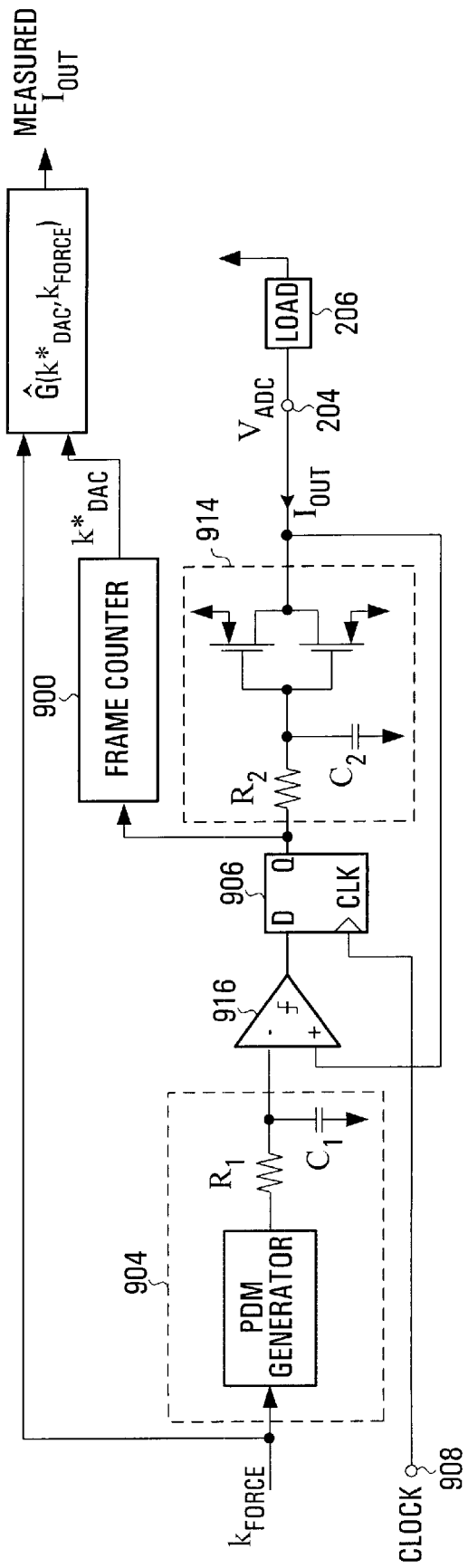

Using the $V_{ADC}$-Forcing circuit in FIG. 56, a force-voltage-measure-current system can be constructed as described previously in the specification. The resultant system is shown in FIG. 57. In this example, let us assume that we need to force 3.75 V at the output 204 ($V_{ADC}$). According to equations 72 and 103, the value of $k_{ADC}$ should be set as follows:

$$k_{ADC} = k_{force} = \dfrac{V_{ADC}}{V_{LSB-DAC(Force-VADC)}} = \dfrac{3.75\ V}{\left(\dfrac{5\ V}{256}\right)} = 192 \quad \text{Equation 114}$$

Figure 58:
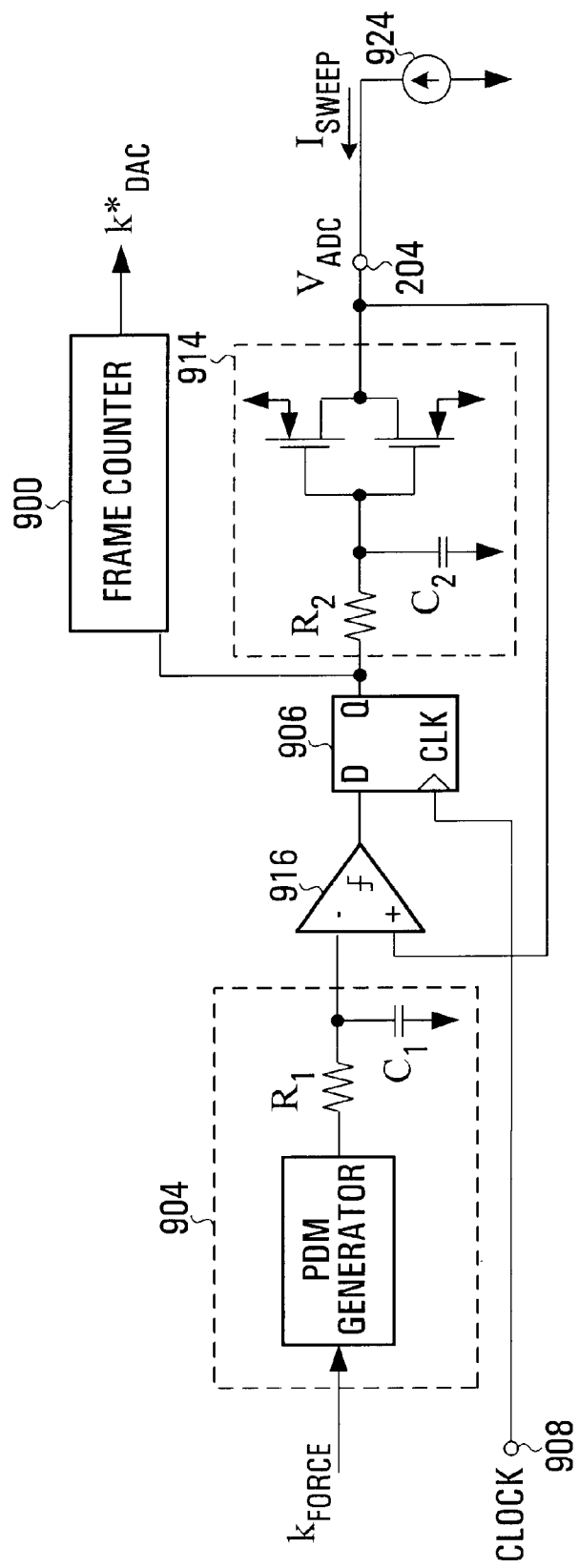

To calibrate this ammeter for a 5-bit current resolution, 32 currents, each with an increment of $\frac{1}{32}$ of the full-scale current, is applied to the output 204 in the manner shown in FIG. 58. For each current increment, the corresponding $k^*_{DAC}$ from the frame counter is recorded. The result is tabulated as that listed in Table 18. In this example, the full-scale current range is from −1 mA to 0.9375 mA. Note that Table 18 is a mapping of the function $\hat{G}^{-1}$ defined in equation 18. To find $\hat{G}$, we simply invert the second and third column of the table.

TABLE 18

A 5-bit look-up table for the ammeter

| Entry # | Equivalent $I_{sweep}$ 924 | Measured $k^*_{DAC}$ |
|---|---|---|
| 0 | −1.0000 mA | 1 |
| 1 | −0.9375 mA | 5 |
| ... | ... | ... |
| 16 | 0.0000 mA | 105 |
| 17 | 0.0625 mA | 108 |
| ... | ... | ... |
| 30 | 0.8750 mA | 249 |
| 31 | 0.9375 mA | 254 |

After the calibration, the system in FIG. 57 can then be used to set 3.75 V at an unknown external load 206, from which the appropriate load current $I_{out}$ flows. The resultant bit code $k^*_{DAC}$ is then compared to the counts found in Table 18. For example, if an unknown current is applied and a $k^*_{DAC}$ of 108 is produced, the unknown current will be found to be 0.0625 mA.

Current Generation

Figure 59:
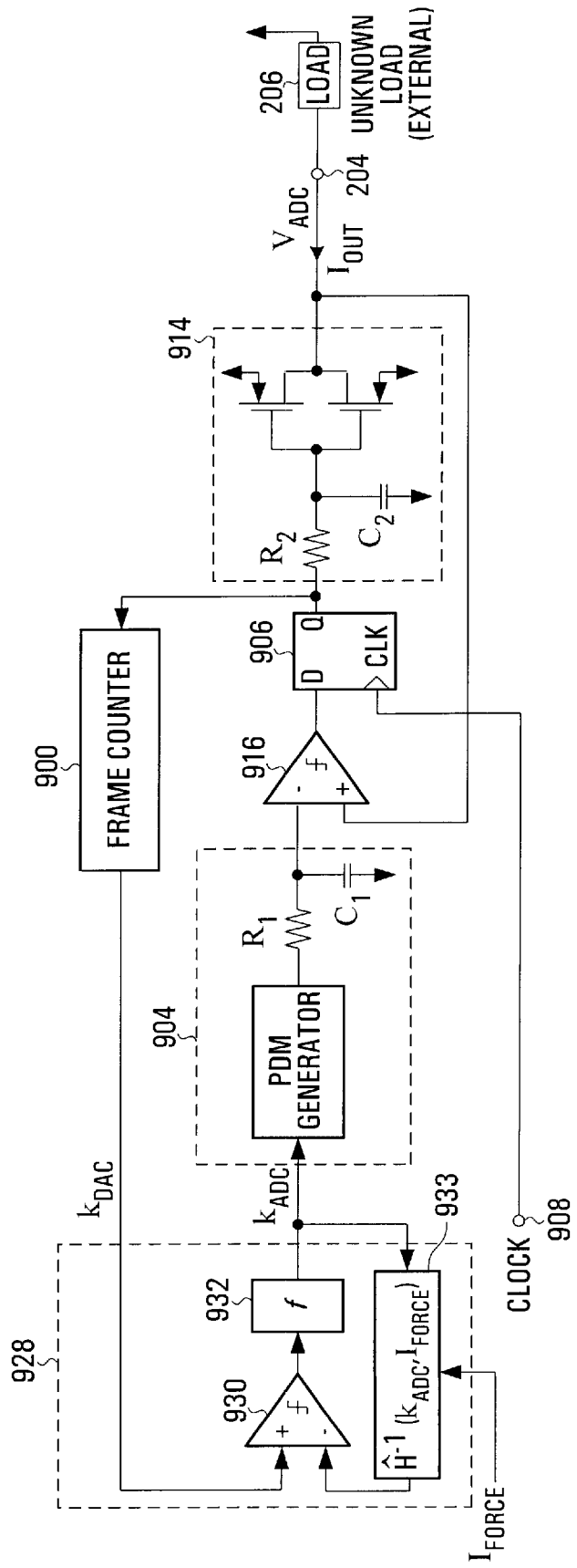

Using the $V_{ADC}$-Forcing circuit in FIG. 56, the force-current-measure-voltage system shown in FIG. 33 can be constructed. The resultant system is shown in FIG. 59. This system employs the third current-forcing algorithm described previously, where $k_{ADC}$ is controlled by a search unit 928 that observes the value of $k_{DAC}$. As shown in FIG. 59, the digital logic 928 includes a look-up table, a digital comparator 930 and an integrator 932.

Figure 60:
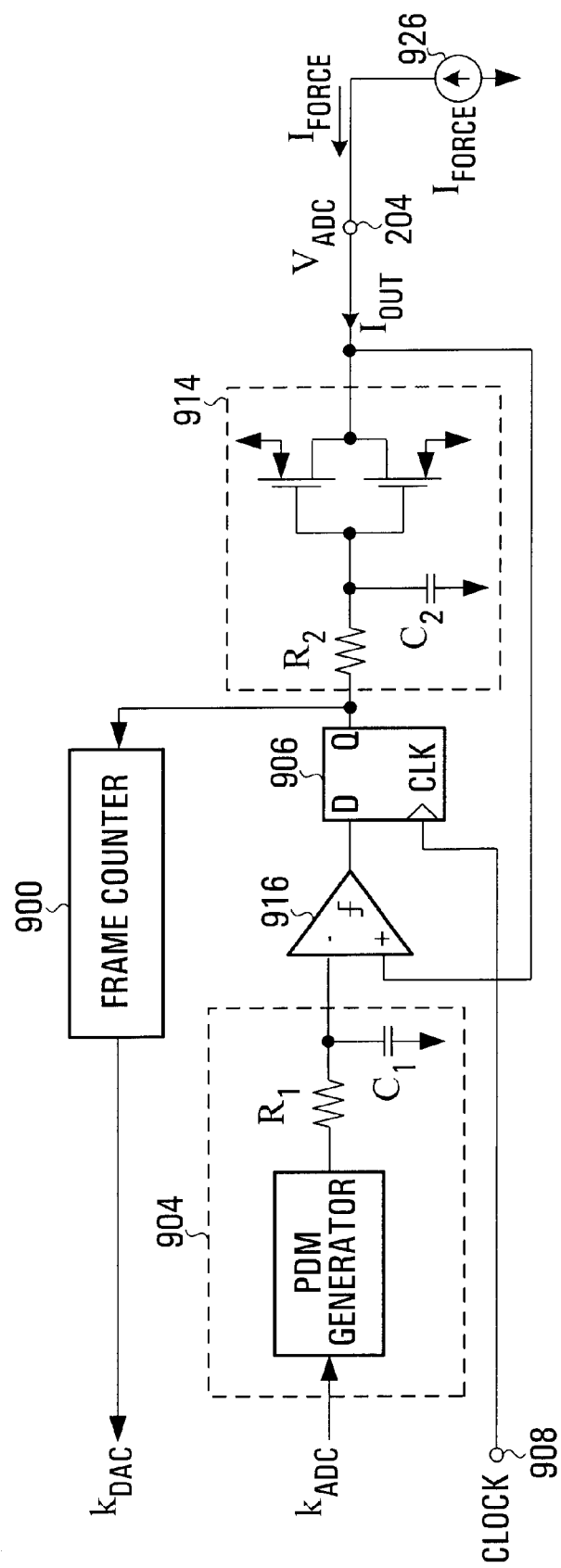

The lookup table 933 containing $\hat{H}^{-1}$ needs to be calibrated whenever a new value of $I_{force}$ applied at input 202 is required. That can be done using the set-up shown in FIG. 60. During calibration, the $I_{out}$ is set to $I_{force}$ by an external current reference 926 while $k_{ADC}$ is swept. For each $k_{ADC}$ increment, the corresponding value $k_{DAC}$ from the frame counter 900 is recorded. The resultant lookup table lists the value of $k_{DAC}$ as a function of $k_{ADC}$, i.e., the function $\hat{H}^{-1}$ defined in equation 37. An example lookup-table is shown in Table 19.

TABLE 19

An 8-bit look-up table for the current source

| $k_{ADC}$ | Actual $V_{ADC}$ | Measured $k_{DAC}$ |
|---|---|---|
| 0 | 0.00 V | 254 |
| 1 | 0.02 V | 253 |
| ... | ... | ... |
| 254 | 4.96 V | 1 |
| 255 | 4.98 V | 1 |

After calibration, an external load 206 can be applied to the output 204 of the system as shown in FIG. 59. A current of value $I_{force}$ will be forced into the external load $R_2$ 206 when the system is in equilibrium.

Example 2

System with Linear Load Element $R_1$

Figure 61:
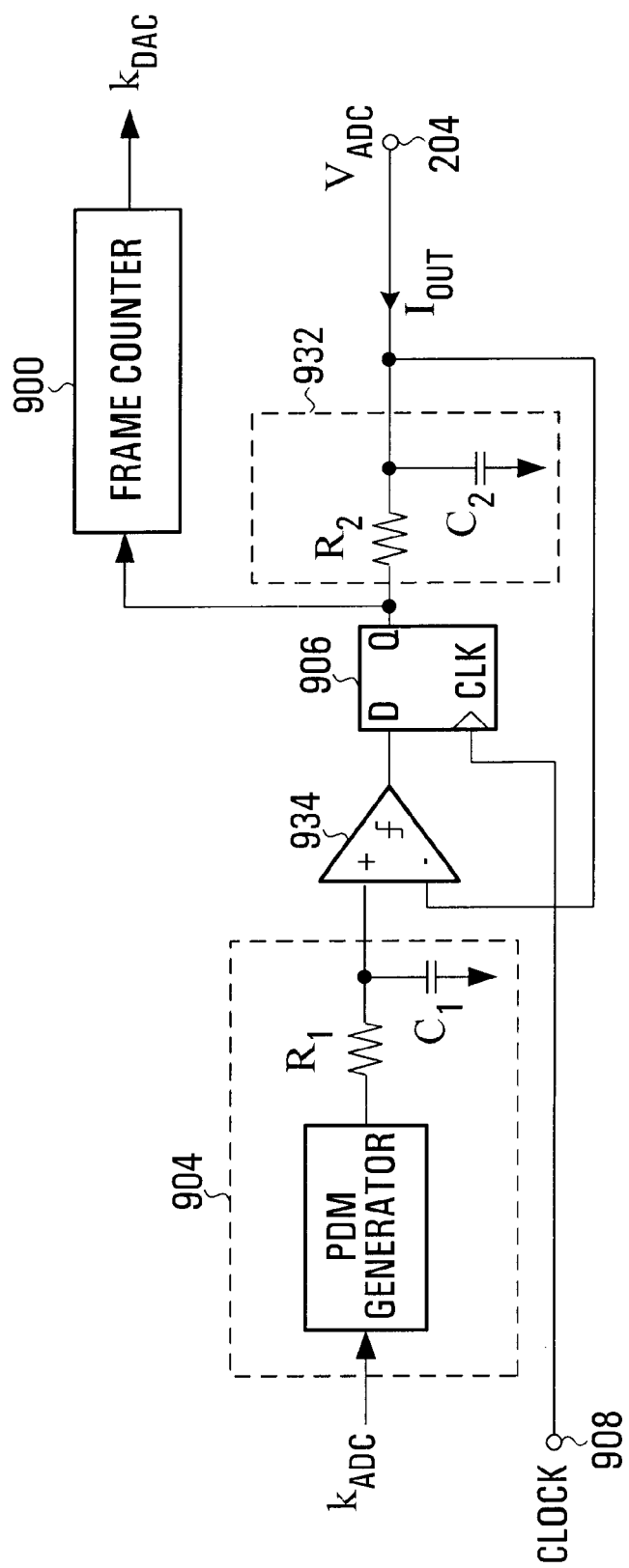

In a second alternative specific example, depicted in FIG. 61, the system is constructed using the $V_{ADC}$-Forcing circuit described in FIG. 55(a) with the DAC 904 implemented by the circuit in FIG. 50. Again, a first-order RC filter is used for the DAC 904. In the figure, both the PDM generator and the frame counter 900 have 10-bit (1024 distinct levels) resolution. The analog full-scale voltage range is from 0 V to 2.56 V.

The architectures/operations of the Force-voltage and Force-current systems derived from the $V_{ADC}$-Forcing circuit in FIG. 61 is similar to those described with regards to the first alternative specific example described above. However, because the internal load element $R_1$ is linear, calibration/measurement method described in connection with a linear resistive internal load $R_1$ 216 can be used.

As both the equivalent ADC and DAC 904 in the $V_{ADC}$-Forcing circuit shown in FIG. 61 have 10-bit resolution over a full scale of 0 V to 2.56 V, the LSB voltage ($V_{LSB}$) can be defined as follows:

$$V_{LSB} = V_{LSB-DAC} = V_{LSB-ADC} = \frac{2.56\ V}{1024} = 2.5\ mV \qquad \text{Equation 115}$$

In a non-limiting implementation, the resistance $R_2$ in the RC circuit 932 in FIG. 61 is 2.5 kohms, then from equation 110, the equivalent internal load $R_1$ 216 in the system will also equal to 2.5 kohms. This resistance value described in equation 110 into equation 56 to get:

$$I_{out} = \frac{k_{ADC} - k_{DAC}}{R_{1L}} \times V_{LSB} + \qquad \text{Equation 116}$$

$$I_{offset} = [k_{ADC} - k_{DAC}] \times 1\ \mu A + I_{offset}$$

Calibration

Figure 62:
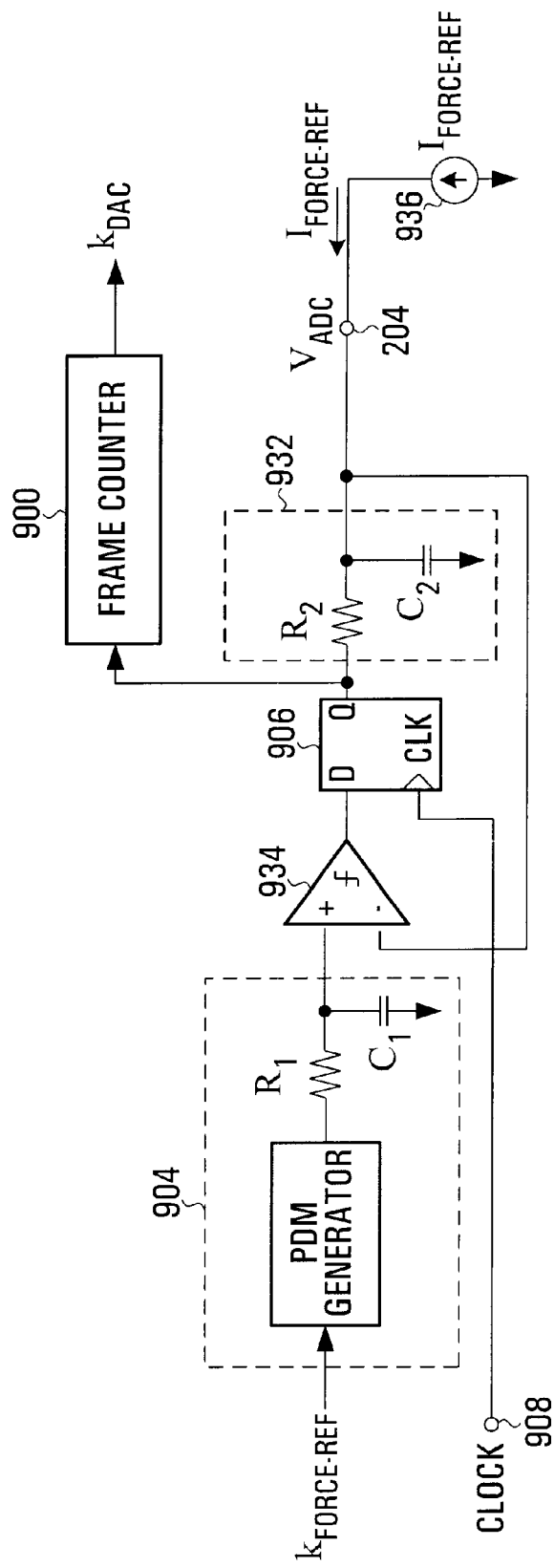

The method summarised in Table 9 can be used to calibrate the system depicted in FIG. 61. In this example, we first set $k_{ADC}$ to an arbitrary reference level ($k_{force-ref}$) at 612. For the calibration process, in a first step a current reference ($I_{force-ref}$) 936 of +200 $\mu$A is applied to the system as shown in FIG. 62 and the value of $k_{DAC}$ as $k_{DAC-cal1}$ is recorded. In a second step, the output 204 is disconnect from any external sources/loads to make current $I_{out}$ zero and the corresponding $k_{DAC}$ as $k_{DAC-cal2}$ is recorded. The resultant calibration points are summarised in Table 20. These calibration values will be used in generating the lookup tables required in the force-voltage/force-current algorithms described herein below.

TABLE 20

Calibration Points in the Example

| Calibration Point | Setting of $k_{ADC-cal}$ | Setting of $I_{ref}$ | Recorded $k_{DAC-cal}$ |
|---|---|---|---|
| 1 | $k_{ADC-cal1} = k_{force-ref} = 612$ | $I_{ref1} = I_{force-ref} = 200$ | $k_{DAC-cal1} = 405$ |
| 2 | $k_{ADC-cal2} = k_{force-ref} = 612$ | $I_{ref2} = 0$ | $k_{DAC-cal2} = 605$ |

Current Measurement

Figure 63:
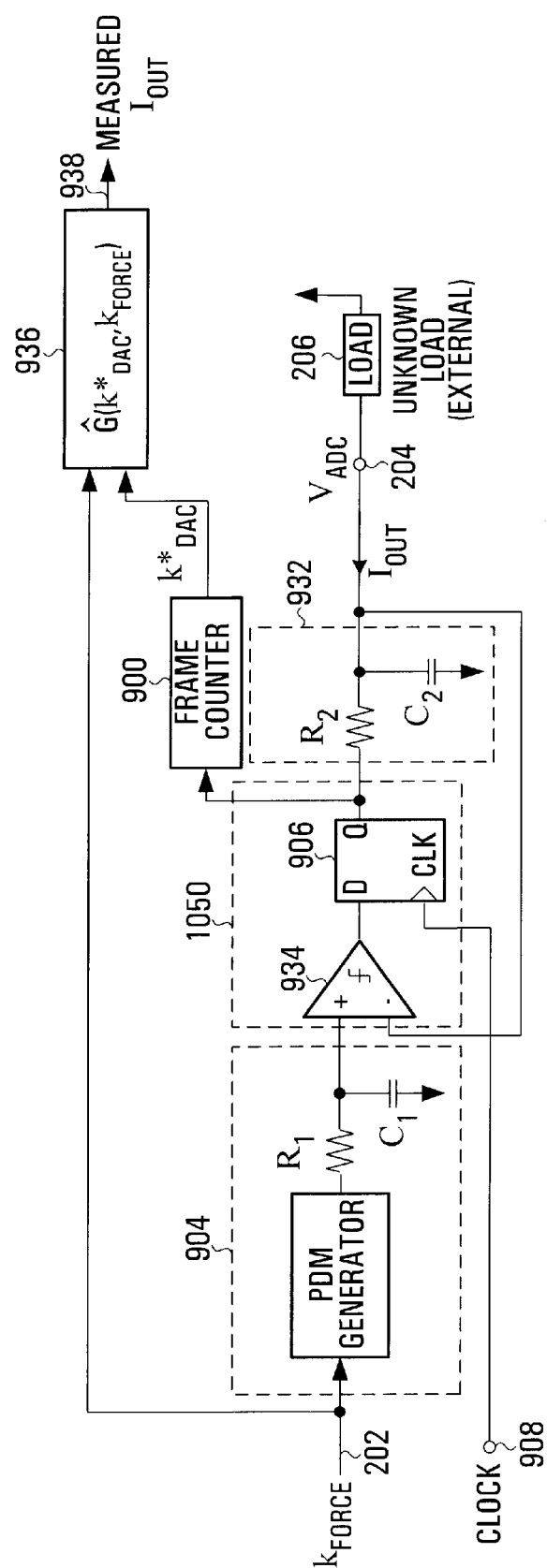
FIGS. 63–66 show an alternative configuration of a circuit device suitable for use in performing a DC parametric test on an external load in accordance with a non-limiting example of implementation of the invention.

In a non-limiting implementation, the force-voltage-measure-current system described in connection with FIG. 37 and with reference to equation 57 can be constructed using the $V_{ADC}$-Forcing circuit shown in FIG. 61. The resultant system is shown in FIG. 63. For this current-measurement system, the lookup table $\hat{G}$ 936 is a simple expression generated by calibration data. If the calibration points in Table 20 are substituted into equation 66 and the equation is simplified, the following can be obtained:

$$I_{out} = \hat{G}(k^*_{DAC}, k_{force}) = [k_{force} - k^*_{DAC} - 7] \times 1\ \mu A \qquad \text{Equation 117}$$

Knowing equation 117, the calibrated system in FIG. 63 can then be used to set an arbitrary voltage at output 204, from which a current $I_{out}$ flows. In this example, let us assume that we need to force 1.28 V at the output 204 ($V_{ADC}$). That means the corresponding value of $k_{ADC}$ will be given by equations 72 and 103 as:

$$k_{ADC} = k_{force} = \frac{V_{ADC}}{V_{LSB-DAC(Force-VADC)}} = \frac{1.28\ V}{\left(\frac{2.56\ V}{1024}\right)} = 512 \qquad \text{Equation 118}$$

The resultant bit code $k^*_{DAC}$ can then be substituted in equation 117 to find the current value for $I_{out}$ at output 204. For example, if an unknown current is applied and a $k^*_{DAC}$ of 866 is produced, the value of the unknown current $I_{out}$ will be given by:

$$I_{out} = \hat{G}(866, 512) = [512 - 866 - 7] \times 1\ \mu A = -361\ \mu A$$

$$I_{out} = \hat{G}(866, 512) = [512 - 866 - 71] \times 1\ \mu A = -361\ \mu A \qquad \text{Equation 119}$$

Current Generation

Figure 64:
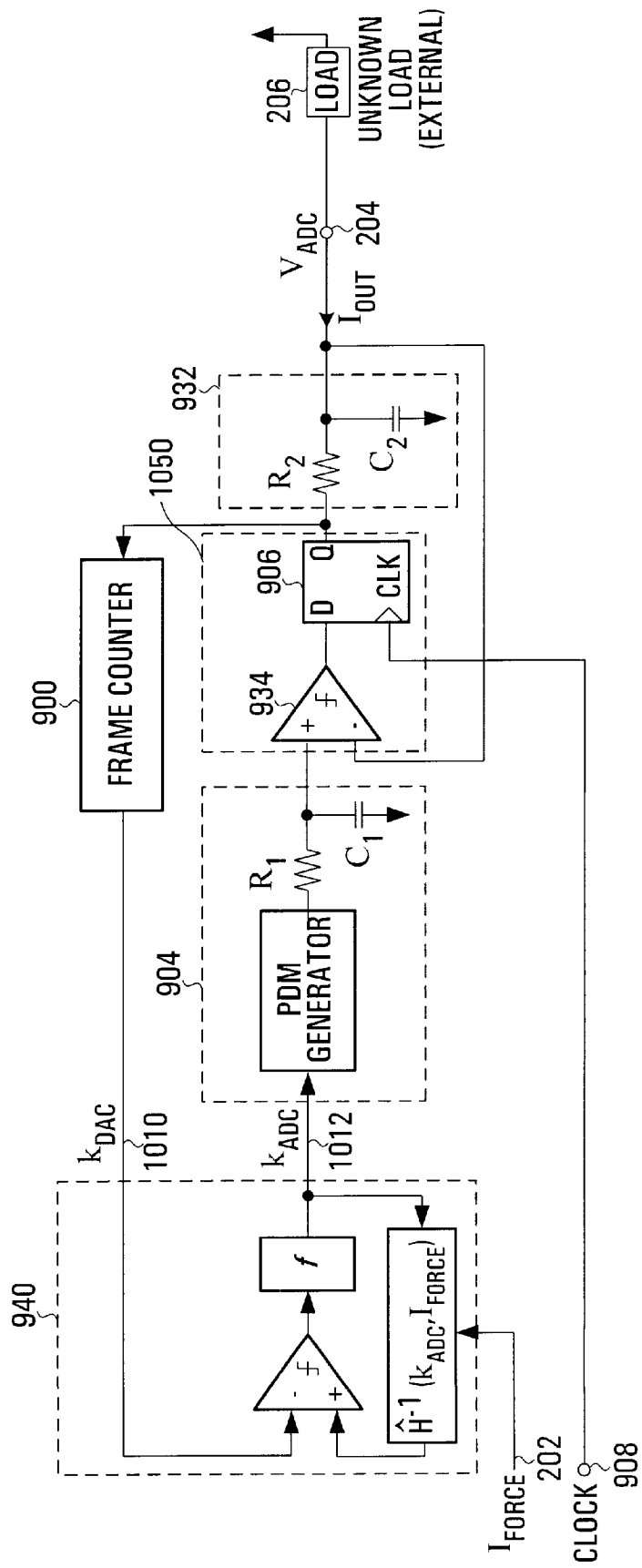

In accordance with a specific non-limiting implementation, an embodiment of the force-current-measure-voltage system shown in FIG. 23(c) can be constructed using the $V_{ADC}$-Forcing circuit in FIG. 61. The resultant system is shown in FIG. 64. For this force-current system, the lookup table $\hat{H}^{-1}$ is a simple expression generated by calibration data. If we substitute the calibration points in Table 20 into equation 69 and 68, the following is obtained:

$$L(I_{force}) = \frac{I_{force}}{1\,\mu A} + 7 \qquad \text{Equation 120}$$

$$k_{DAC} = \hat{H}^{-1}(k_{ADC}, I_{out})\Big|_{I_{out}=I_{force}} = k_{ADC} - \frac{I_{force}}{1\,\mu A} - 7 \qquad \text{Equation 121}$$

Knowing the result of equation 121, the system can then be used to set an arbitrary current at output 204 node. In this example, let us assume that a current $I_{force}$ of 50 μA must be forced at the output 204. The corresponding relationship in equation 121 can be simplified as:

$$k_{DAC} = \hat{H}^{-1}(k_{ADC}, I_{out})\Big|_{I_{out}=50\,\mu A} = k_{ADC} - 57 \qquad \text{Equation 122}$$

After defining the lookup table $\hat{H}^{-1}$ from the calibration data, an external load $R_2$ 206 can be applied to the output 204 as shown in FIG. 64. With $\hat{H}^{-1}$ defined in equation 122, a current of value $I_{force}$=50 μA will be forced into the load $R_2$ 206 when the system is in equilibrium.

Figure 65:
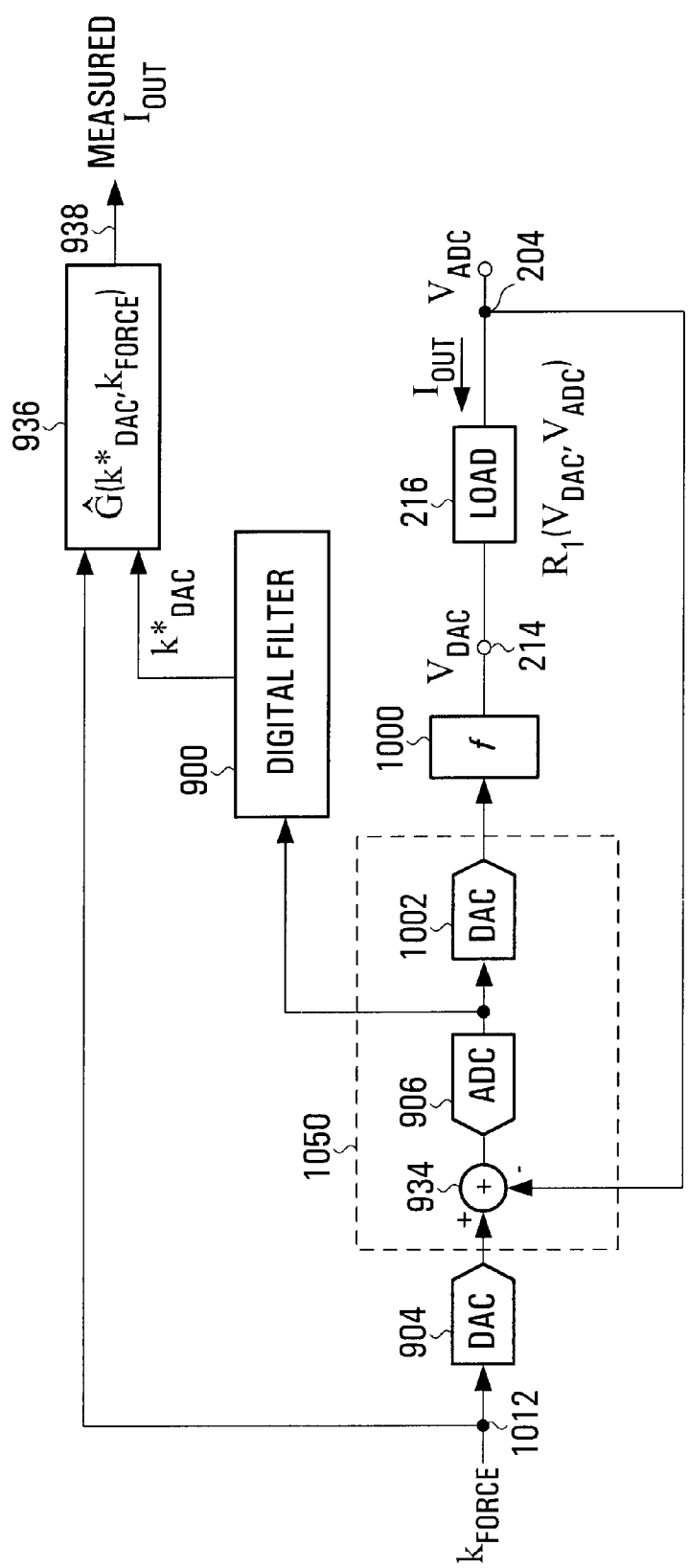
Figure 66:
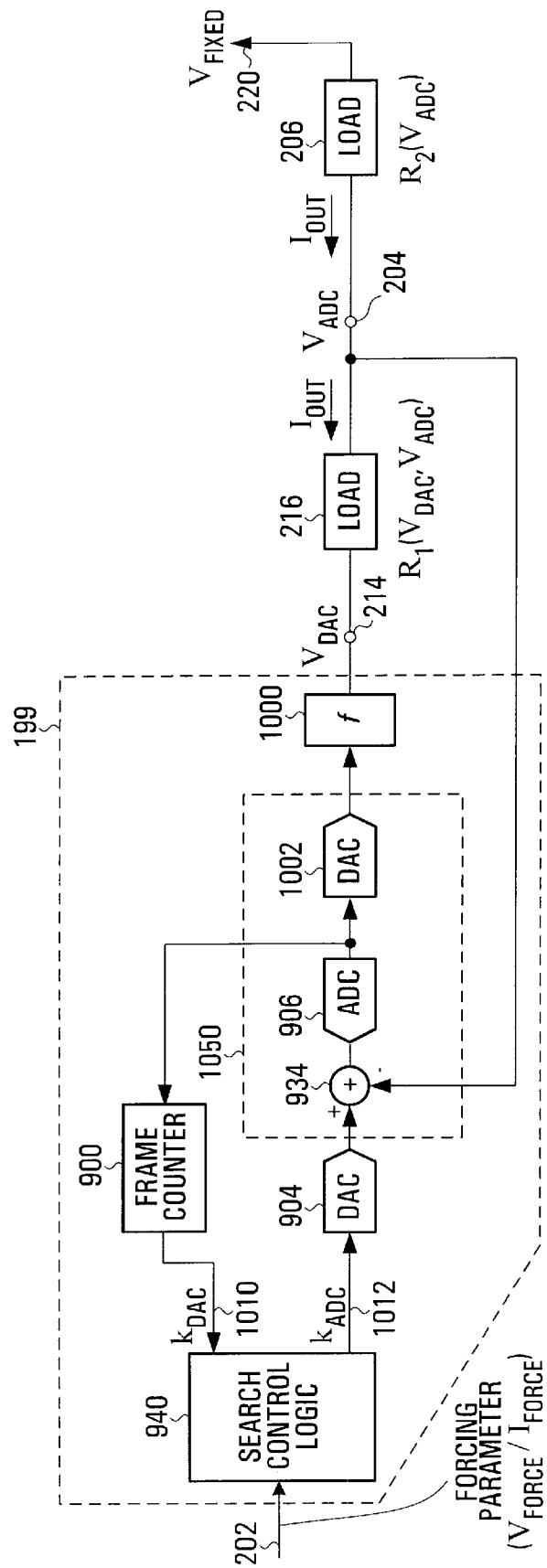

The general structure of the circuits shown in FIGS. 63 and 64 is shown in FIGS. 65 and 66 respectively. The set of circuit components labelled 1050 in FIGS. 63 to 66 implement an equivalent functionality.

As shown in FIG. 65, the system includes an input 1012 for receiving a digital forced voltage signal, an output 204 suitable for releasing to an external load a signal approximating the digital forced voltage signal, a first circuit segment and a second circuit segment. The first circuit segment is between the input 1012 and the output 204. The second circuit segment is connected in a feedback arrangement between the output 204 and the first circuit segment and provides the first circuit segment with the voltage associated with the output 204. The first circuit segment includes a first digital-to-analog converter module 904, a difference module 934, an analog-to-digital converter module 906, a second digital-to-analog converter module 1002, an analog accumulation device 1000, an intermediate voltage point 214 and in internal load 216 between the intermediate voltage point 214 and the output 204. The first digital-to-analog converter module 904 processes the digital forcing parameter signal and generates an analog value of the digital forcing parameter signal. The difference module 934 processes the analog value of the digital forcing parameter signal as well as the voltage associated with the output of the circuit device and generates a difference signal. The polarity of the difference module 934 is reversed if internal load 216 is an inverting load. The analog-to-digital converter module 906 processes the difference signal and generates a digital representation of the difference signal. The second digital-to-analog converter module 1002 processes the digital representation of the difference signal and generates an analog representation of the difference signal. The analog accumulation device 1000 generates a second voltage signal on the basis of the analog representation of the difference signal and applies the second voltage signal to the intermediate voltage point 214. The application of the second voltage signal to the intermediate voltage point 214 causes a change in either one of the voltage signal or the current signal at the output such that a voltage approximating the forced voltage signal is caused at the output 204.

In a first non-limiting implementation, the analog accumulation device 1000 includes an analog integrator module. In a second non-limiting implementation, the analog accumulation device 1000 includes a low-pass filter unit. It will be appreciated that other suitable equivalent devices instead of a low-pass filter unit may be used without detracting from the spirit of the invention.

The system shown in FIG. 65 also includes a current measurement circuit having a first input for receiving the digital representation of the difference signal generated by the analog-to-digital converter module 906, a second input for receiving a digital forced voltage signal from input 1012, a digital filter implementing accumulation functionality 900, search logic 936 and an output 938. The digital filter 900 is adapted for processing the difference signal received at the first input for generating an average voltage value. The search logic 936 receives the digital forced voltage signal and the average voltage value from the second input and the digital filter 900. The search logic 936 derives a certain current measurement on the basis of the digital forced voltage signal and the average voltage value such that, when the system is in equilibrium, the certain current measurement is indicative of an approximation of measurement of the current flowing at the output 204 of the voltage generating circuit. The certain current measurement is then released at the output 938.

Figure 67:
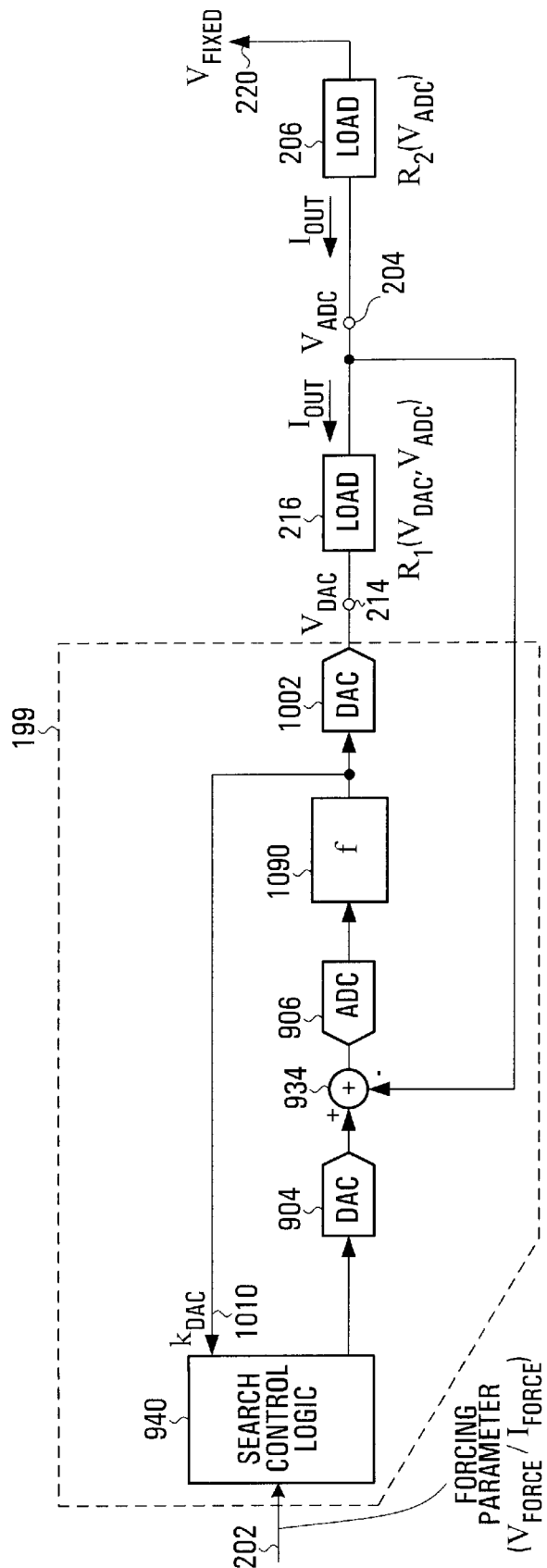
FIG. 67 shows another alternative configuration of a circuit device suitable for use in performing a DC parametric test on an external load in accordance with another non-limiting example of implementation of the invention.

FIG. 67 shows an alternative general structure of the circuit shown in FIG. 66. In this alternate configuration, the digital filter 900 of FIG. 66 present in the feedback path has been replaced by digital filter 1090 located between ADC 906 and DAC 1002. Digital filter 1090 may implement any suitable accumulation functional element such as for example a digital integrator. The output of digital filer 1090 is provided to the search control logic 940. It will be appreciated that binary searches can also be performed by replacing the digital filter 1090 with a successive-approximation circuit (SAR) module without detracting from the spirit of the invention. The corresponding alternate structures associated with the circuit shown in FIG. 65 will be readily apparent to the person skilled in art upon a reading of this specification and as such will not be described further here.

Other specific examples of implementation of this invention are presented in C. K. L. Tam, G. W. Roberts, "A Robust DC Current Generation and Measurement Technique for Deep Submicron Circuits", Proc. IEEE International Symposium on Circuits and Systems, Vol. 1, pp. 719–722, May 6, 2001. The contents of this document are hereby incorporated by reference.

Specific Physical Implementation

Those skilled in the art should appreciate that in some embodiments of the invention, all or part of the functionality previously described herein with respect to the circuit device and system may be implemented as pre-programmed hardware or firmware elements (e.g., application specific integrated circuits (ASICs), FPGA chips, ROM, PROM, EPROM, etc.), or other related components.

For example, the above described circuits may be incorporated in IC generally, diagnostic tools, IC testing equipment, on-chip testing and IC including on-chip testing functionality amongst others.

Specific non-limiting examples of use of the above-described system include:
- the measurement of leakage currents in bonding pads of ICs;
- continuity tests for bonding wires;
- parametric testing of logic output pins;
- parametric testing of output drivers (analog/digital);
- IDDQ testing of an IC or modules on an IC;
- parametric testing of resistors/diodes/transistors;
- parametric testing of voltage/current sources, bias networks or other analog components.

Although the present invention has been described in considerable detail with reference to certain preferred embodiments thereof, variations and refinements are possible without departing from the spirit of the invention. Therefore, the scope of the invention should be limited only by the appended claims and their equivalents.

What is claimed is:

1. A circuit device suitable for use in performing a DC parametric test on an external load, said circuit device comprising:
   a. an input suitable for receiving a forcing parameter signal;
   b. an output suitable for releasing to the external load a signal approximating the forcing parameter signal;
   c. a first circuit segment between said input and said output comprising:
      i. a search entity; and
      ii. an intermediate voltage point;
      iii. an internal load between said intermediate voltage point and said output;
   d. a second circuit segment connected in a feedback arrangement with said first circuit segment, said second circuit segment providing the search entity in the first circuit segment with a first voltage signal indicative of the voltage at the output;
   e. said search entity being adapted for:
      i. generating a second voltage signal on the basis of said forcing parameter signal and the first voltage signal received from said second segment;
      ii. applying said second voltage signal to said intermediate voltage point thereby causing a change in either one of the voltage signal or the current signal at said output such that a signal approximating the forcing parameter signal is caused at said output.

2. A circuit device as defined in claim 1, wherein said search entity includes:
   a. an analog-to-digital converter module for processing the voltage at the output to generate a digital approximation of the voltage signal at the output;
   b. a search unit for generating a digital target voltage on the basis the digital approximation of the voltage signal at the output and the forcing parameter signal;
   c. a digital-to-analog converter module between said search unit and said intermediate voltage point, said digital-to-analog converter module being adapted for:
      i. processing the digital target voltage to generate the second voltage signal;
      ii. applying said second voltage signal to said intermediate voltage point thereby causing a change in either one of the voltage signal or the current signal at said output such that a signal approximating the forcing parameter signal is caused at said output.

3. An IC circuit including a circuit device of the type described in claim 1.

4. An IC circuit including a plurality of circuit devices of the type described in claim 1.

5. A circuit for performing a DC parameter test on an external load, the circuit comprising:
   a. a circuit input for receiving a forcing parameter signal;
   b. a circuit output for connection to the external load;
   c. a search unit having a first input connected to the circuit input and having a second input and an output;
   d. a circuit module having digital-to-analog conversion functionality and load functionality connected between the output of the search unit and the circuit output; and
   e. an analog-to-digital converter (ADC) connected between the circuit output and the second input of the search unit, wherein the search unit is adapted to generate a digital target voltage at its output on the basis of a voltage at the circuit output and the forcing parameter signal whereby a signal approximating the forcing parameter signal is derived at the circuit output.

6. A circuit as defined in claim 5, wherein the circuit module having digital-to-analog conversion functionality and load functionality includes:
   a. a low-pass filter module one side of which is connected to the circuit output;
   b. a pulse generator module connected between the output of the search unit and another side of the low-pass filter module.

7. A circuit as defined in claim 5, wherein the circuit module having digital-to-analog conversion functionality and load functionality includes:
   a. an internal load one side of which is connected to the circuit output;
   b. a digital-to-analog converter (DAC) connected between the output of the search unit and another side of the internal load.

8. A circuit device as defined in claim 7, wherein said internal load is a linear non-inverting load.

9. A circuit device as defined in claim 8, wherein said internal load includes at least one linear resistor element.

10. A circuit device as defined in claim 9, wherein said internal load includes at least one RC circuit element.

11. A circuit device as defined in claim 7, wherein said internal load is a non-linear and inverting load.

12. A circuit device as defined in claim 11, wherein said internal load includes at least one MOS circuit.

13. A circuit device as defined in claim 12, wherein the MOS circuit includes at least one element selected from the set consisting of a CMOS inverter, a PMOS circuit and NMOS circuit.

14. A circuit device as defined in claim 7, wherein said forcing parameter signal is indicative of a forced voltage.

15. A circuit device as defined in claim 14, wherein said search unit includes:
   a. a digital comparator for generating a digital difference voltage signal dependent on the difference between the signal indicative of a forced voltage and the digital approximation of the voltage signal at the output of the circuit device;
   b. a digital integrator module adapted for processing the digital difference voltage signal to derive the digital target voltage;
   c. an output for releasing the digital target voltage for processing by the digital-to-analog converter (DAC).

16. A circuit device as defined in claim 14, wherein said search unit includes:
   a. an analogue-to-digital converter module suitable for processing the signal indicative of a forced voltage to generate a corresponding digital forced voltage signal;
   b. a digital comparator for generating a digital difference voltage signal dependent on the difference between the digital forced voltage signal and the digital approximation of the voltage signal at the output of the circuit device;
   c. a digital integrator module adapted for processing the digital difference voltage signal to derive the digital target voltage;
   d. an output for releasing the digital target voltage for processing by the digital-to-analog converter.

17. A circuit device as defined in claim 5, wherein said forcing parameter signal is indicative of a forced current.

18. A circuit device as defined in claim 5, wherein said forcing parameter signal is in a digital format.

19. A circuit device as defined in claim 5, wherein said analog-to-digital converter comprises:
   a. an analog comparator for:
      i. receiving a signal indicative of the voltage at the output and a tracking voltage;
      ii. generating a difference signal on the basis of the signal received in i.;
   b. a digital integrator for receiving the difference signal and generating successive digital approximations of the voltage signal at the output of the circuit device;
   c. a feedback circuit for processing the successive digital approximations of the voltage signal to generate the tracking voltage and provide the tracking voltage to said analog comparator.

20. A circuit device as defined in claim 19, wherein said feedback circuit including a digital-to-analog converter.

21. A circuit device as defined in claim 5, wherein said analog-to-digital converter (ADC) comprises:
   a. an analog comparator for:
      i. receiving a signal indicative of the voltage at the output and a tracking voltage;
      ii. generating a difference signal on the basis of the signal received in i.;
   b. a successive-approximation circuit (SAR) module for receiving the difference signal and generating successive digital approximations of the voltage signal at the output of the circuit device;
   c. a feedback circuit for processing the successive digital approximations of the voltage signal to generate the tracking voltage and provide the tracking voltage to said analog comparator.

22. An IC circuit including a circuit device of the type described in claim 5.

23. An IC circuit including a plurality of circuit devices of the type described in claim 5.

24. A system for providing a current measurement suitable for use in performing a DC parametric test on an external load, said system comprising:
   a. a voltage generating circuit device comprising:
      i. an input suitable for receiving a signal indicative of a forced voltage;
      ii. an output suitable for releasing to the external load a signal approximating the forced voltage;
      iii. a first circuit segment between said input and said output comprising:
         1. a search unit; and
         2. an intermediate voltage point;
         3. an internal load between said intermediate voltage point and said output;
      iv. a second circuit segment connected in a feedback arrangement with said first circuit segment, said second circuit segment providing the search unit in the first circuit segment with a first voltage signal indicative of the voltage at the output;
      v. said search unit being adapted for:
         1. generating a second voltage signal on the basis of said signal indicative of a forced voltage and the first voltage signal received from said second segment;
         2. applying said second voltage signal to said intermediate voltage point thereby causing a change in either one of the voltage signal or the current signal at said output such that a voltage approximating the forced voltage is caused at said output;
   b. a current measurement circuit including:
      i. a first input for receiving a first signal derived from the second voltage signal;
      ii. a second input for receiving a second signal derived from the signal indicative of the forced voltage;
      iii. search logic coupled to said first and second inputs, said search logic being adapted for deriving a certain current measurement on the basis of first signal and said second signal signal;
      iv. an output for releasing the certain current measurement, when the system is in equilibrium, said certain current measurement being indicative of an approximation of measurement of the current flowing at the output of the voltage generating circuit when the signal indicative of the forced voltage is applied to the output of the voltage generating circuit.

25. A system as defined in claim 24, wherein the first signal derived from the second voltage signal includes a digital representation of the second voltage signal.

26. A system as defined in claim 25, wherein the second signal derived from the signal indicative of the forced voltage includes a digital approximation of the signal indicative of the forced voltage.

27. An IC circuit including a system of the type described in claim 24.

28. An IC circuit including a plurality of systems of the type described in claim 24.

29. A system for providing a current measurement for use in performing a DC parametric test on an external load, said system comprising:
   a. a voltage generating circuit device comprising:
      i. a circuit input for receiving a signal indicative of a forced voltage;
      ii. a circuit output for connection to the external load;
      iii. a search unit having a first input connected to the circuit input and having a second input and an output;
      iv. a circuit module having digital-to-analog conversion functionality and load functionality connected between the output of the search unit and the circuit output; and
      v. an analog-to-digital converter (ADC) connected between the circuit output and the second input of the search unit,
      wherein the search unit is adapted to generate a digital target voltage at its output on the basis of a voltage at the circuit output and the signal indicative of the forced voltage whereby a signal approximating the forced voltage is applied at the circuit output;
   b. a current measurement circuit including:
      i. a first input for receiving a first signal derived from the digital target voltage;
      ii. a second input for receiving a second signal derived from the signal indicative of the forced voltage;
      iii. search logic coupled to said first and second inputs, said search logic being adapted for deriving a certain current measurement on the basis of said first signal and said second signal such that when the system is in equilibrium, said certain current measurement is indicative of an approximation of measurement of the current flowing at the output of the voltage generating circuit when the signal approximating the forced voltage is applied to the output of the voltage generating circuit;
      iv. an output for releasing the certain current measurement.

30. A system as defined in claim 29, wherein the second signal derived from the signal indicative of the forced voltage includes a digital approximation of the forced voltage signal.

31. A system as defined in claim 29, wherein the circuit module having digital-to-analog conversion functionality and load functionality includes:
   a. a low-pass filter module one side of which is connected to the circuit output;
   b. a pulse generator module connected between the output of the search unit and another side of the low-pass filter module.

32. A system as defined in claim 29, wherein the circuit module having digital-to-analog conversion functionality and load functionality includes:
   a. an internal load one side of which is connected to the circuit output;
   b. a digital-to-analog converter (DAC) connected between the output of the search unit and another side of the internal load.

33. A system as defined in claim 29, wherein the search logic of said current measurement circuit includes a data structure having a plurality of entries, each entry providing a mapping between a data element conveying a given target voltage and a data element conveying the forced voltage to a corresponding current measurement.

34. A system as defined in claim 33, wherein the data element conveying the target voltage includes a digital approximation of the target voltage signal.

35. A system as defined in claim 33, wherein said data structure is stored on a unit including a device selected from the set consisting of a RAM, ROM, PROM, EPROM and EEPROM.

36. A system as defined in claim 35, wherein the device includes RAM.

37. An IC circuit including a system of the type described in claim 29.

38. An IC circuit including a plurality of systems of the type described in claim 29.

39. A circuit device suitable for use in performing a DC parametric test on an external load, said circuit device comprising:
   a. a circuit input for receiving a signal indicative of a forced current;
   b. a circuit output for connection to the external load;
   c. a search unit having a first input connected to the circuit input and having a second input and an output;
   d. a circuit module having digital-to-analog conversion functionality and load functionality connected between the output of the search unit and the circuit output; and
   e. an analog-to-digital converter (ADC) connected between the circuit output and the second input of the search unit;
wherein the search unit is adapted to generate a target voltage value at its output on the basis of a voltage at the circuit output and the signal indicative of a forced current whereby a signal approximating the signal indicative of a forced current is derived at the circuit output.

40. A circuit device as defined in claim 39, wherein the circuit module having digital-to-analog conversion functionality and load functionality includes:
   a. a low-pass filter module one side of which is connected to the circuit output;
   b. a pulse generator module connected between the output of the search unit and another side of the low-pass filter module.

41. A circuit device as defined in claim 39, wherein the circuit module having digital-to-analog conversion functionality and load functionality includes:
   a. an internal load one side of which is connected to the circuit output;
   b. a digital-to-analog converter (DAC) connected between the output of the search unit and another side of the internal load.

42. A circuit device as defined in claim 39, wherein said search unit includes a data structure having a plurality of entries, each entry providing a mapping between:
   a. a data element conveying the voltage signal at the output of the circuit device and a data element conveying a given forced current; and
   b. a data element conveying a target voltage.

43. A system as defined in claim 42, wherein:
   a. the data element conveying the voltage signal at the output includes a digital approximation of the voltage signal at the output;
   b. the data element conveying the target voltage includes a digital representation of the target voltage.

44. A circuit device as defined in claim 42, wherein said data structure is stored on a unit including a device selected from the set consisting of a RAM, ROM, PROM, EPROM and EEPROM.

45. A circuit device as defined in claim 44, wherein the device includes RAM.

46. A circuit device as defined in claim 39, wherein said search unit provides a mapping between:
   a. data elements conveying target voltages and a data element conveying a given forced current signal; and
   b. data elements conveying voltage signals at the output of the circuit device.

47. A system as defined in claim 46, wherein:
   a. the data elements conveying target voltages include digital approximations of target voltages;
   b. data elements conveying voltage signals at the output of the circuit device include digital approximations of the voltage signals at the output.

48. A circuit device as defined in claim 46, wherein said data structure is stored on a unit including a device selected from the set consisting of a RAM, ROM, PROM, EPROM and EEPROM.

49. A circuit device as defined in claim 48, wherein the device includes RAM.

50. An IC circuit including a circuit device of the type described in claim 39.

51. An IC circuit including a plurality of circuit devices of the type described in claim 39.

* * * * *